United States Patent
Lee et al.

(10) Patent No.: US 7,482,231 B2
(45) Date of Patent: Jan. 27, 2009

(54) MANUFACTURING OF MEMORY ARRAY AND PERIPHERY

(75) Inventors: Tzyh-Cheang Lee, Hsinchu (TW); Fu-Liang Yang, Hsin-Chu (TW); Jiunn-Ren Hwang, Hsin-Chu (TW); Tsung-Lin Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 149 days.

(21) Appl. No.: 11/529,067

(22) Filed: Sep. 28, 2006

(65) Prior Publication Data

US 2007/0161174 A1   Jul. 12, 2007

Related U.S. Application Data

(63) Continuation-in-part of application No. 11/327,185, filed on Jan. 6, 2006, now Pat. No. 7,405,119.

(60) Provisional application No. 60/756,875, filed on Jan. 6, 2006.

(51) Int. Cl.
   *H01L 21/8239* (2006.01)

(52) U.S. Cl. ........................ 438/275; 438/303; 438/595; 257/E21.626

(58) Field of Classification Search ................. 438/954
   See application file for complete search history.

(56) References Cited

U.S. PATENT DOCUMENTS

| 6,756,271 | B1 * | 6/2004 | Satoh et al. ................. 438/258 |
| 6,858,497 | B2 * | 2/2005 | Moriya et al. ............... 438/262 |
| 6,862,251 | B2 | 3/2005 | Yaoi et al. |
| 7,102,192 | B2 * | 9/2006 | Ono ........................... 257/316 |
| 7,154,142 | B2 * | 12/2006 | Wong et al. ................. 257/316 |
| 2003/0011017 | A1 * | 1/2003 | Lee et al. .................... 257/314 |
| 2004/0005761 | A1 * | 1/2004 | Shibata ....................... 438/261 |
| 2007/0063267 | A1 * | 3/2007 | Jeon et al. ................... 257/324 |

* cited by examiner

*Primary Examiner*—Stephen W Smoot
(74) *Attorney, Agent, or Firm*—Slater & Matsil, L.L.P.

(57) ABSTRACT

Method of manufacturing a semiconductor chip. An array region gate stack is formed on an array region of a substrate and a periphery region gate stack is formed on a periphery region of a substrate. A first dielectric material, a charge-storing material, and a second dielectric material are deposited over the substrate. Portions of the first dielectric material, the charge-storing material, and the second dielectric material are removed to form storage structures on the array region gate stack and on the periphery region gate stack. The storage structures have a generally L-shaped cross-section. A first source/drain region is formed in the array region well. A third dielectric material and a spacer material are deposited over the substrate. Portions of the third dielectric material and the spacer material are removed to form spacers. A second source/drain region is formed in the periphery region well.

20 Claims, 62 Drawing Sheets

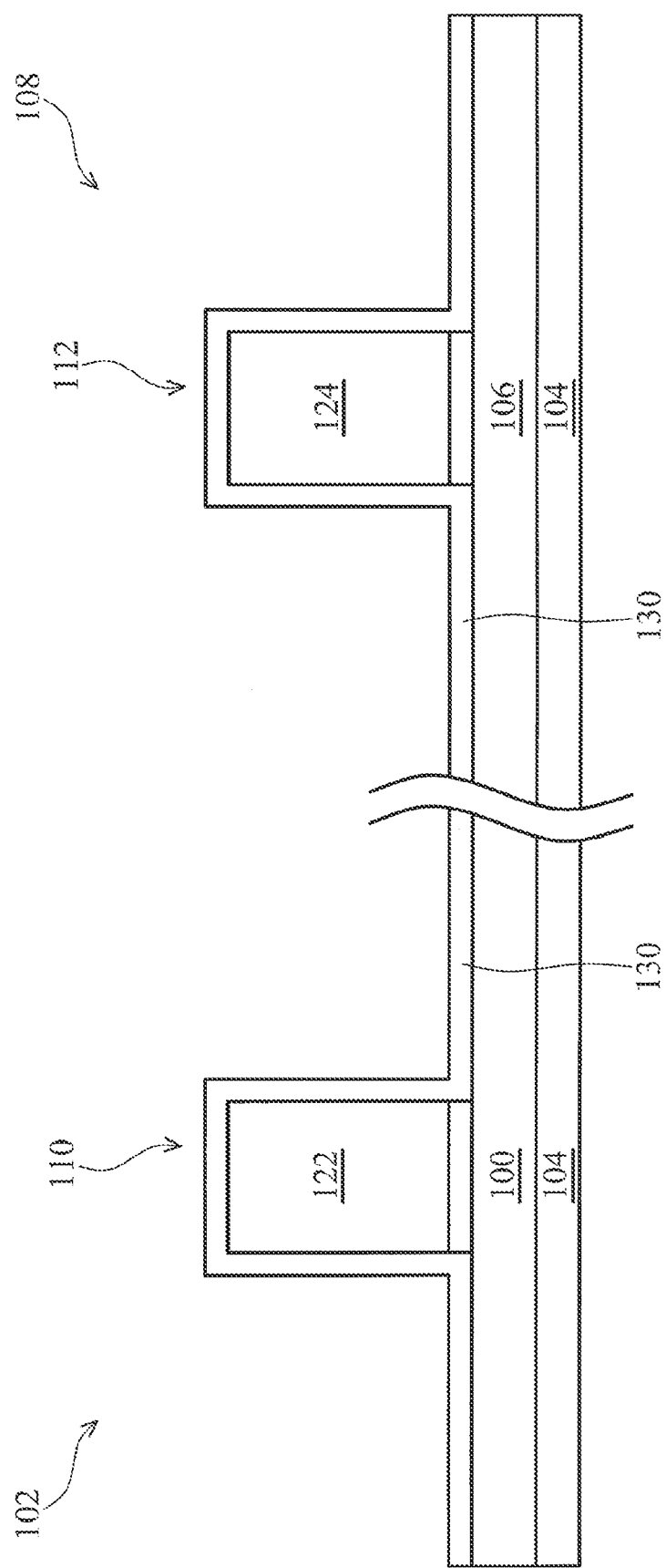

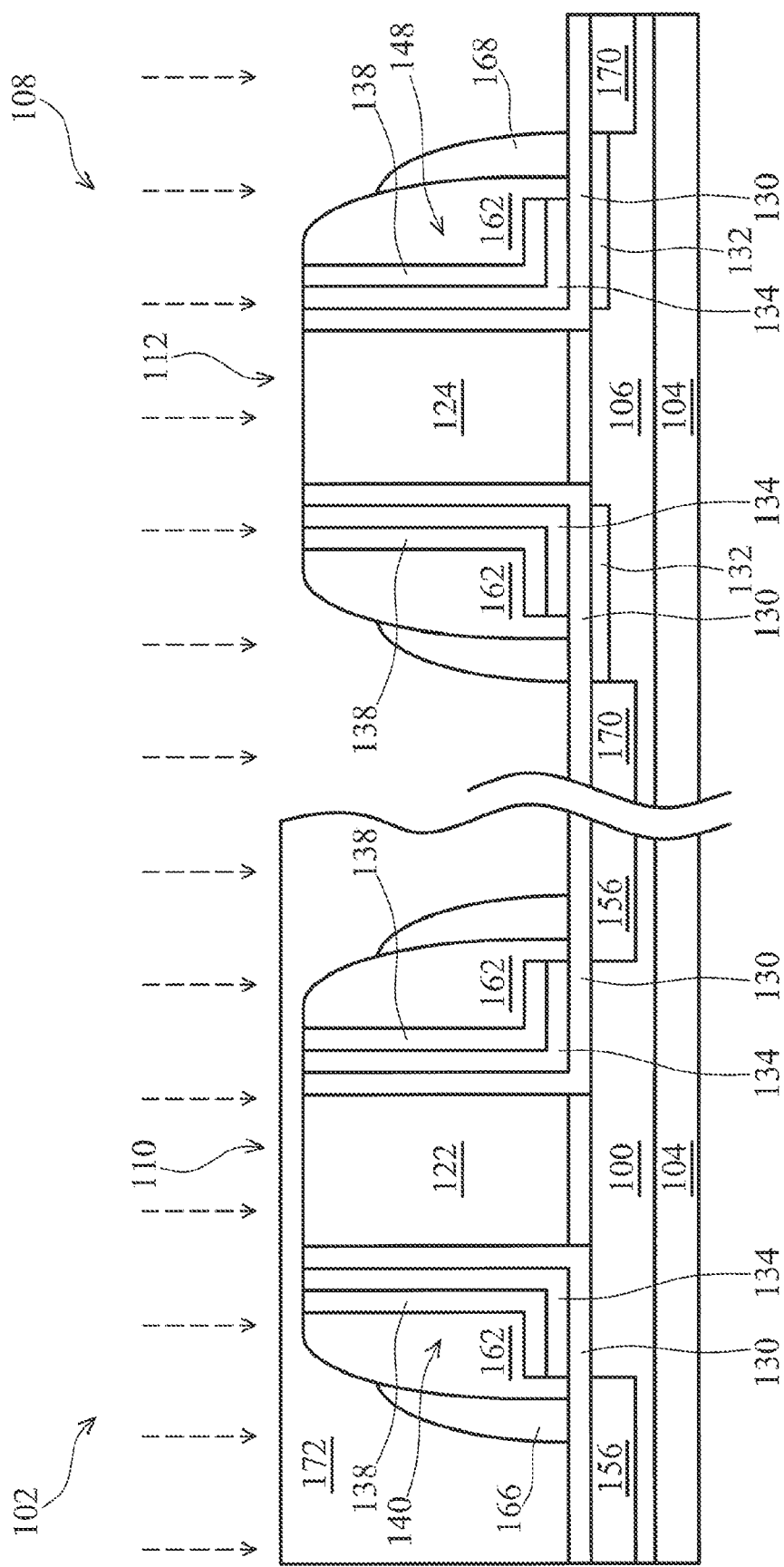

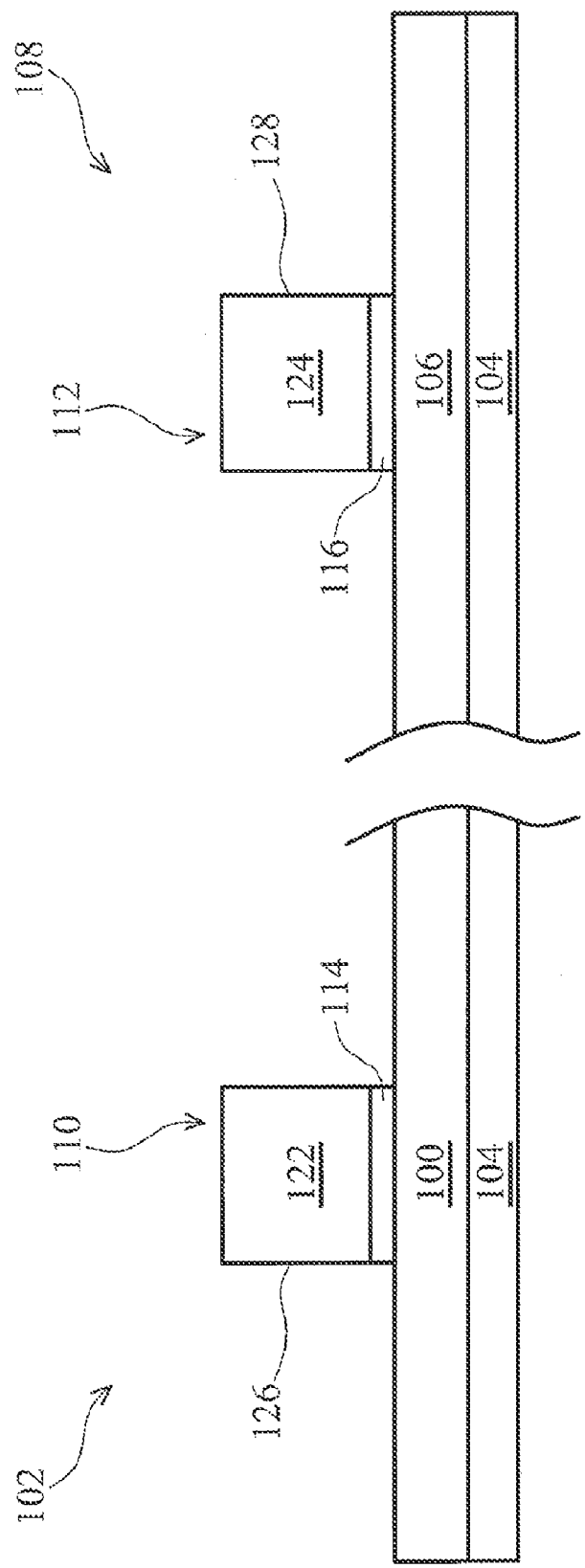

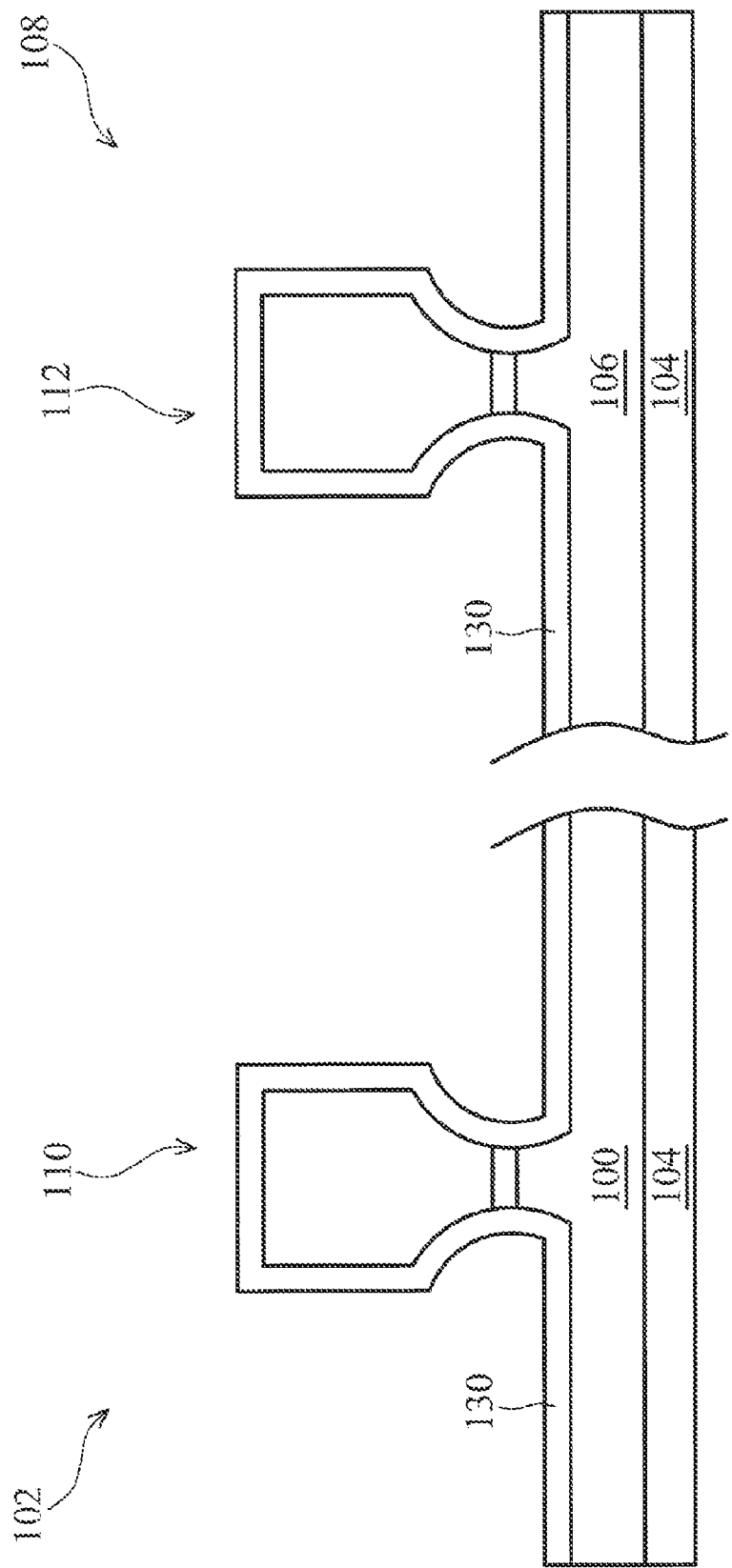

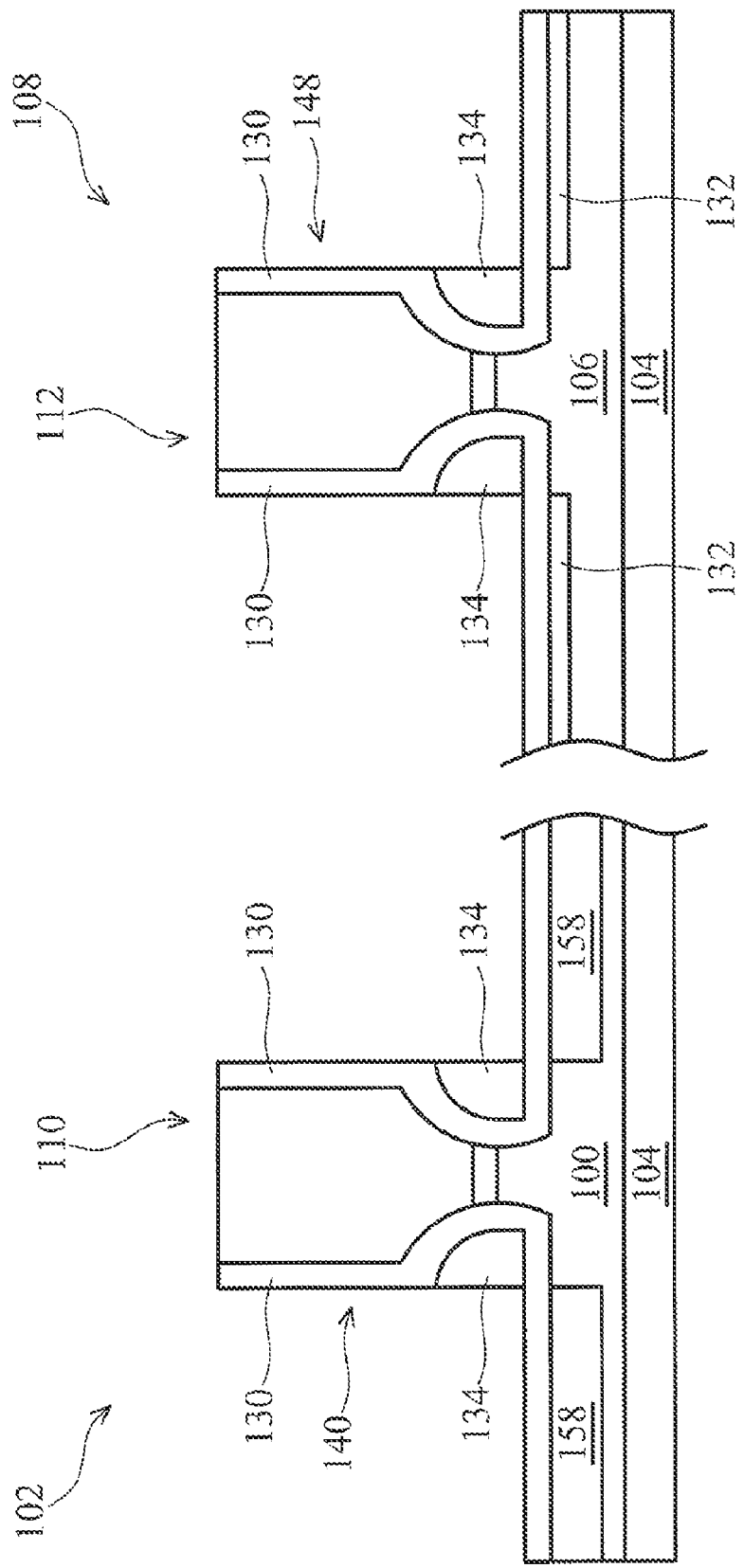

MANUFACTURING OF MEMORY ARRAY AND PERIPHERY

This application claims the benefit of U.S. Provisional Application Ser. No. 60/756,875, filed on Jan. 6, 2006, entitled Sidewall SONOS with Protected Storage Film, which application is hereby incorporated herein by reference.

This application is a continuation-in-part of U.S. patent application Ser. No. 11/327,185, filed on Jan. 6, 2006, now U.S. Pat. No. 7,405,119 entitled Structure and Method for a Sidewall SONOS Memory Device, which application is hereby incorporated herein by reference.

CROSS-REFERENCE TO RELATED APPLICATIONS

This application relates to the following and commonly assigned U.S. patent application Ser. No. 11/602,809 (TSM05-0485D), filed Nov. 21, 2006, entitled Structure and Method for a Sidewall SONOS Memory Device, which application is hereby incorporated herein by reference.

TECHNICAL FIELD

The present invention generally relates to memory devices. In one aspect it relates more particularly to a system and method for a sidewall SONOS memory device.

BACKGROUND

Non-volatile memory has been integrated into a wide range of electronic technologies, including cellular communication, digital video, digital audio, and compact data storage (i.e., flash memory cards, flash memory sticks, and USB flash drives). Silicon-oxide-nitride-oxide-silicon (SONOS) memory is a non-volatile semiconductor memory, at the heart of which is a transistor that can retain a value without a constant power supply.

A sidewall SONOS memory device includes a two dimensional array surrounded by a periphery region. The periphery region may include sidewall SONOS transistors in addition to other complementary metal oxide semiconductor (CMOS) logic and analog circuitry. Existing methods of manufacturing memory array sidewall SONOS transistors and peripheral sidewall SONOS transistors on the same die are complex, time consuming, and costly.

For example, a sequential method of manufacturing a sidewall SONOS memory device may include two sequential sets of steps. A first set of steps forms the sidewall SONOS transistors in the memory array and a second set of steps forms the circuitry in a periphery area on the same die. However, many of the steps in the first and second sets of steps may be the same or similar, and the inherent redundancy in the sequential manufacturing method results in lower production rates and lower revenue. Hence, there is a need for an integrated method of manufacturing sidewall SONOS and its periphery in a simple and logic-compatible process flow.

SUMMARY OF THE INVENTION

The problems and needs outlined above may be addressed by embodiments of the present invention. In accordance with one aspect of the present invention, a method of manufacturing a semiconductor device is provided. A first gate stack is formed on an array region of a substrate. The first gate stack has a first sidewall. A second gate stack is formed on a periphery region of the substrate. The second gate stack has a second sidewall. A first dielectric material is formed over the substrate to cover the first gate stack and the second gate stack. A lightly doped drain region is formed in the substrate of the periphery region. A charge-storing material is formed over the first dielectric material. A second dielectric material is formed over the charge-storing material. Portions of the first dielectric material, the charge-storing material, and the second dielectric material, the first gate stack has a first sidewall, such that a first storage structure is formed adjacent to the first sidewall of the first gate stack, and a second storage structure is formed adjacent to the second sidewall of the second gate stack. A first source/drain region is formed in the substrate of the array region. A third dielectric material is deposited over the substrate.

In accordance with another aspect of the present invention, a method of manufacturing a semiconductor chip is provided. A substrate having an array region and a peripheral region is provided. A first gate stack is formed on the array region. The first gate stack has a first sidewall. A second gate stack is formed on the periphery region. The second gate stack has a second sidewall. A first sidewall recess is formed in a lower portion of the first sidewall. A second sidewall recess is formed in a lower portion of the second sidewall. A first dielectric material is formed over the substrate to cover the first gate stack and the second gate stack. A lightly doped drain region is formed in the substrate of the periphery region. A charge-storing material is formed over the first dielectric material. A second dielectric material is formed over the charge-storing material. Portions of the first dielectric material, the charge-storing material, and the second dielectric material, are removed so that a first storage structure is formed adjacent to the first sidewall of the first gate stack and a second storage structure is formed adjacent to the second sidewall of the second gate stack. The first storage structure has a generally L-shaped cross-section and includes a horizontal portion extended adjacent to at least part of the substrate and a vertical portion extended adjacent to at least part of the first sidewall. The second storage structure has a generally L-shaped cross-section and includes a horizontal portion extended adjacent to at least part of the substrate and a vertical portion extended adjacent to at least part of the second sidewall. A first source/drain region is formed in the substrate of the array region. A third dielectric material is deposited over the substrate. A spacer material is formed over the third dielectric material. Portions of the third dielectric material and the spacer material, are removed so that a first spacer structure is formed separated from the first storage structure by the third dielectric material and a second spacer structure is formed separated from the second storage structure by the third dielectric material. A second source/drain region is formed in the substrate of the periphery region.

In accordance with yet another aspect of the present invention, a method of manufacturing a semiconductor structure is provided. An array region gate stack is formed on an array region of a substrate and a periphery region gate stack is formed on a periphery region of the substrate. A first dielectric material is formed over the array region gate stack and the periphery region gate stack. A lightly doped drain region is formed in the periphery region. A charge-storing material is formed over the first dielectric material. A second dielectric material is formed over the charge-storing material. Portions of the first dielectric material, the charge-storing material, and the second dielectric material are removed such that a storage structure of the array region gate stack is formed. A first source/drain region in the array region is formed. A third dielectric material is deposited over the substrate. The storage structure is enclosed by the first dielectric material, the second dielectric material, and the third dielectric material.

This paragraph describes some embodiments of the aspect of the present invention described in the immediately preceding paragraph. A second source/drain region may be formed in the periphery region. A spacer material may be formed over the third dielectric layer. One or more recess regions may be formed in the substrate adjacent to but not underlying at least one of either the array region gate stack and the periphery region gate stack. The array region gate stack may be in a memory cell array of the semiconductor structure and the periphery region gate stack may be in a logic region of the semiconductor structure. The second dielectric material may be different than the charge-storing material. A thickness of the charge-storing material may be between about 30 angstroms and about 200 angstroms. A gate stack width of the periphery region gate stack may be about 90 nanometers or less. The forming of the first dielectric material over the substrate may include a poly re-oxide step.

In accordance with another aspect of the present invention, a method of manufacturing a semiconductor structure is described. The semiconductor structure includes a substrate. An array region gate stack is on an array region of the substrate and a periphery region gate stack is on a periphery region of the substrate. A first dielectric material is over the array gate stack and over the periphery gate stack. A recess region is in at least one of the array region and the periphery region. A charge-storing material is over the first dielectric material. A second dielectric material is over the charge-storing material. A storage structure of the array gate stack is interposed between the first dielectric material and the second dielectric material. A third dielectric material is over the second dielectric material. The storage structure is enclosed by the first dielectric material, the second dielectric material, and the third dielectric material.

This paragraph describes some embodiments of the aspect of the present invention described in the immediately preceding paragraph. A lightly doped drain region may be in the periphery region. A first source/drain region may be in the array region. A second source/drain region may be in the periphery region. The recess region may have a recess between about 50 angstroms and about 300 angstroms. The storage structure may include a silicon nitride material. A gate stack width of the periphery region gate stack may be less than about 130 nm. A gate stack width of the periphery region gate stack may be less than about 90 nm. The second dielectric material may be different than the charge-storing material. The storage structure may have a generally L-shaped cross-section. The first source/drain region may be substantially aligned with the storage structure In accordance with yet another aspect of the present invention, a method of manufacturing a semiconductor chip is described. An array region gate stack is formed on an array region of a substrate and a periphery region gate stack is formed on a periphery region of the substrate. The array region gate stack has an array region gate stack sidewall and the periphery region gate stack has a periphery region gate stack sidewall. A first dielectric material is deposited over the substrate. A lightly doped drain region is formed in the periphery region well. A charge-storing material is formed over the first dielectric material. A second dielectric material is formed over the charge-storing material. Portions of the first dielectric material, the charge-storing material, and the second dielectric material are removed so that an array region storage structure is formed on the array region gate stack and a periphery region storage structure is formed on the periphery region gate stack. The array region storage structure has a generally L-shaped cross-section and includes. The array region L-shaped storage structure includes an array region storage structure horizontal portion and an array region storage structure vertical portion. The array region storage structure horizontal portion is extended adjacent to at least part of the substrate. The array region storage structure vertical portion is extended adjacent to at least part of the array region gate stack sidewall. The periphery region storage structure has a generally L-shaped cross-section and includes. The periphery region L-shaped storage structure includes a periphery region storage structure horizontal portion and a periphery region storage structure vertical portion. The periphery region storage structure horizontal portion is extended adjacent to at least part of the substrate. The periphery region storage structure vertical portion is extended adjacent to at least part of the periphery region gate stack sidewall. A first source/drain region is formed in the array region well. A third dielectric material is deposited over the substrate. A spacer material is deposited over the third dielectric material. Portions of the third dielectric material and the spacer material are removed, thus forming an array region spacer structure and a periphery region spacer structure. The array region spacer structure is separated from the array region storage structure by the third dielectric material. The periphery region spacer structure is separated from the periphery region storage structure by the third dielectric material. A second source/drain region is formed in the periphery region well.

This paragraph describes some embodiments of the aspect of the present invention described in the immediately preceding paragraph. The method of manufacturing the semiconductor chip may further include forming an array region well in the array region of the substrate and forming a periphery region well in the periphery region of the substrate. The formation of the lightly doped drain region may further include forming a mask over the array region of the substrate, implanting a dopant material into the periphery region well adjacent the periphery region gate stack, and removing the mask. The formation of the first source/drain region may further include forming a mask over the periphery region of the substrate, implanting a dopant material into the array region well adjacent the array region storage structure, and removing the mask. The forming of the second source/drain region may further include forming a mask over the array region of the substrate, implanting a dopant material into the periphery region well adjacent the periphery region spacer structure, and removing the mask. The first dielectric material may include a tunneled oxide material. The third dielectric material may include tetraethylorthosilicate (TEOS). The array region gate stack may include an array region gate dielectric. The periphery region gate stack may include a periphery region gate dielectric. The array region gate dielectric, the periphery region gate dielectric, and the storage material may include a silicon oxide material, a silicon nitride material, a high-K dielectric material, a material deposited by a chemical vapor deposition process, and combinations thereof. The high-K dielectric material may include a material selected from the group is consisted of hafnium oxide ($HfO_2$), hafnium oxynitride (HfON), aluminum oxide ($Al_2O_3$), and combinations thereof. The first dielectric material may include multiple layers of dielectric materials, and each layer in the multiple layers of dielectric materials is different than the charge-storing material. The second dielectric material may be different than the charge-storing material. A charge-storing material thickness may be between about 30 angstroms and about 200 angstroms. An array region gate stack width and a periphery region gate stack width may be no greater than about 130 nm, and preferably no greater than about 90 nm. An array region gate stack width and a periphery region gate stack width may be about 130 nm, 90 nm, 60 nm, and 45 nm. An array region storage structure horizontal portion length and a periphery region storage structure horizontal portion length may be between about 30 angstroms and about 700 angstroms. The first dielectric material is deposited over the substrate comprises a poly re-oxide step. The first source/drain region may be substantially aligned with the array region storage structure. The second source/drain region may be substantially aligned with the periphery region spacer structure. An array region storage structure horizontal portion length and a periphery region storage structure horizontal portion length may be controlled by at least one dry etch process. A charge-storing material thickness may be controlled by at least one chemical vapor deposition process. The third dielectric material may include a multi-layer material deposited by at least one chemical vapor deposition process. The charge-storing material may be enclosed in an oxide material. The oxide material may include the first dielectric material, the second dielectric material, and the third dielectric material.

In accordance with another aspect of the present invention, a method of manufacturing a semiconductor chip is described. An array region gate stack is formed on an array region of a substrate and a periphery region gate stack is formed on a periphery region of the substrate. The array region gate stack has an array region gate stack sidewall and the periphery region gate stack has a periphery region gate stack sidewall. A first dielectric material is deposited over the substrate. A lightly doped drain region is formed in the periphery region well. A charge-storing material is formed over the first dielectric material. A second dielectric material is formed over the charge-storing material. Portions of the first dielectric material, the charge-storing material, and the second dielectric material are removed. The removal of the first dielectric material, the charge-storing material, and the second dielectric material forms an array region storage structure on the array region gate stack and a periphery region storage structure on the periphery region gate stack, the array region storage structure has a generally L-shaped cross-section. The array region storage structure includes an array region storage structure horizontal portion and an array region storage structure vertical portion. The array region storage structure horizontal portion is extended adjacent to at least part of the substrate. The array region storage structure vertical portion is extended adjacent to at least part of the array region gate stack sidewall. The array region storage structure additionally includes an array region storage structure top recessed relative to an array region gate stack top. The periphery region storage structure has a generally L-shaped cross-section and includes a periphery region storage structure horizontal portion and a periphery region storage structure vertical portion. The periphery region storage structure horizontal portion is extended adjacent to at least part of the substrate. The periphery region storage structure vertical portion is extended adjacent to at least part of the periphery region gate stack sidewall. A periphery region storage structure top recessed relative to a periphery region gate stack top. A first source/drain region is formed in the array region well. A third dielectric material is deposited over the substrate. A spacer material is deposited over the third dielectric material. Portions of the third dielectric material and the spacer material are removed. The removal of portions of the third dielectric material and the spacer material forms an array region spacer structure separated from the array region storage structure by the third dielectric material. The removal of portions of the third dielectric material and the spacer material also forms a periphery region spacer structure separated from the periphery region storage structure by the third dielectric material. A second source/drain region is formed in the periphery region well.

This paragraph describes some embodiments of the aspect of the present invention described in the immediately preceding paragraph. The method of forming a semiconductor chip may further include forming an array region well in the array region of the substrate and forming a periphery region well in the periphery region of the substrate. The array region storage structure top may be recessed relative to a top of the array region spacer structure. The periphery region storage structure top may be recessed relative to a top of the periphery region spacer structure.

In accordance with another aspect of the present invention, a method of manufacturing a semiconductor chip is described. An array region gate stack is formed on an array region of a substrate and a periphery region gate stack is formed on a periphery region of the substrate. The array region gate stack has an array region gate stack sidewall and the periphery region gate stack has a periphery region gate stack sidewall. An array region gate stack sidewall recess is formed in a lower portion of the array region gate stack sidewall. A periphery region gate stack sidewall recess is formed in a lower portion of the periphery region gate stack sidewall. A first dielectric material is deposited over the substrate. A lightly doped drain region is formed in the periphery region well. A charge-storing material is formed over the first dielectric material. A second dielectric material is formed over the charge-storing material. Portions of the first dielectric material, the charge-storing material, and the second dielectric material are removed. The removal of the first dielectric material, the charge-storing material, and the second dielectric material forms an array region storage structure on the array region gate stack and a periphery region storage structure on the periphery region gate stack. The array region storage structure has a generally L-shaped cross-section. The generally L-shaped array region storage structure includes an array region storage structure horizontal portion and an array region storage structure vertical portion. The array region storage structure horizontal portion is extended adjacent to at least part of the substrate. The array region storage structure vertical portion is extended adjacent to at least part of the array region gate stack sidewall. The periphery region storage structure also has a generally L-shaped cross-section. The generally L-shaped periphery region storage structure includes a periphery region storage structure horizontal portion and a periphery region storage structure vertical portion. The periphery region storage structure horizontal portion is extended adjacent to at least part of the substrate. The periphery region storage structure vertical portion is extended adjacent to at least part of the periphery region gate stack sidewall. A first source/drain region is formed in the array region well. A third dielectric material is deposited over the substrate. A spacer material is deposited over the third dielectric material. Portions of the third dielectric material and the spacer material are removed, thus forming an array region spacer structure and a periphery region spacer structure. The array region spacer structure is separated from the array region storage structure by the third dielectric material. The periphery region spacer structure is separated from the periphery region storage structure by the third dielectric material. A second source/drain region is formed in the periphery region well.

This paragraph describes some embodiments of the aspect of the present invention described in the immediately preceding paragraph. The method of forming the semiconductor chip may further include forming an array region well in the array region of the substrate and forming a periphery region well in the periphery region of the substrate. An array region storage structure top may be recessed relative to a top of the array region gate stack. A periphery region storage structure top may be recessed relative to a top of the periphery region gate stack. An array region storage structure top may be recessed relative to a top of the array region spacer structure. A periphery region storage structure top may be recessed relative to a top of the periphery region spacer structure.

In accordance with yet another aspect of the present invention, a method of manufacturing a semiconductor chip is described. An array region gate stack is formed on an array region of a substrate and a periphery region gate stack is formed on a periphery region of the substrate. The array region gate stack has an array region gate stack sidewall and the periphery region gate stack has a periphery region gate stack sidewall. An array region substrate recess is formed in the substrate adjacent to the array region gate stack and a periphery region substrate recess is formed in the substrate adjacent to the periphery region gate stack. A first dielectric material is deposited over the substrate. A lightly doped drain region is formed in the periphery region well. A charge-storing material is formed over the first dielectric material. A second dielectric material is formed over the charge-storing material. Portions of the first dielectric material, the charge-storing material, and the second dielectric material are removed. The removal of the first dielectric material, the charge-storing material, and the second dielectric material form an array region storage structure on the array region gate stack and a periphery region storage structure on the periphery region gate stack. The array region storage structure has a generally L-shaped cross-section. The array region storage structure includes an array region storage structure horizontal portion and an array region storage structure vertical portion. The array region storage structure horizontal portion is extended adjacent to at least part of the substrate. The array region storage structure vertical portion is extended adjacent to at least part of the array region gate stack sidewall. The periphery region storage structure includes a periphery region storage structure horizontal portion and a periphery region storage structure vertical portion. The periphery region storage structure horizontal portion is extended adjacent to at least part of the substrate. The periphery region storage structure vertical portion is extended adjacent to at least part of the periphery region gate stack sidewall. A first source/drain region is formed in the array region well. A third dielectric material is deposited over the substrate. A spacer material is deposited over the third dielectric material. Portions of the third dielectric material and the spacer material are removed, thus forming an array region spacer structure and a periphery region spacer structure. The array region spacer structure is separated from the array region storage structure by the third dielectric material. The periphery region spacer structure is separated from the periphery region storage structure by the third dielectric material. A second source/drain region is formed in the periphery region well.

This paragraph describes some embodiments of the aspect of the present invention described in the immediately preceding paragraph. The method of forming a semiconductor chip may further include forming an array region well in the array region of the substrate and forming a periphery region well in the periphery region of the substrate. An array region storage structure top may be recessed relative to a top of the array region gate stack. A periphery region storage structure top may be recessed relative to a top of the periphery region gate stack. An array region storage structure top may be recessed relative to a top of the array region spacer structure. A periphery region storage structure top may be recessed relative to a top of the periphery region spacer structure.

In accordance with still another aspect of the present invention, a method of manufacturing a semiconductor chip is described. An array region gate stack is formed on an array region of a substrate and a periphery region gate stack is formed on a periphery region of the substrate. The array region gate stack has an array region gate stack sidewall and the periphery region gate stack has a periphery region gate stack sidewall. An array region substrate recess is formed in the substrate adjacent to the array region gate stack. A periphery region substrate recess is formed in the substrate adjacent to the periphery region gate stack. A first dielectric material is deposited over the substrate. A lightly doped drain region is formed in the periphery region well. A charge-storing material is formed over the first dielectric material. Portions of the first dielectric material and the charge-storing material are removed, thus forming an array region storage structure and a periphery region storage structure. The array region storage structure is formed on the array region gate stack and the periphery region storage structure is formed on the periphery region gate stack. The array region storage structure includes an array region portion of the charge-storing material and an array region portion of the first dielectric material. The array region portion of the charge-storing material is separated from the array region gate stack by the array region portion of the first dielectric material. The array region portion of the charge-storing material is in at least a portion of the array region substrate recess and has a generally quarter-round shaped cross-section. The array region portion of the first dielectric material has a generally L-shaped cross-section. The generally L-shaped array region first dielectric material includes an array region storage structure first dielectric horizontal portion extended adjacent to at least part of the substrate, an array region storage structure first dielectric vertical portion extended adjacent to at least part of the array region gate stack sidewall. The periphery region storage structure includes a periphery region portion of the charge-storing material and a periphery region portion of the first dielectric material. The periphery region portion of the charge-storing material is separated from the periphery region gate stack by the periphery region portion of the first dielectric material. The periphery region portion of the charge-storing material is in at least a portion of the periphery region substrate recess and has a generally quarter-round shaped cross-section. The periphery region portion of the first dielectric material has a generally L-shaped cross-section. The generally L-shaped periphery region first dielectric material includes a periphery region storage structure first dielectric horizontal portion extended adjacent to at least part of the substrate, a periphery region storage structure first dielectric vertical portion extended adjacent to at least part of the periphery region gate stack sidewall. A first source/drain region is formed in the array region well. A second dielectric material is deposited over the substrate. A spacer material is deposited over the second dielectric material. Portions of the second dielectric material and the spacer material are removed, thus forming an array region spacer structure and a periphery region spacer structure. The array region spacer structure is separated from the array region storage structure by the second dielectric material. The periphery region spacer structure is separated from the periphery region storage structure by the second dielectric material. A second source/drain region is formed in the periphery region well.

This paragraph describes some embodiments of the aspect of the present invention described in the immediately preceding paragraph. The method of forming a semiconductor chip may further include forming an array region well in the array region of the substrate and forming a periphery region well in the periphery region of the substrate. A top of the array region portion of the first dielectric material may be recessed relative to a top of the array region gate stack. A top of the periphery region portion of the first dielectric material may be recessed relative to a top of the periphery region gate stack. A top of the array region portion of the first dielectric material may be recessed relative to a top of the array region spacer structure. A top of the periphery region portion of the first dielectric material may be recessed relative to a top of the periphery region spacer structure.

In accordance with yet another aspect of the present invention, a method of manufacturing a semiconductor chip is described. An array region gate stack is formed on the array region of the substrate and a periphery region gate stack is formed on the periphery region of the substrate. The array region gate stack has an array region gate stack sidewall and the periphery region gate stack has a periphery region gate stack sidewall. An array region gate stack sidewall recess is formed in a lower portion of the array region gate stack sidewall. A periphery region gate stack sidewall recess is formed in a lower portion of the periphery region gate stack sidewall. An array region substrate recess is formed in the substrate adjacent to the array region gate stack and a periphery region substrate recess is formed in the substrate adjacent to the periphery region gate stack. A first dielectric material is deposited over the substrate. A lightly doped drain region is formed in the periphery region well. A charge-storing material is formed over the first dielectric material. Portions of the first dielectric material and the charge-storing material are removed, thus forming an array region storage structure and a periphery region storage structure. The array region storage structure is formed on the array region gate stack and the periphery region storage structure is formed on the periphery region gate stack. The array region storage structure includes an array region portion of the charge-storing material and an array region portion of the first dielectric material. The array region portion of the charge-storing material is separated from the array region gate stack by the array region portion of the first dielectric material. The array region portion of the charge-storing material has a generally quarter-round shaped cross-section formed in at least a portion of the array region gate stack sidewall recess. The array region portion of the first dielectric material has a generally L-shaped cross-section. The generally L-shaped array region first dielectric material includes an array region storage structure first dielectric horizontal portion extended adjacent to at least part of the substrate, and an array region storage structure first dielectric vertical portion extended adjacent to at least part of the array region gate stack sidewall. The periphery region storage structure includes a periphery region portion of the charge-storing material and a periphery region portion of the first dielectric material. The periphery region portion of the charge-storing material is separated from the periphery region gate stack by the periphery region portion of the first dielectric material. The periphery region portion of the charge-storing material has a generally quarter-round shaped cross-section formed in at least a portion of the periphery region gate stack sidewall recess. The periphery region portion of the first dielectric material has a generally L-shaped cross-section. The generally L-shaped periphery region first dielectric material includes a periphery region storage structure first dielectric horizontal portion extended adjacent to at least part of the substrate, and a periphery region storage structure first dielectric vertical portion extended adjacent to at least part of the periphery region gate stack sidewall. A first source/drain region is formed in the array region well. A second dielectric material is deposited over the substrate. A spacer material is deposited over the second dielectric material. Portions of the second dielectric material and the spacer material are removed, thus forming an array region spacer structure separated from the array region storage structure by the second dielectric material, and a periphery region spacer structure separated from the periphery region storage structure by the second dielectric material. A second source/drain region is formed in the periphery region well.

This paragraph describes some embodiments of the aspect of the present invention described in the immediately preceding paragraph. The method of forming a semiconductor chip may further include forming an array region well in the array region of the substrate and forming a periphery region well in the periphery region of the substrate. A top of the array region portion of the first dielectric material may be recessed relative to an array region gate stack top. A top of the periphery region portion of the first dielectric material may be recessed relative to a periphery region gate stack top. A top of the array region portion of the first dielectric material may be recessed relative to an array region spacer structure top. A top of the periphery region portion of the first dielectric material may be recessed relative to a periphery region spacer structure top.

In accordance with yet another aspect of the present invention, a method of manufacturing a semiconductor chip is described. An array region gate stack is formed on the array region of the substrate and a periphery region gate stack is formed on the periphery region of the substrate. The array region gate stack has an array region gate stack sidewall and the periphery region gate stack has a periphery region gate stack sidewall. An array region gate stack sidewall recess is formed in a lower portion of the array region gate stack sidewall. A periphery region gate stack sidewall recess is formed in a lower portion of the periphery region gate stack sidewall. An array region substrate recess is formed in the substrate adjacent to the array region gate stack. A periphery region substrate recess is formed in the substrate adjacent to the periphery region gate stack. A first dielectric material is deposited over the substrate. A lightly doped drain region is formed in the periphery region well. A charge-storing material is formed over the first dielectric material. Portions of the first dielectric material and the charge-storing material are removed, thus forming an array region storage structure on the array region gate stack and a periphery region storage structure on the periphery region gate stack. The array region storage structure includes an array region portion of the charge-storing material and an array region portion of the first dielectric material. The array region portion of the charge-storing material is separated from the array region gate stack by the array region portion of the first dielectric material. The array region portion of the charge-storing material has a generally quarter-round shaped cross-section formed in at least a portion of the array region gate stack sidewall recess and an array region charge-storing material vertical portion extended adjacent to at least a portion of the array region gate stack sidewall. The array region portion of the first dielectric material has a generally L-shaped cross-section. The array region generally L-shaped first dielectric material includes an array region storage structure first dielectric horizontal portion extended adjacent to at least part of the substrate, and an array region storage structure first dielectric vertical portion extended adjacent to at least part of the array region gate stack sidewall. The periphery region storage structure includes a periphery region portion of the charge-storing material and a periphery region portion of the first dielectric material. The periphery region portion of the charge-storing material is separated from the periphery region gate stack by the periphery region portion of the first dielectric material. The periphery region portion of the charge-storing material has a generally quarter-round shaped cross-section formed in at least a portion of the periphery region gate stack sidewall recess and a periphery region charge-storing material vertical portion extended adjacent to at least a portion of the periphery region gate stack sidewall. The periphery region portion of the first dielectric material has a generally L-shaped cross-section. The periphery region generally L-shaped first dielectric material includes a periphery region storage structure first dielectric horizontal portion extended adjacent to at least part of the substrate, and a periphery region storage structure first dielectric vertical portion extended adjacent to at least part of the periphery region gate stack sidewall. A first source/drain region is formed in the array region well. A second dielectric material is deposited over the substrate. A spacer material is deposited over the second dielectric material. Portions of the second dielectric material and the spacer material are removed. The removal of portions of the second dielectric material and the spacer material forms an array region spacer structure and a periphery region spacer structure. The array region spacer structure is separated from the array region storage structure by the second dielectric material, and the periphery region spacer structure is separated from the periphery region storage structure by the second dielectric material. A second source/drain is formed region in the periphery region well.

This paragraph describes some embodiments of the aspect of the present invention described in the immediately preceding paragraph. The method of forming a semiconductor chip may further include forming an array region well in the array region of the substrate and forming a periphery region well in the periphery region of the substrate. An array region storage structure top may be recessed relative to an array region gate stack top. A periphery region storage structure top may be recessed relative to a periphery region gate stack top. An array region storage structure top may be recessed relative to an array region spacer structure top. A periphery region storage structure top may be recessed relative to a periphery region spacer structure top.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which:

FIGS. 3A-3I show a cross-sectional view of sidewall SONOS transistors in accordance with a third embodiment of the present invention;

FIGS. 6A-6K show a cross-sectional view of sidewall SONOS transistors in accordance with a sixth embodiment of the present invention.

DETAILED DESCRIPTION OF ILLUSTRATIVE EMBODIMENTS

Figure 1A:
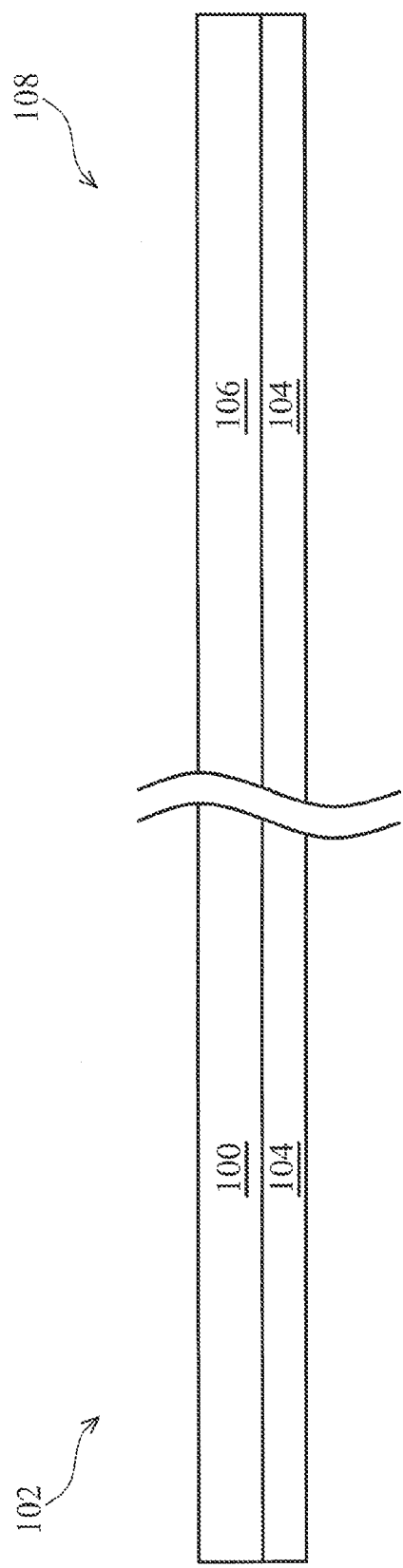
FIGS. 1A-1N show a cross-sectional view of sidewall SONOS transistors in accordance with a first embodiment of the present invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, a first embodiment of the present invention provides a method of manufacturing a semiconductor chip. FIGS. 1A-1M are cross-sectional views of sidewall silicon-oxide-nitride-oxide-silicon (SONOS) transistors in the semiconductor chip, in accordance with a first embodiment of the present invention.

Referring to FIG. 1A, an array region well 100 is formed in the array region 102 of the substrate 104 and a periphery region well 106 is formed in the periphery region 108 of the substrate 104. The substrate 104 may be a substantially planar silicon bulk substrate, a silicon bulk substrate suitable for a fin-type field effect transistor (FinFET), a silicon on insulator substrate, a silicon germanium substrate, and combinations thereof, for example.

Figure 1B:
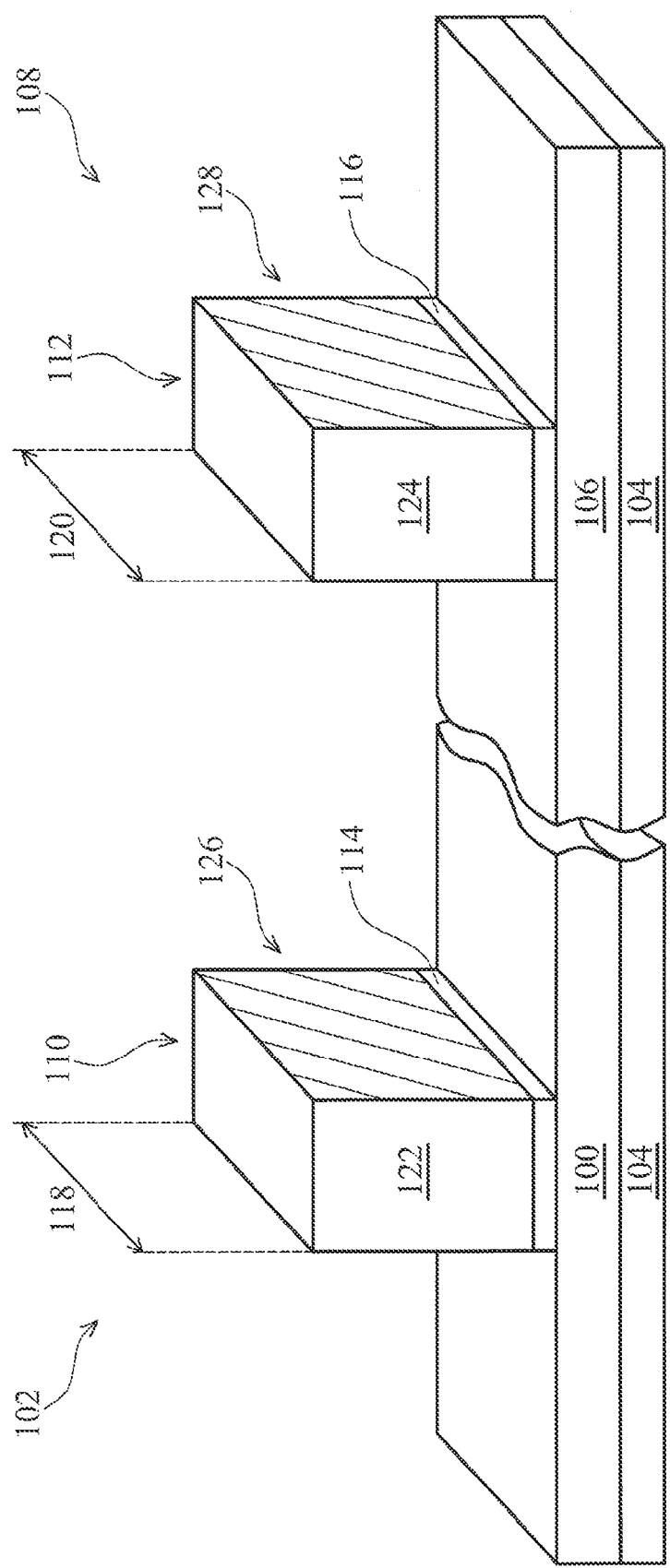

FIG. 1B is a view of the array region 102 and the periphery region 108 in three dimensions. An array region gate stack 110 is formed on the substrate 104 in the array region 102 and a periphery region gate stack 112 is formed on the substrate 104 in the periphery region 108. In other embodiments of the present invention, the array region gate stack 110 is in a memory cell array and the periphery region gate stack 112 is in a logic region of the semiconductor structure. The array region gate stack 110 includes an array region gate dielectric 114, and the periphery region gate stack 112 includes a periphery region gate dielectric 116. The array region gate dielectric 114 and the periphery region gate dielectric 116 may include a silicon oxide material, a silicon nitride material, a high-K dielectric material, a material deposited by a chemical vapor deposition process, and combinations thereof, for example. The high-K dielectric material may be hafnium oxide ($HfO_2$), hafnium oxynitride (HfON), aluminum oxide ($Al_2O_3$), and combinations thereof, for example.

With continuing reference to FIG. 1B, the width 118 of the array region gate stack 110 and the width 120 of the periphery region gate stack 112 are preferably about 90 nanometers (nm) or less. However, in other embodiments, the width 118 of the array region gate stack 110 and the width 120 of the periphery region gate stack 112 may be about 130 nm, 90 nm, 60 nm, and 45 nm, for example. The array region gate stack 110 includes an array region gate electrode 122 and the periphery region gate stack 112 includes a periphery region gate electrode 124. The array region gate electrode 122 and the periphery region gate electrode 124 may include materials such as polysilicon, silicide, metal, and combinations thereof, for example. The array region gate stack 110 has an array region gate stack sidewall 126 and the periphery region gate stack 112 has a periphery region gate stack sidewall 128. For illustrative purposes, the outlines of the array region gate stack sidewall 126 and the periphery region gate stack sidewall 128 FIG. 1B are indicated with a diagonal line pattern.

FIG. 1C shows a first dielectric material 130 is deposited over the substrate 104. The deposition of the first dielectric material 130 may include a poly re-oxide step, for example. The first dielectric material 130 may be formed of multiple layers of dielectric materials. In embodiments having a multi-layer first dielectric material, each layer in the multiple layers of dielectric materials is preferably different than the charge-storing material. The first dielectric material is preferably a tunneling oxide material, however it may be any suitable dielectric material.

Figure 1D:
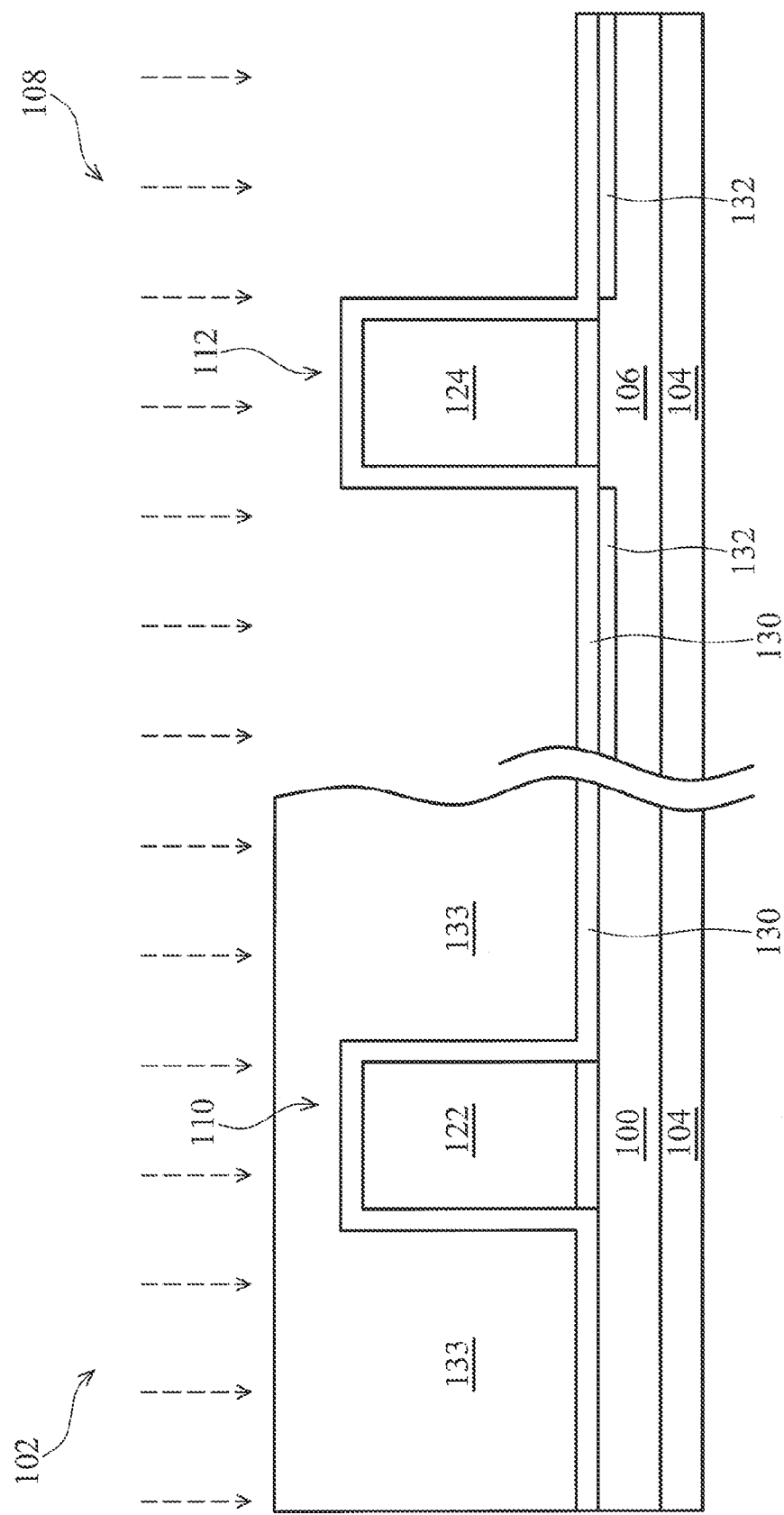
Figure 1E:
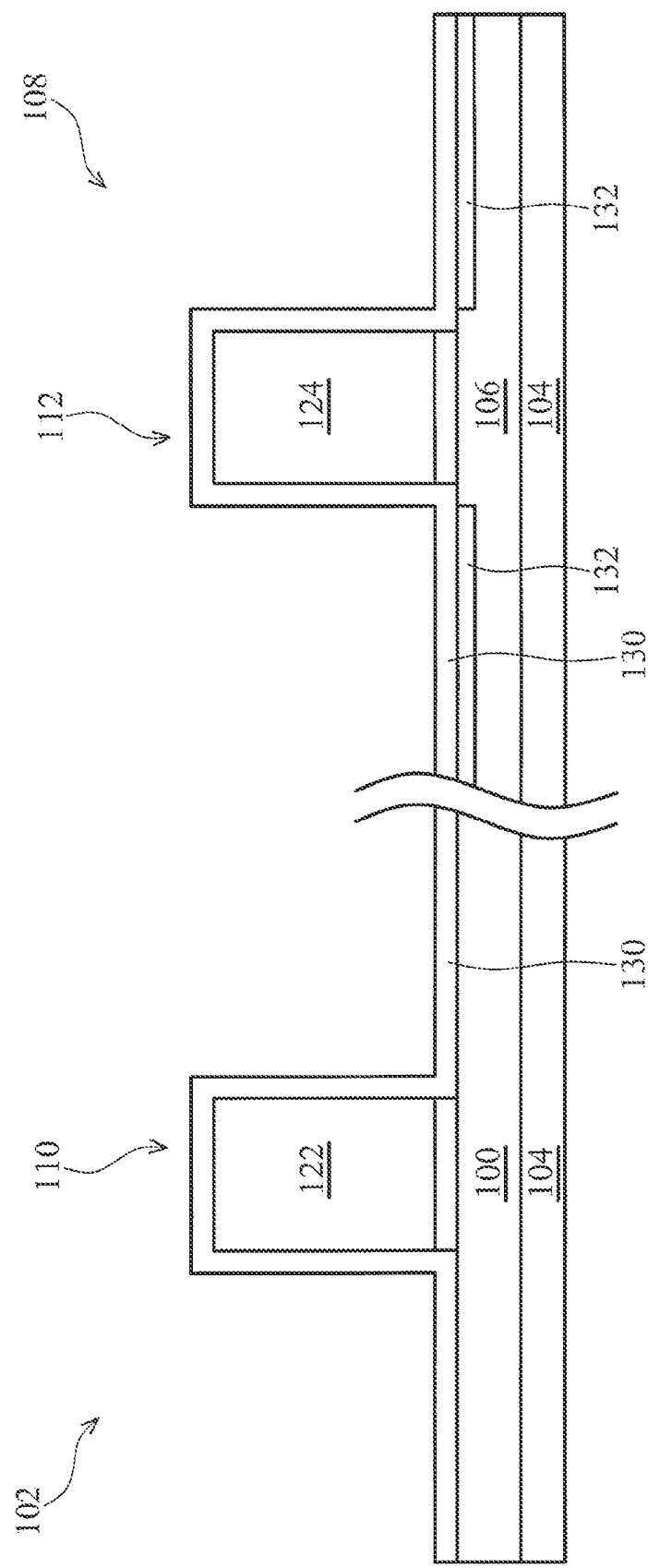

As shown in FIGS. 1D and 1E, a lightly doped drain region 132 in the periphery region well 106 is formed. In FIG. 1D, a mask 133 is formed over the array region 100 of the substrate 104. As illustrated by the arrows in FIG. 1D, a dopant material is implanted into the periphery region well 106 adjacent the periphery region gate stack 112. Referring now to FIG. 1E, the mask 133 is removed after the dopant implant is performed.

Figure 1F:
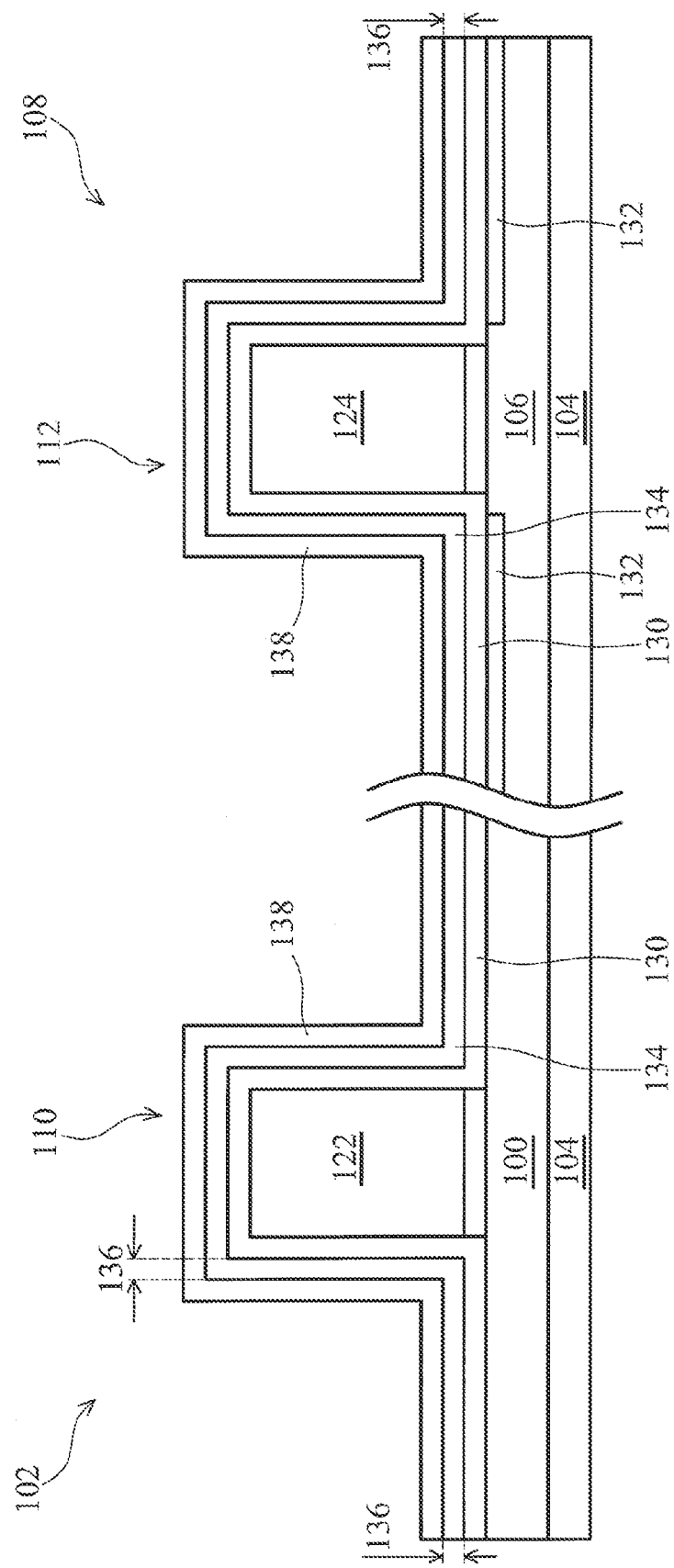

FIG. 1F shows a charge-storing material 134 is formed over the first dielectric material 130. The thickness 136 of the charge-storing material 134 may be between about 30 angstroms and about 200 angstroms, for example. The charge-storing material thickness 136 is controlled by at least one chemical vapor deposition (CVD) process, for example. The charge-storing material 134 may include a silicon oxide material, a silicon nitride material, and a high-K dielectric material, a material deposited by a chemical vapor deposition process, and combinations thereof, for example. The high-K dielectric material in the charge-storing material 134 may be hafnium oxide ($HfO_2$), hafnium oxynitride (HfON), aluminum oxide ($Al_2O_3$), and combinations thereof, for example.

Also shown in FIG. 1F, a second dielectric material 138 is formed over the charge-storing material 134. The second dielectric material 138 is preferably a different material than the charge-storing material 134.

Figure 1G:
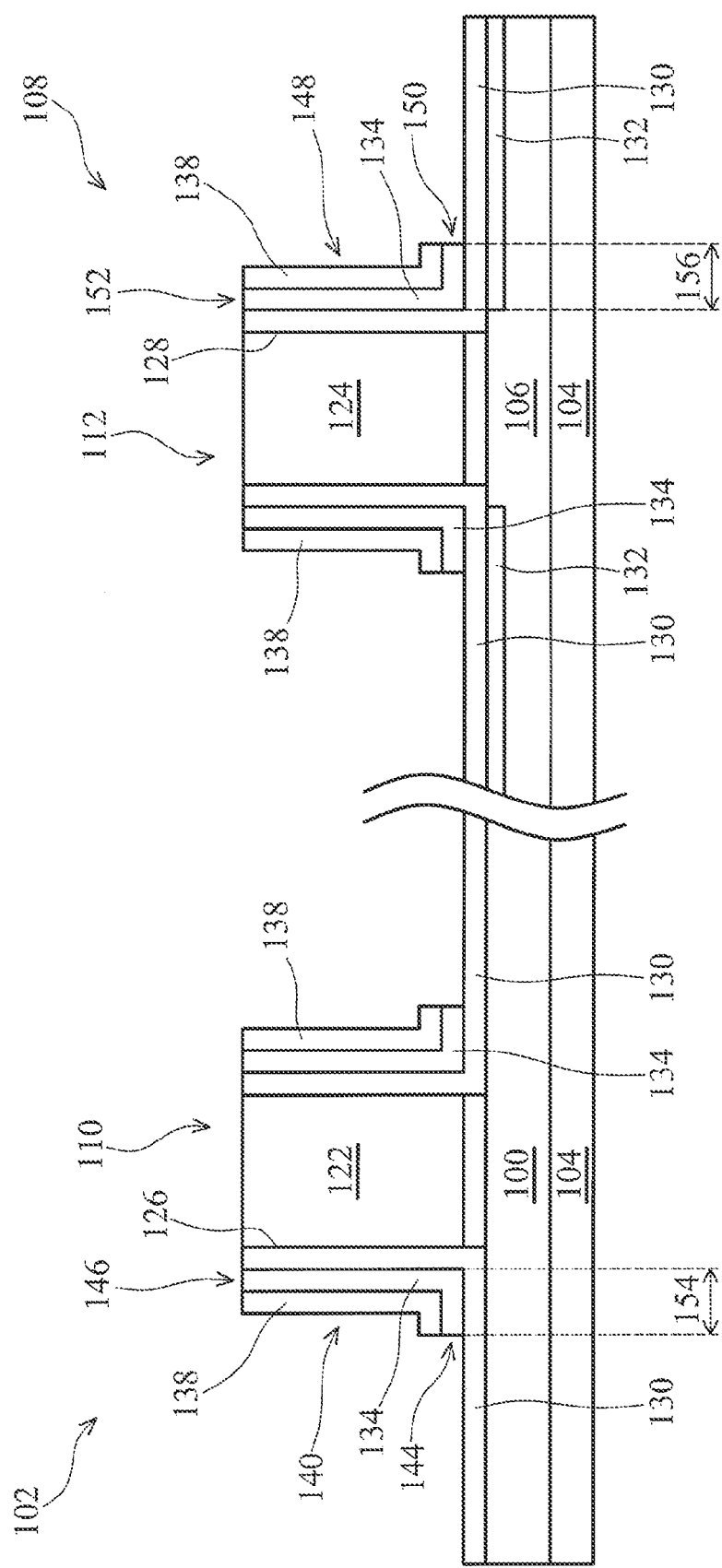

As illustrated in FIG. 1G, portions of the first dielectric material 130, the charge-storing material 134, and the second dielectric material 138 are removed so that an array region storage structure 140 is formed on the array region gate stack 110 and a periphery region storage structure 148 is formed on the periphery region gate stack 112. The array region storage structure 140 has a generally L-shaped cross-section, which includes an array region storage structure horizontal portion 144, and an array region storage structure vertical portion 146. The array region storage structure horizontal portion 144 is extended adjacent to at least part of the substrate 104. The array region storage structure vertical portion 146 is extended adjacent to at least part of the array region gate stack sidewall 126.

Also illustrated in FIG. 1G, the periphery region storage structure 148 has a generally L-shaped cross-section. The periphery region storage structure 148 includes a periphery region storage structure horizontal portion 150 extended adjacent to at least part of the substrate 104. The periphery region storage structure vertical portion 152 is extended adjacent to at least part of the periphery region gate stack sidewall 128. The length 154 of the array region storage structure horizontal portion 144 and the length 156 of the periphery region storage structure horizontal portion 150 are between about 30 angstroms and about 700 angstroms. The lengths 154 and 156 may be controlled by at least one dry etch process, for example.

Figure 1H:
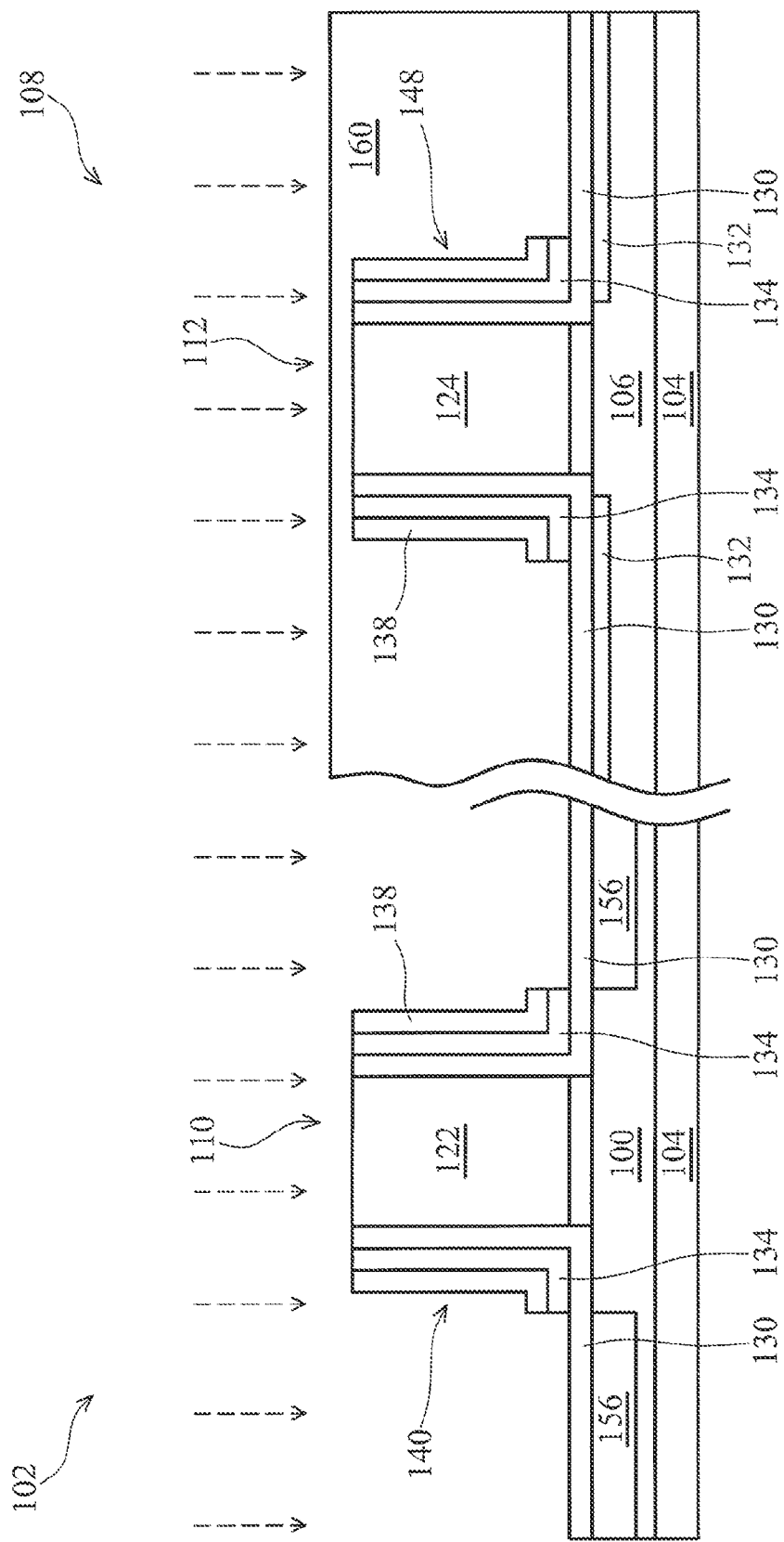
Figure 11:
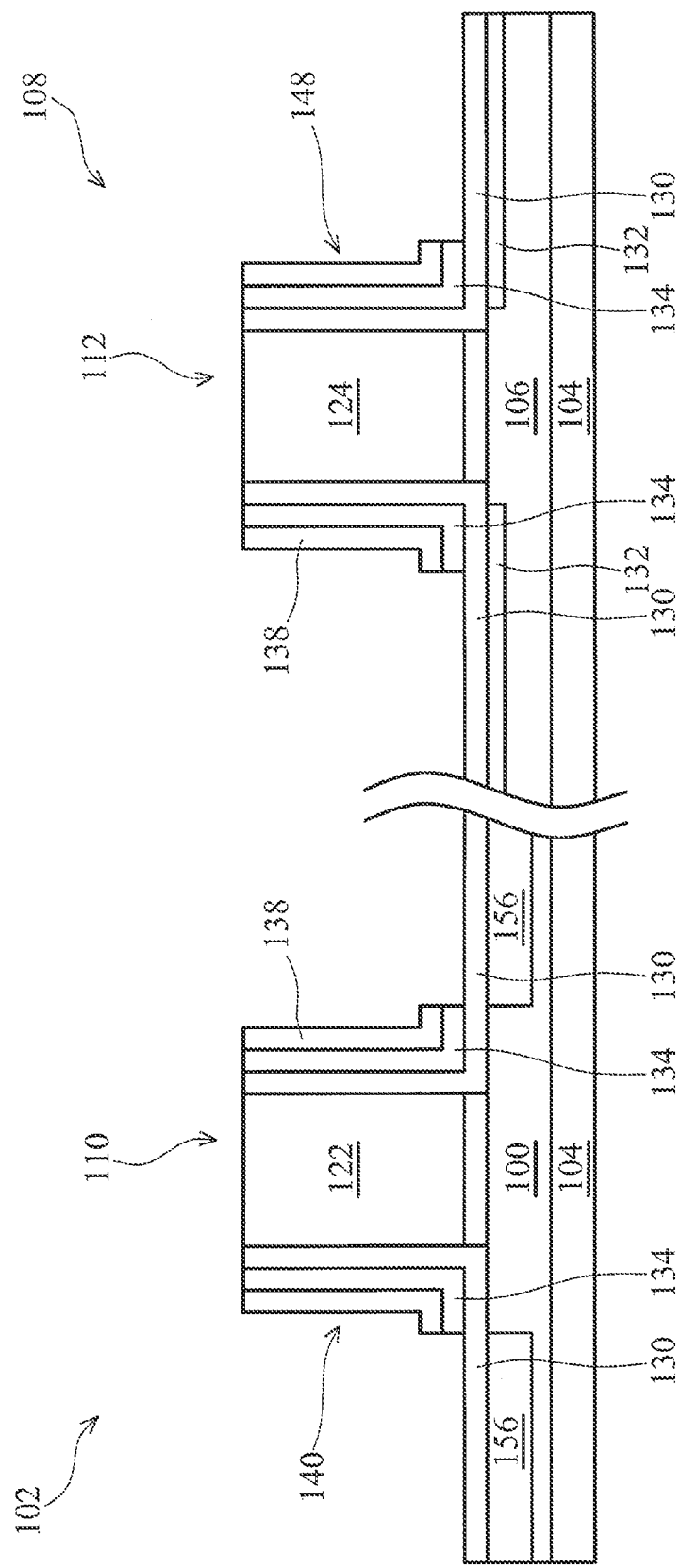

FIGS. 1H and 1I show a first set of source/drain regions 156 is formed in the array region well 100. In FIG. 1H, the first set of source/drain regions 156 is substantially aligned with the array region storage structure 140. To form the first set of source/drain regions 156, a mask 160 is formed over the periphery region 108 of the substrate 104. A dopant material, represented in FIG. 1H by arrows, is implanted into the array region well 108 adjacent the array region storage structure 140. In FIG. 1I, the mask 160 has been removed.

Figure 1J:
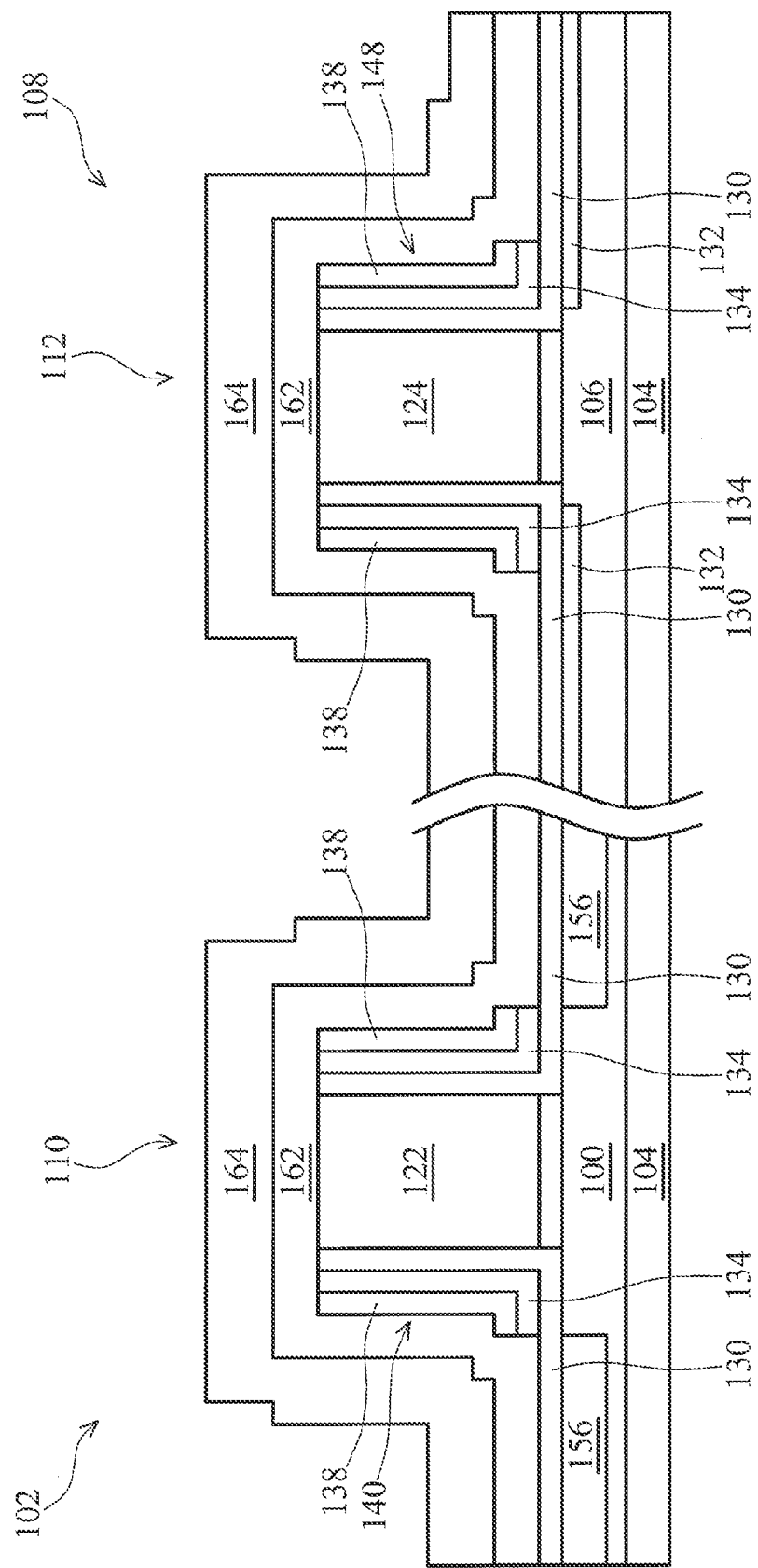

In FIG. 1J, a third dielectric material 162 is deposited over the substrate 104. The third dielectric material 162 is preferably tetraethylorthosilicate (TEOS), however the third dielectric material 162 may be any suitable dielectric material that is different than the charge-storing material 134. The third dielectric material 162 may include a multi-layer material deposited by at least one chemical vapor deposition process. A spacer material 164 is deposited over the third dielectric material 162.

Figure 1K:
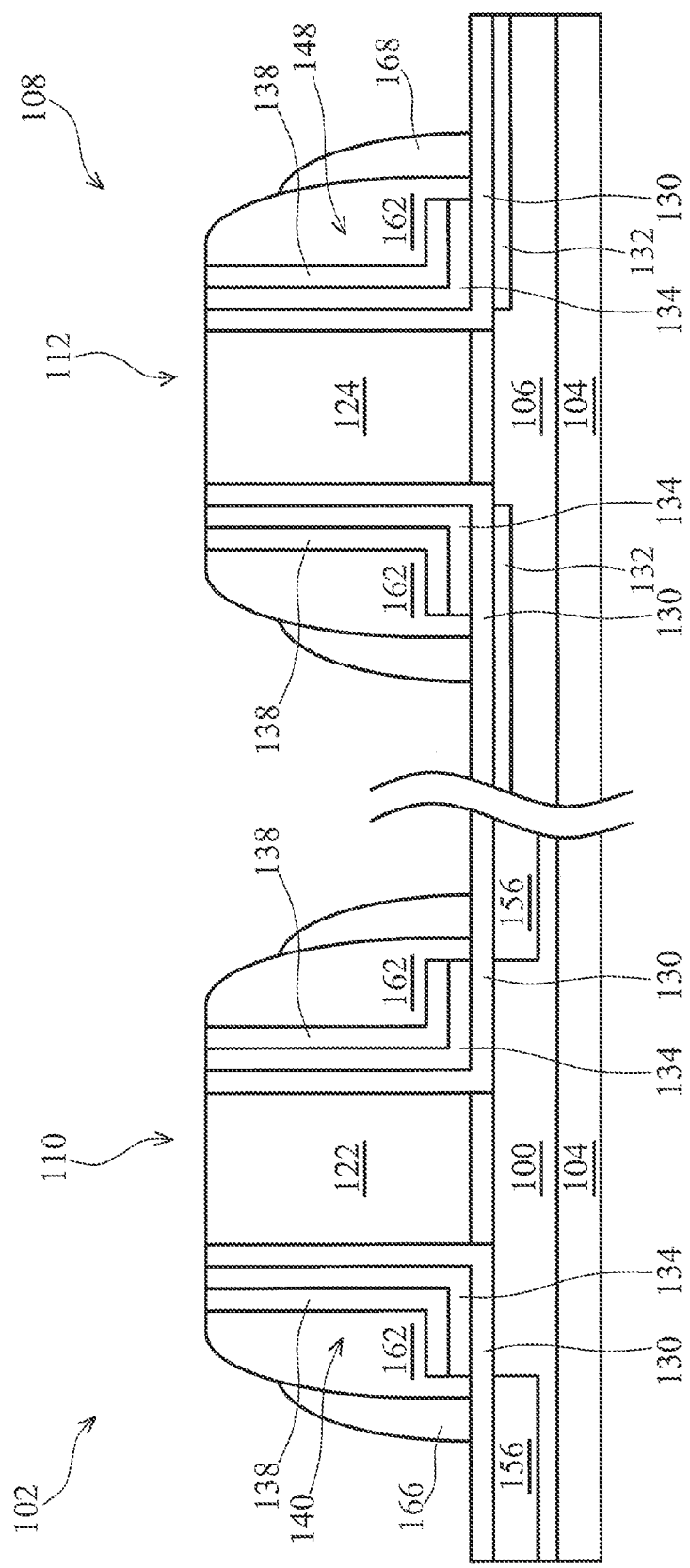

With reference to FIG. 1K, portions of the third dielectric material 162 and the spacer material 164 have been removed. The removal of portions of the third dielectric material 162 and the spacer material 164 form an array region spacer structure 166 and a periphery region spacer structure 168. The array region spacer structure 166 is separated from the array region storage structure 140 by the third dielectric material 162. The periphery region spacer structure 168 is separated from the periphery region storage structure 148 by the third dielectric material 162.

Figure 1M:
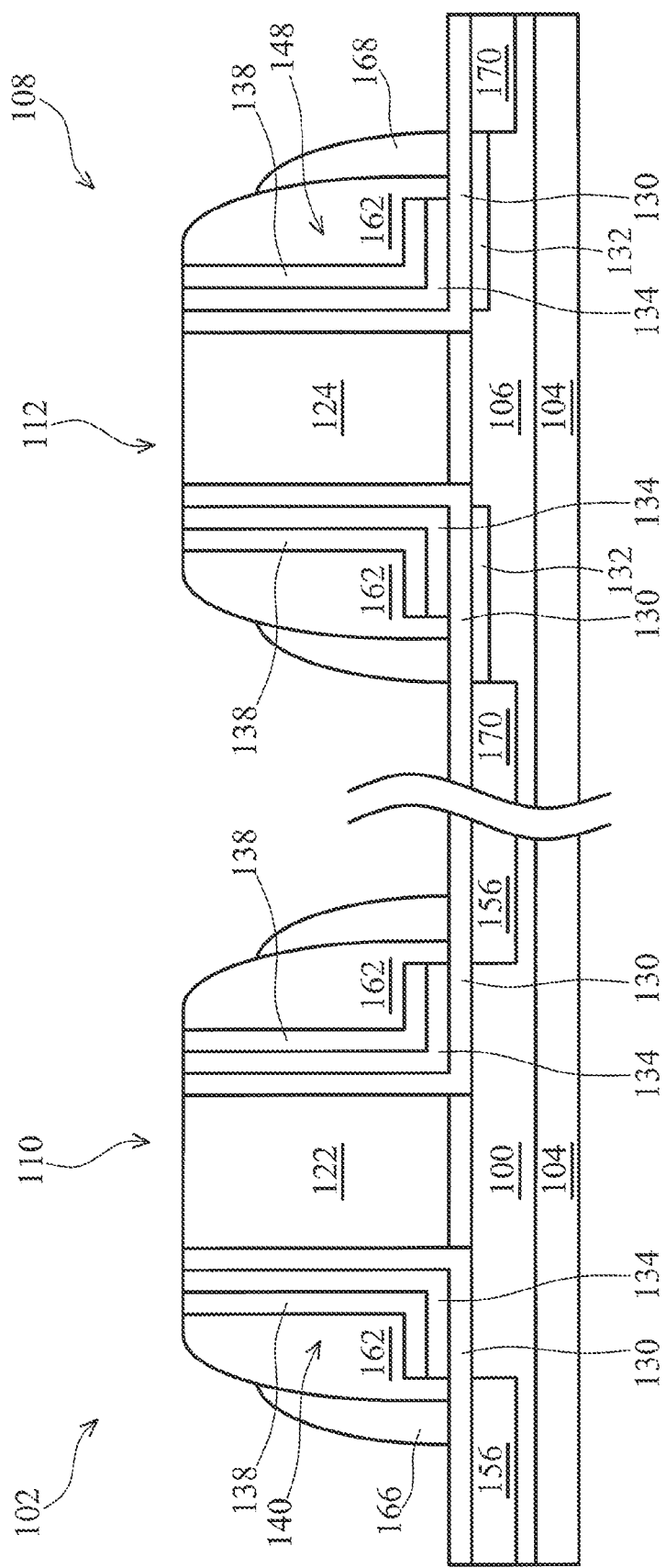

FIGS. 1L and 1M show a second source/drain region 170 is formed in the periphery region well 106. In FIG. 1L, the second source/drain region 170 is substantially aligned with the periphery region spacer structure 168. To form the second source/drain region 170, a mask 172 is formed over the substrate 104 in the array region 102. As illustrated by the arrows in FIG. 1L, a dopant material is implanted into the periphery region well 106 and adjacent the periphery region spacer structure 168. In FIG. 1M, the mask 172 has been removed.

Figure 1N:
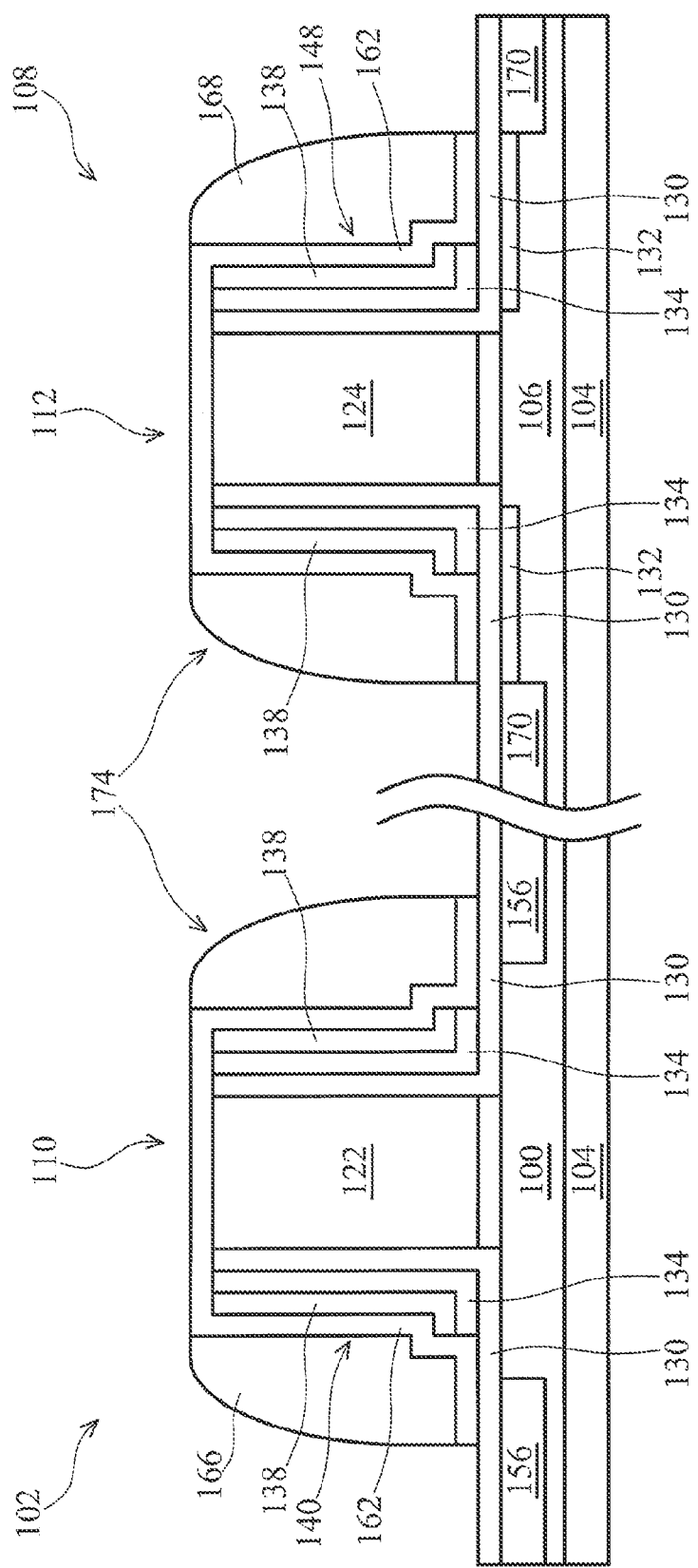

In another embodiment of the present invention shown in FIG. 1N, the third dielectric material 162 separates the array region spacer structure 166 and the periphery region spacer structure 168 from the substrate 104. In both the array region 102 and the periphery region 108, the charge-storing material 134 is enclosed in an oxide material 174. The oxide material 174 of the first illustrative embodiment includes the first dielectric material 130, the second dielectric material 138, and the third dielectric material 162.

Generally, a second embodiment of the present invention provides another method of manufacturing a semiconductor chip. FIGS. 1A-1F and FIGS. 2A-2F are cross-sectional views of sidewall SONOS transistors in the semiconductor chip of the second embodiment. The second embodiment is a variation on the first embodiment. The steps of the first embodiment, illustrated in FIGS. 1A-1F and discussed above, are the same for the second embodiment.

Figure 2A:
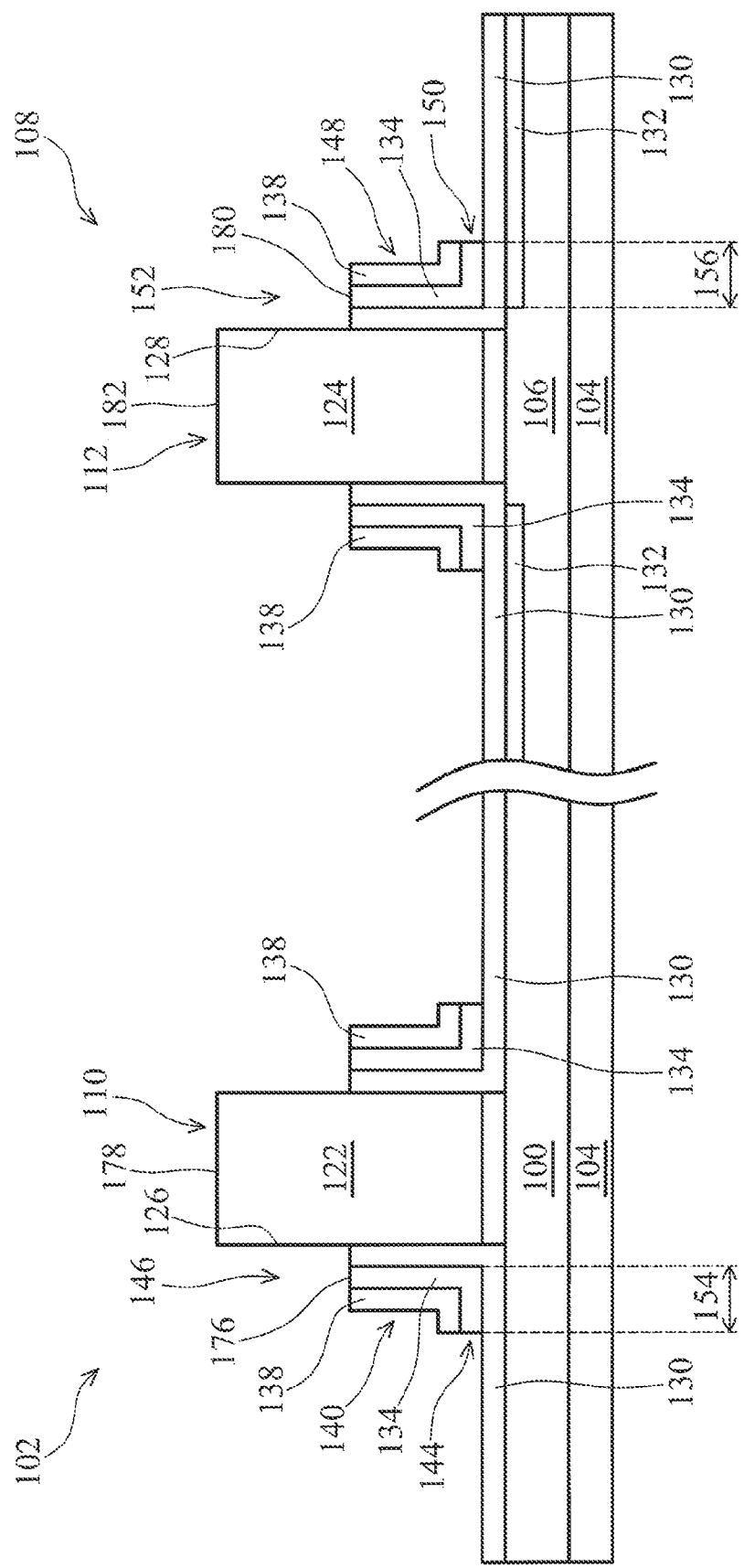
FIGS. 2A-2F show a cross-sectional view of sidewall SONOS transistors in accordance with a second embodiment of the present invention.

With reference now to FIG. 2A, portions of the first dielectric material 130, the charge-storing material 134, and the second dielectric material 138 are removed. The removal of the first dielectric material 130, the charge-storing material 134, and the second dielectric material 138 forms the array region storage structure 140 on the array region gate stack 110 and the periphery region storage structure 148 on the periphery region gate stack 112.

The array region storage structure 140 shown in FIG. 2A has a generally L-shaped cross-section. The array region storage structure 140 includes the array region storage structure horizontal portion 144 and the array region storage structure vertical portion 146. The array region storage structure horizontal portion 144 is extended adjacent to at least part of the substrate 104. The array region storage structure vertical portion 146 is extended adjacent to at least part of the array region gate stack sidewall 126. The top 176 of the array region storage structure 140 is recessed relative to the top 178 of the array region gate stack 110.

The periphery region storage structure 148 shown in FIG. 2A has a generally L-shaped cross-section and includes the periphery region storage structure horizontal portion 150 and the periphery region storage structure vertical portion 152. The periphery region storage structure horizontal portion 150 is extended adjacent to at least part of the substrate 104. The periphery region storage structure vertical portion 152 is extended adjacent to at least part of the periphery region gate stack sidewall 128. The top 180 of the periphery region storage structure 148 is recessed relative to the top 182 of the periphery region gate stack 112.

Figure 2B:
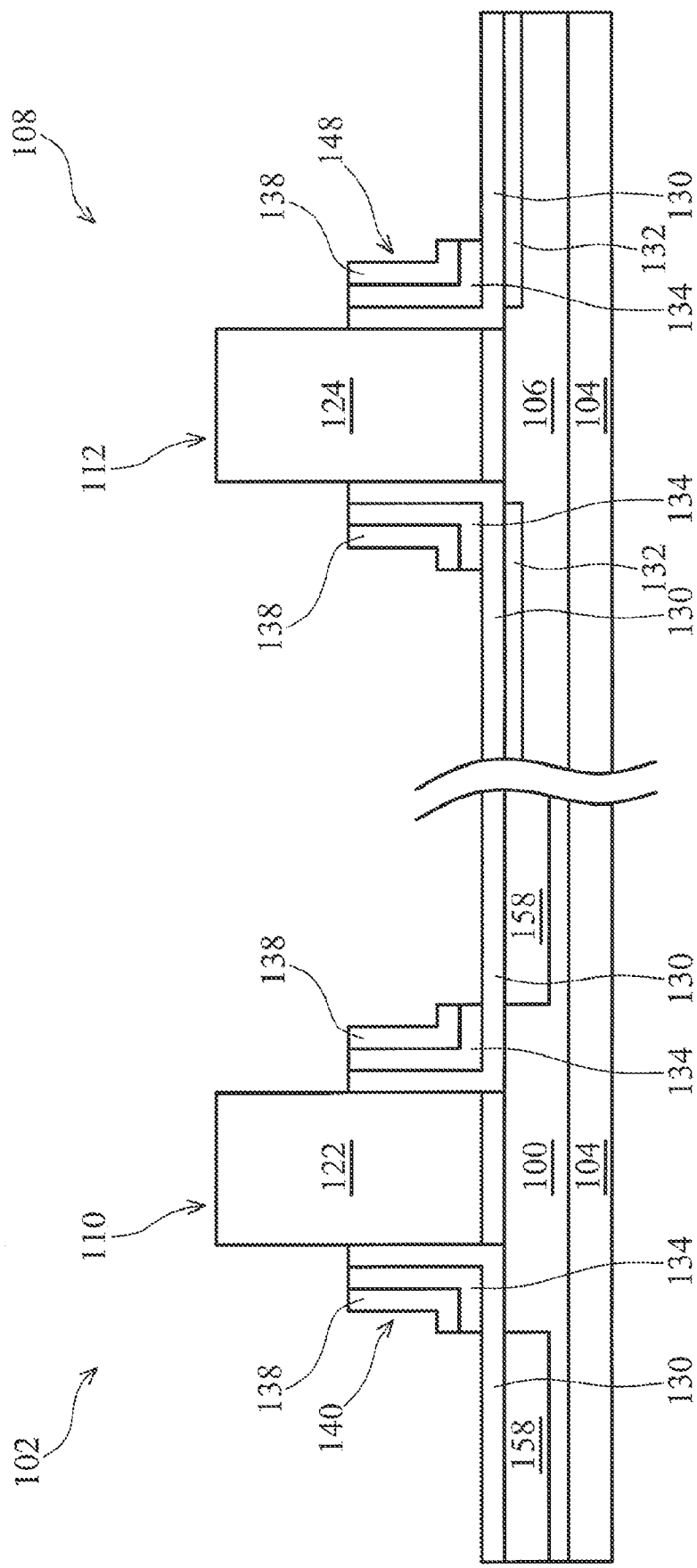
Figure 2C:
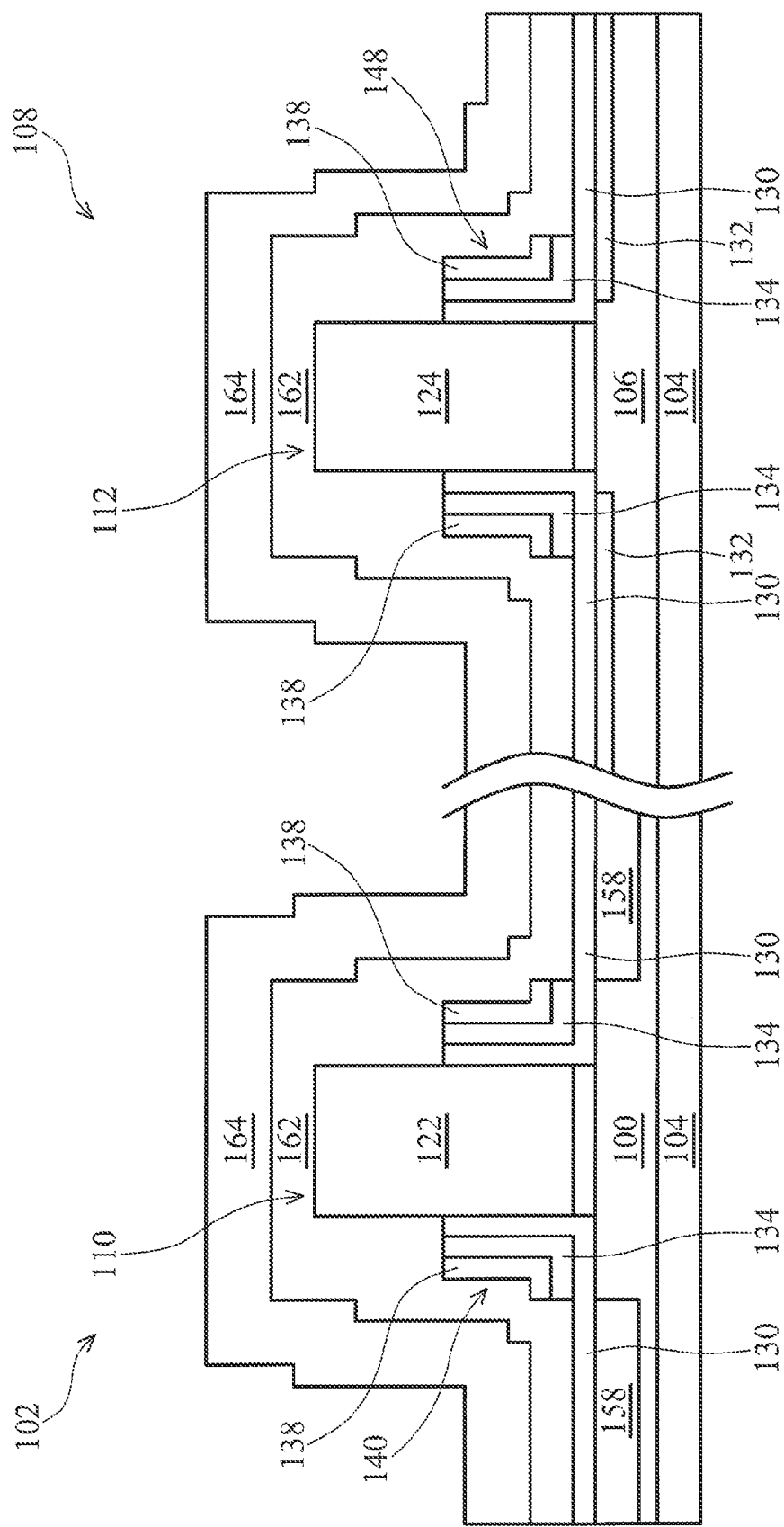

As illustrated in FIG. 2B, a first source/drain region 158 is formed in the array region well 100. In FIG. 2C, the third dielectric material 162 is deposited over the substrate 104. FIG. 2C also shows the spacer material 164 is deposited over the third dielectric material 162.

Figure 2D:
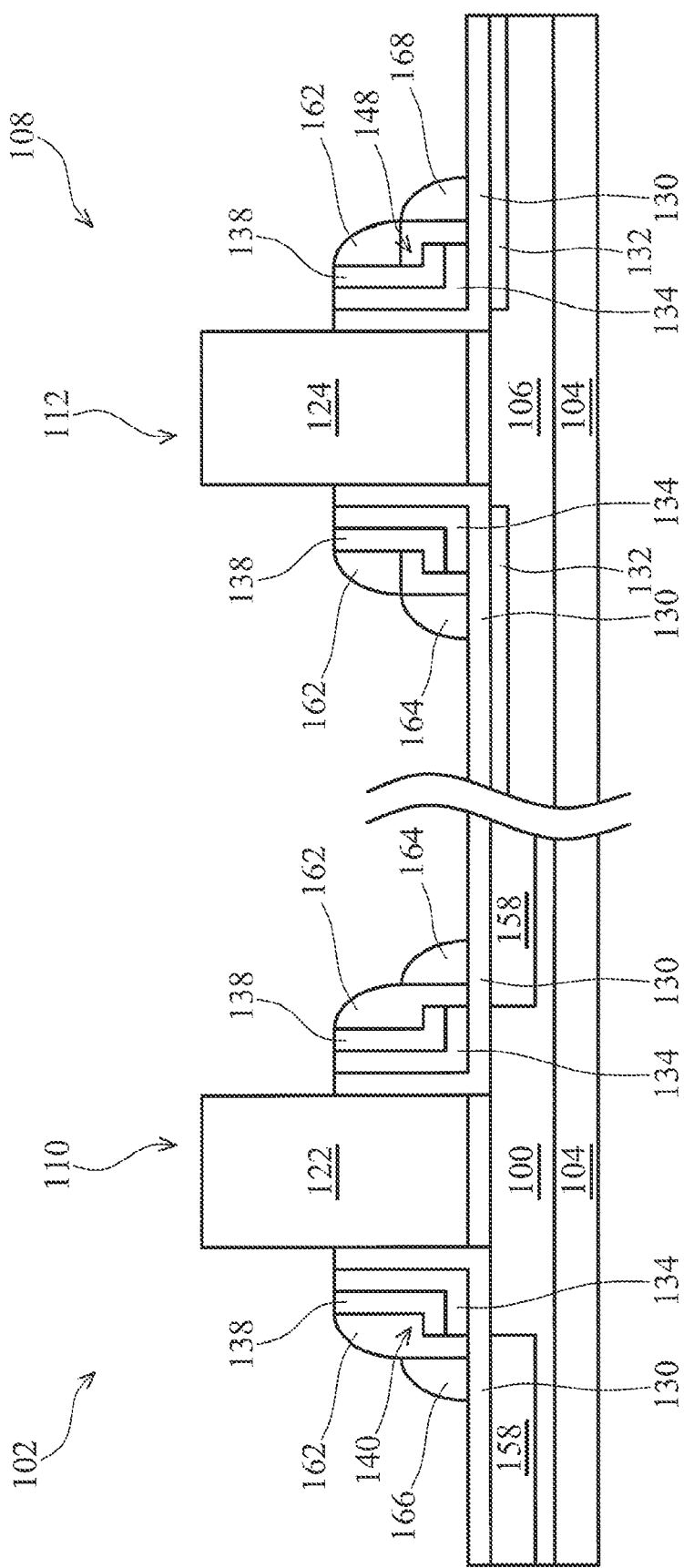
Figure 2E:
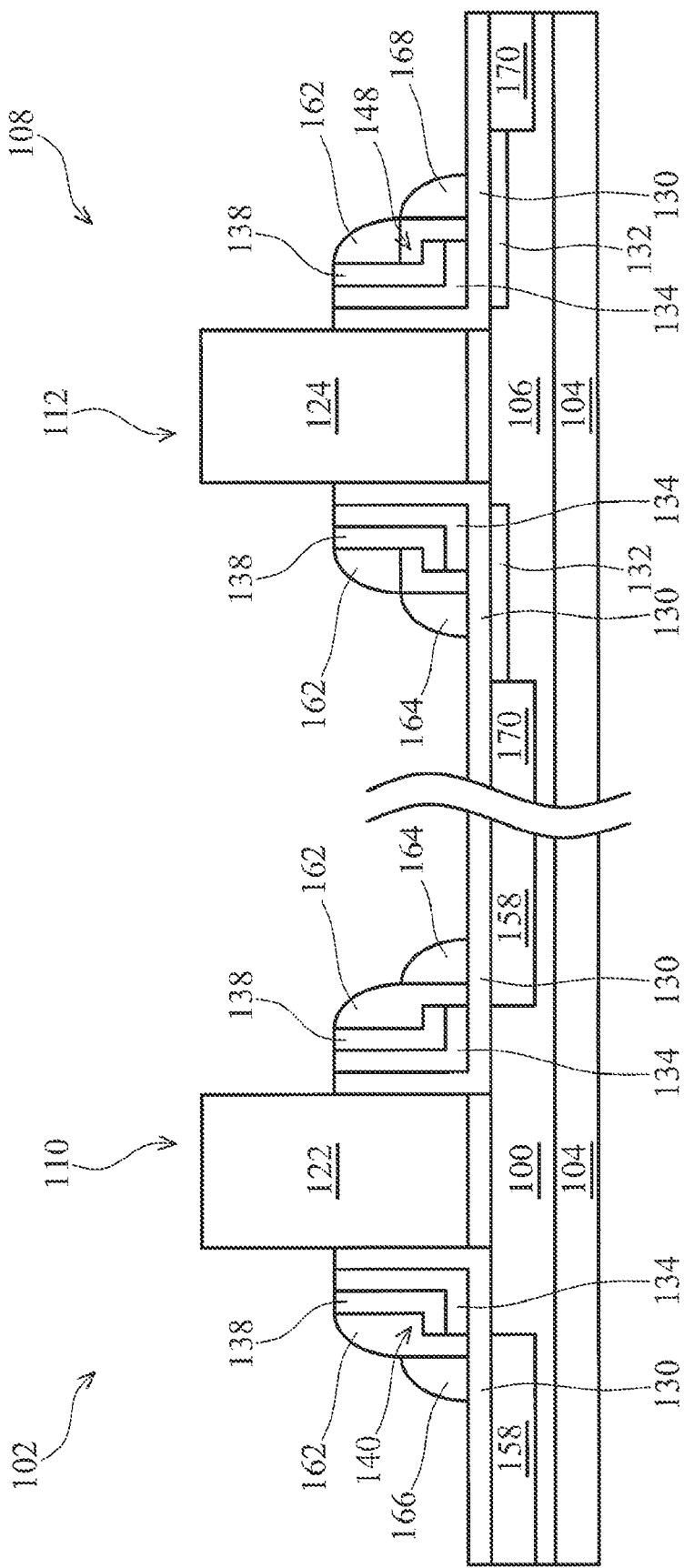

Referring now to FIG. 2D, portions of the third dielectric material 162 and the spacer material 164 are removed to form the array region spacer structure 166 separated from the array region storage structure 140 by the third dielectric material 162. The removal of portions of the third dielectric material 162 and the spacer material 164 also forms the periphery region spacer structure 168 separated from the periphery region storage structure 148 by the third dielectric material 162. FIG. 2E shows the second source/drain region 170 formed in the periphery region well 106.

Figure 2F:
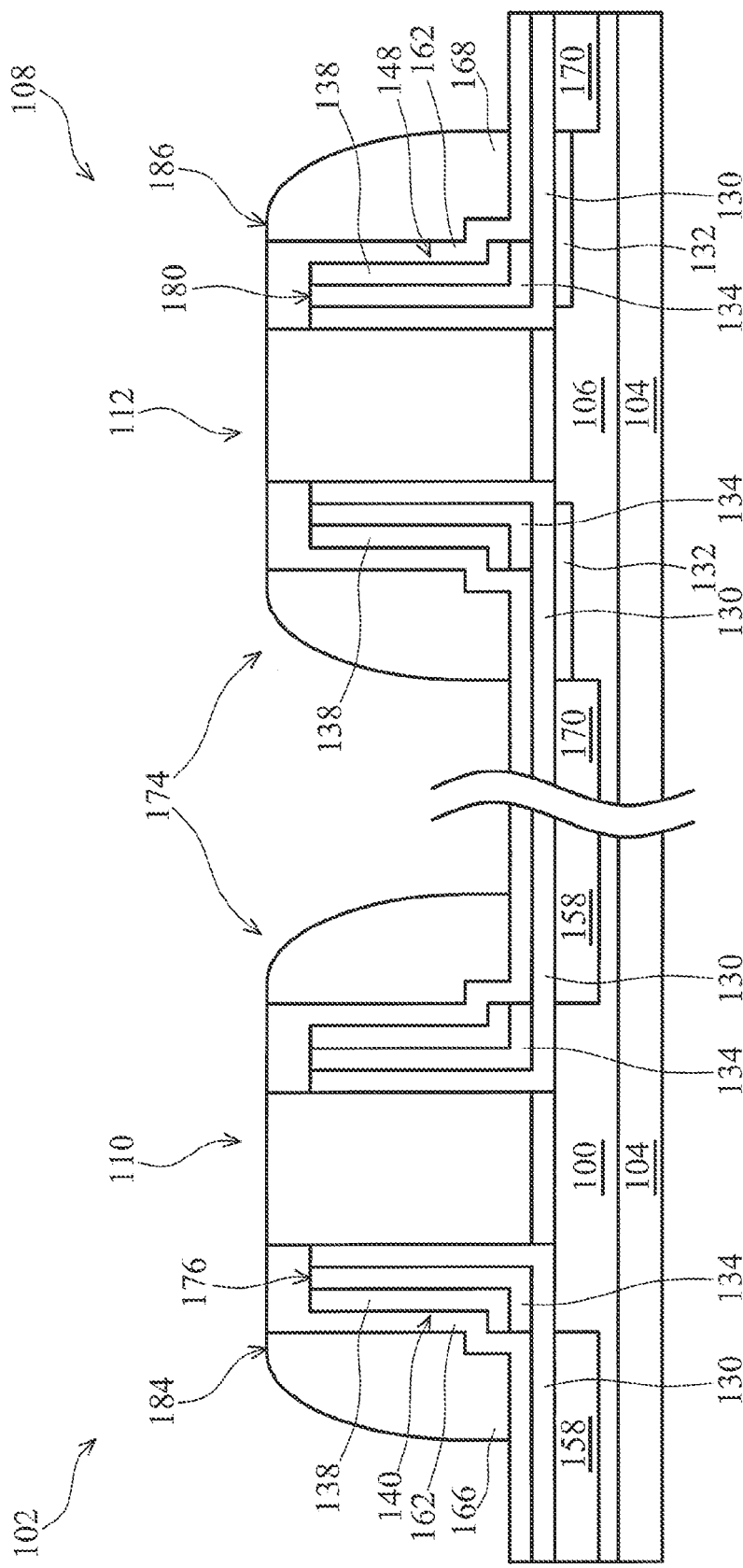

In another embodiment of the present invention shown in FIG. 2F, the third dielectric material 162 separates the array region spacer structure 166 and the periphery region spacer structure 168 from the substrate 104. The top 176 of the array region storage structure 140 is shown recessed relative to the top 184 of the array region spacer structure 166. The top 180 of the periphery region storage structure 148 is shown recessed relative to the top 186 of the periphery region spacer structure 168.

In the embodiment shown in FIG. 2F, the charge-storing material 134 in both the array region 102 and the periphery region 108 is enclosed in an oxide material 174. The oxide material 174 of the second illustrative embodiment includes the first dielectric material 130, the second dielectric material 138, and the third dielectric material 162.

Generally, the third embodiment of the present invention provides yet another method of manufacturing a semiconductor chip. FIGS. 3A-3H are cross-sectional views of sidewall SONOS transistors in the semiconductor chip of the third embodiment.

Figure 3A:
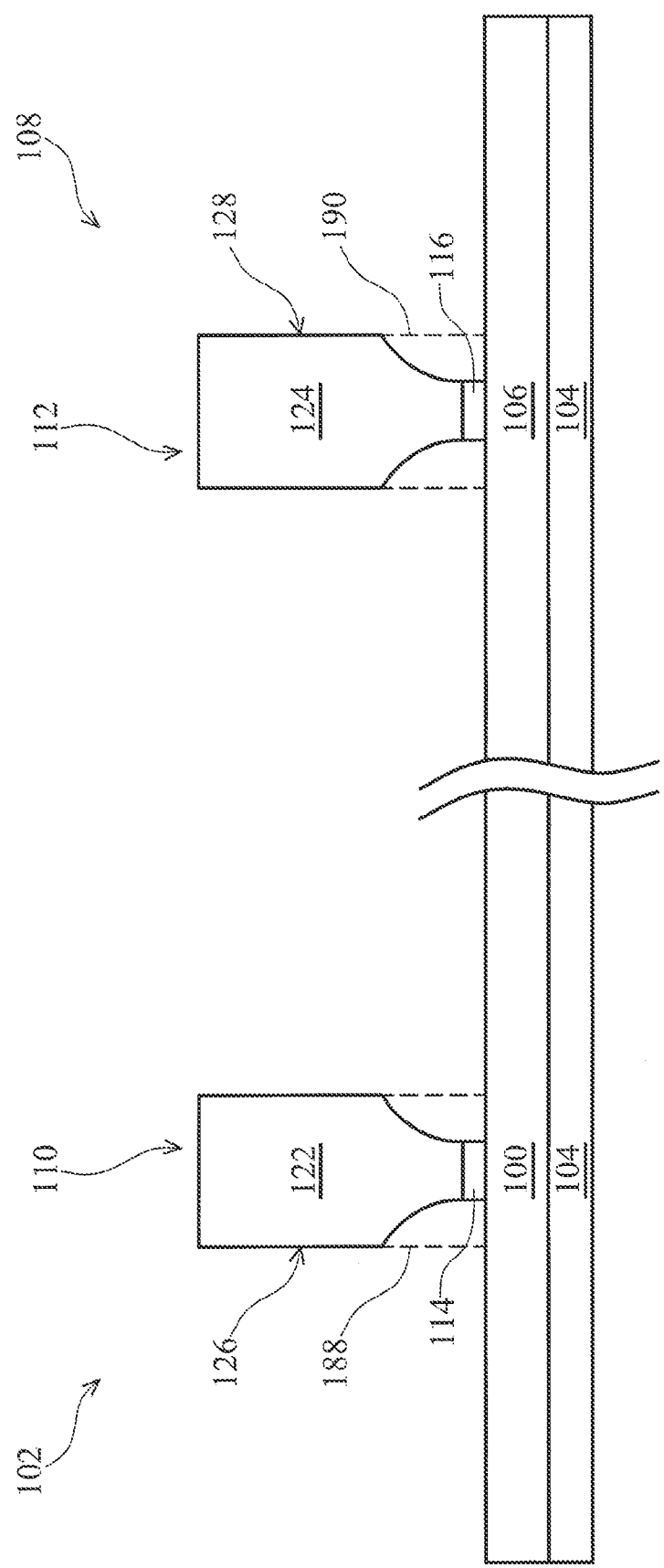

With reference now to FIG. 3A, the array region well 100 is formed in the array region 102 of the substrate 104 and the periphery region well 106 is formed in the periphery region 108 of the substrate 104. The array region gate stack 110 is formed on the array region 102 of the substrate 104 and the periphery region gate stack 112 is formed on the periphery region 108 of the substrate 104. The array region gate stack 110 has the array region gate stack sidewall 126 and the periphery region gate stack 112 and the periphery region gate stack sidewall 128. The array region gate stack sidewall recess 188 is formed in the lower portion of the array region gate stack sidewall 126. The periphery region gate stack sidewall recess 190 is formed in the lower portion of the periphery region gate stack sidewall 128.

Figure 3B:
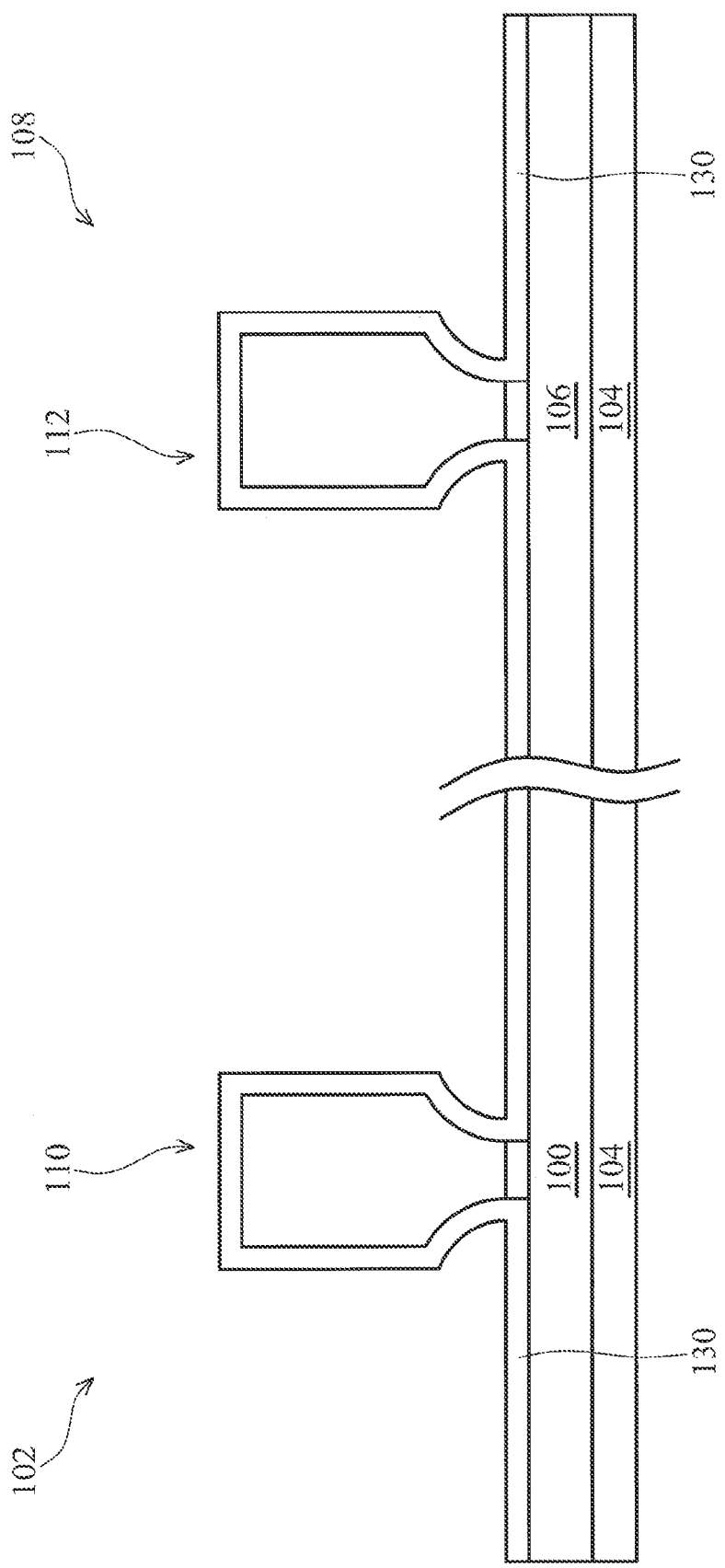
Figure 3C:
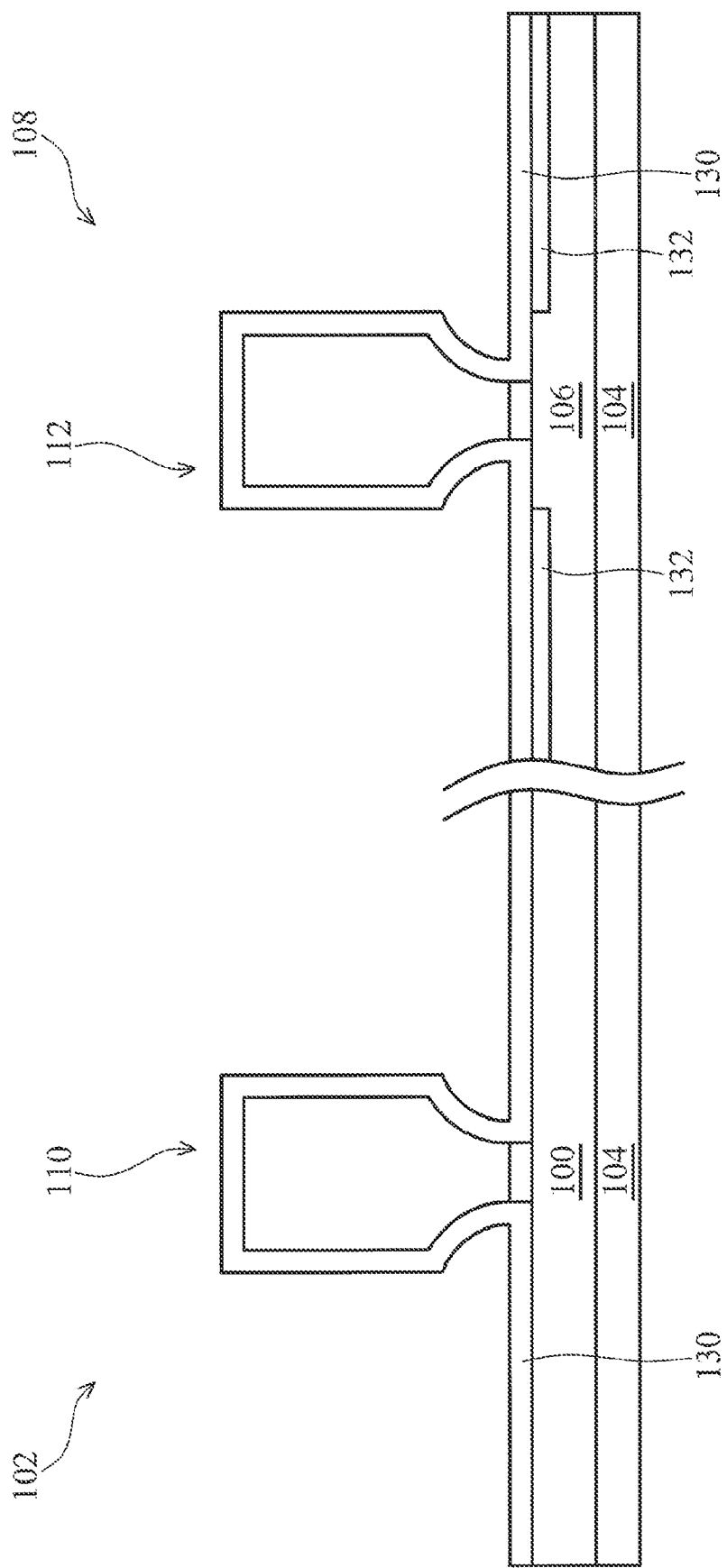
Figure 3D:
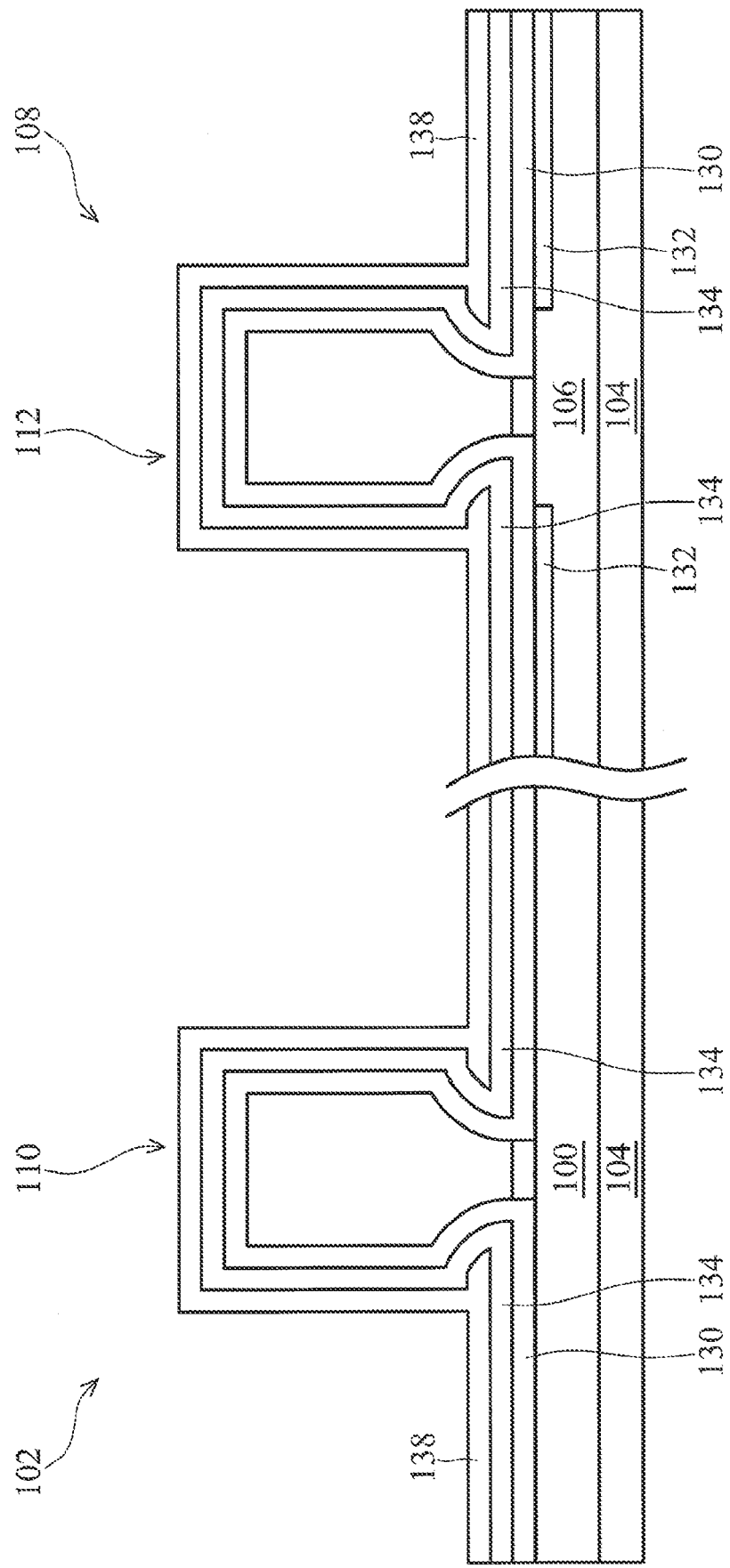

A number of steps in the method of the third embodiment are shown in FIGS. 3B-3D. In FIG. 3B, the first dielectric material 130 is deposited over the substrate 104. FIG. 3C shows the lightly doped drain region 132 having been formed in the periphery region well 106. In FIG. 3D, the charge-storing material 134 is formed over the first dielectric material 130, and the second dielectric material 138 is formed over the charge-storing material 134.

Figure 3E:
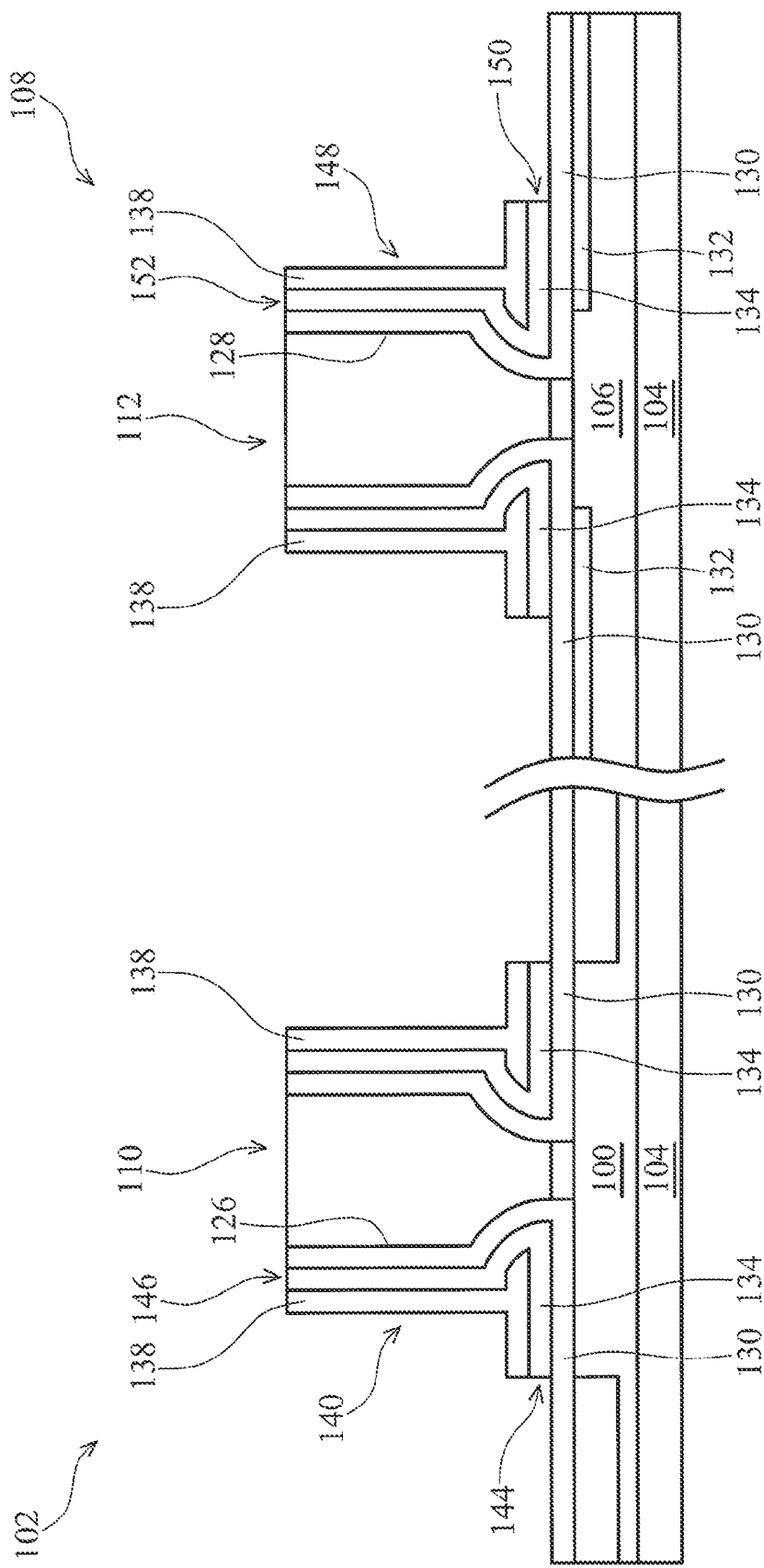
Figure 3F:
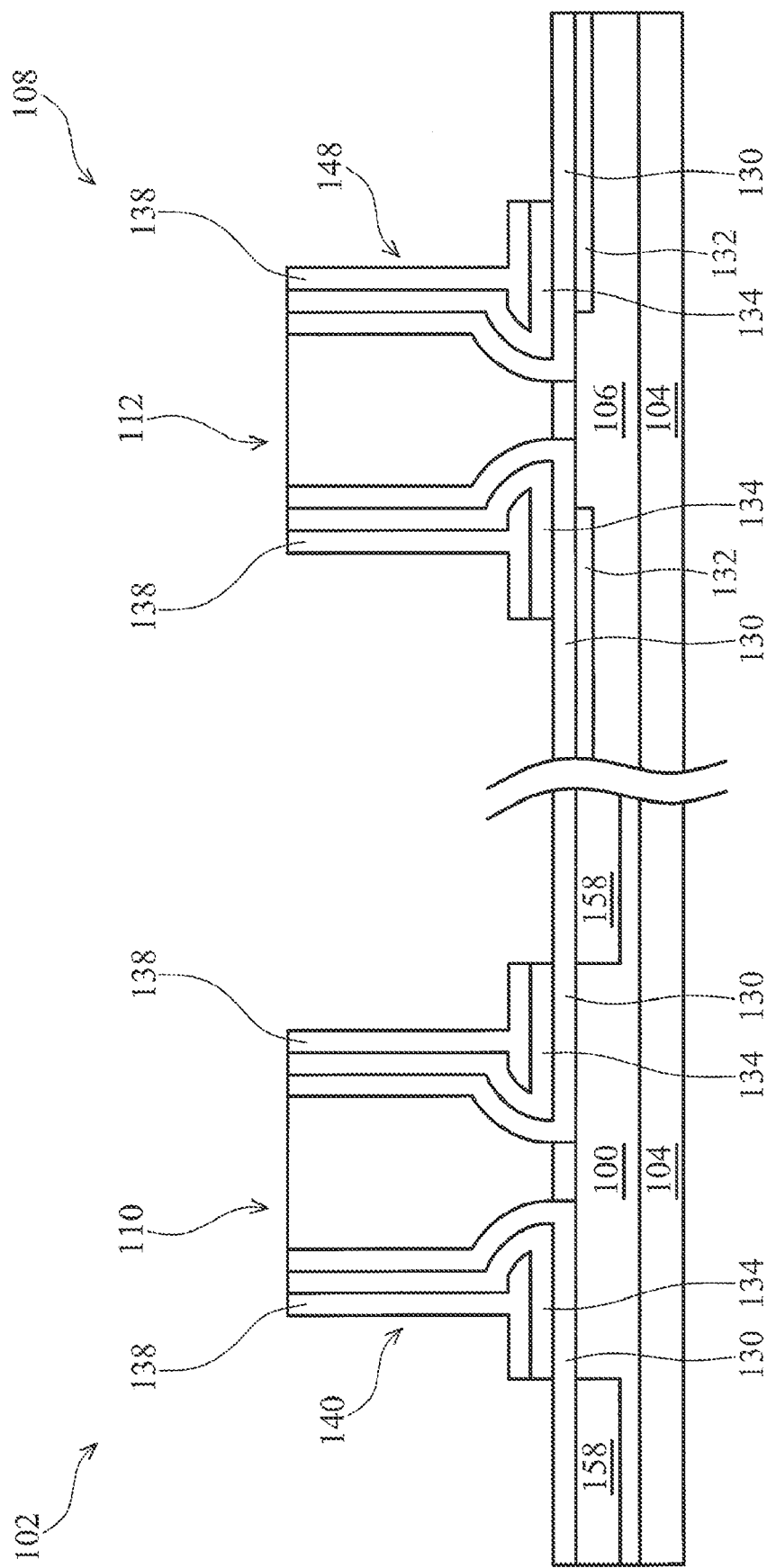

As shown in FIG. 3E, portions of the first dielectric material 130, the charge-storing material 134, and the second dielectric material 138 are removed. The removal of the first dielectric material 130, the charge-storing material 134, and the second dielectric material 138 forms the array region storage structure 140 on the array region gate stack 110 and the periphery region storage structure 148 on the periphery region gate stack 112.

The array region storage structure 140 in FIG. 3E has a generally L-shaped cross-section. The generally L-shaped array region storage structure 140 includes the array region storage structure horizontal portion 144 and the array region storage structure vertical portion 146. The array region storage structure horizontal portion 144 is extended adjacent to at least part of the substrate 104. The array region storage structure vertical portion 146 is extended adjacent to at least part of the array region gate stack sidewall 126.

The periphery region storage structure 148 in FIG. 3E also has a generally L-shaped cross-section. The generally L-shaped periphery region storage structure 148 includes the periphery region storage structure horizontal portion 150 and the periphery region storage structure vertical portion 152. The periphery region storage structure horizontal portion 150 is extended adjacent to at least part of the substrate 104. The periphery region storage structure vertical portion 152 is extended adjacent to at least part of the periphery region gate stack sidewall 128. The first source/drain region 158 is formed in the array region well 100.

Figure 3G:
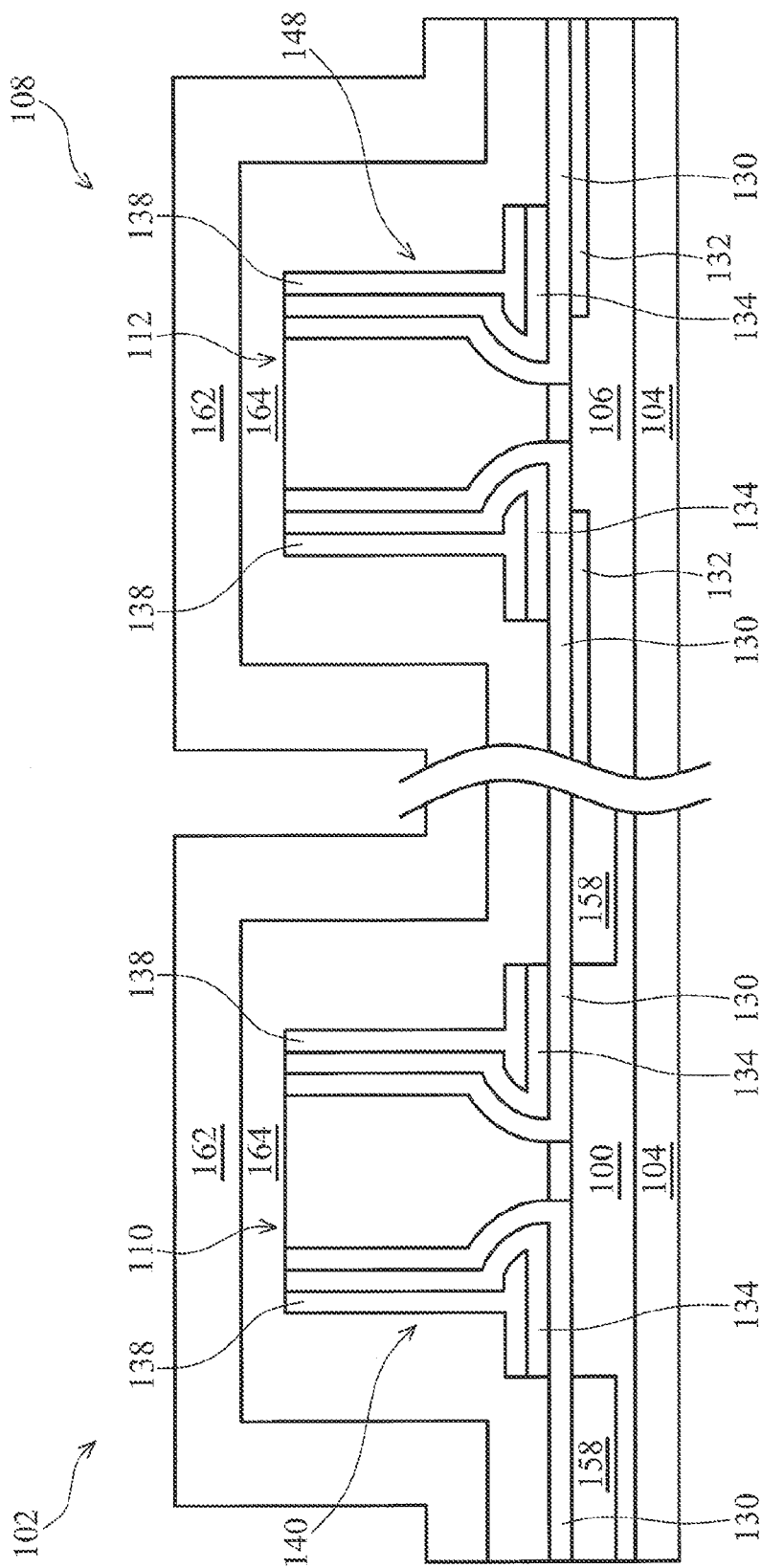

As illustrated in FIG. 3G, the third dielectric material 162 is deposited over the substrate 104. FIG. 3G also shows the spacer material 164 is deposited over the third dielectric material 162.

Figure 3H:
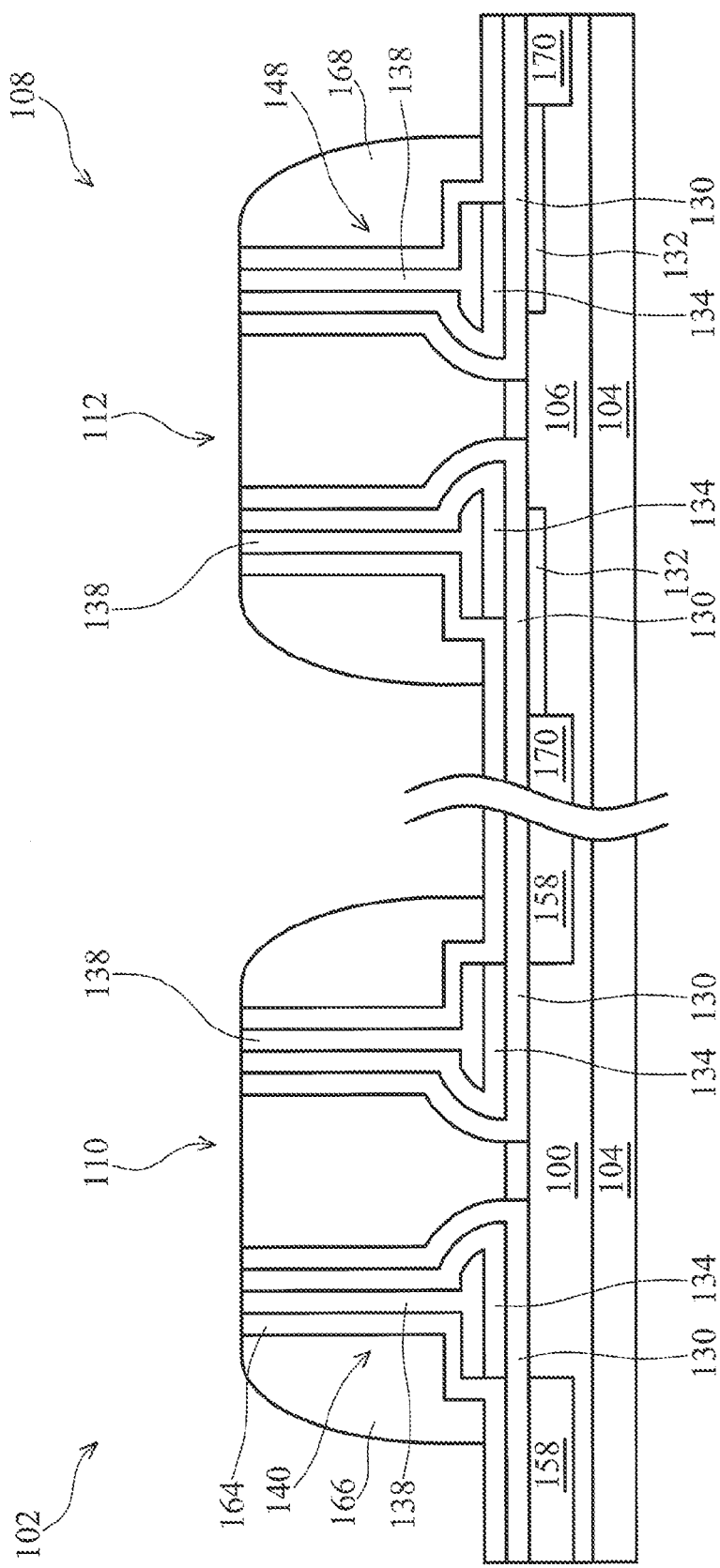
Figure 31:
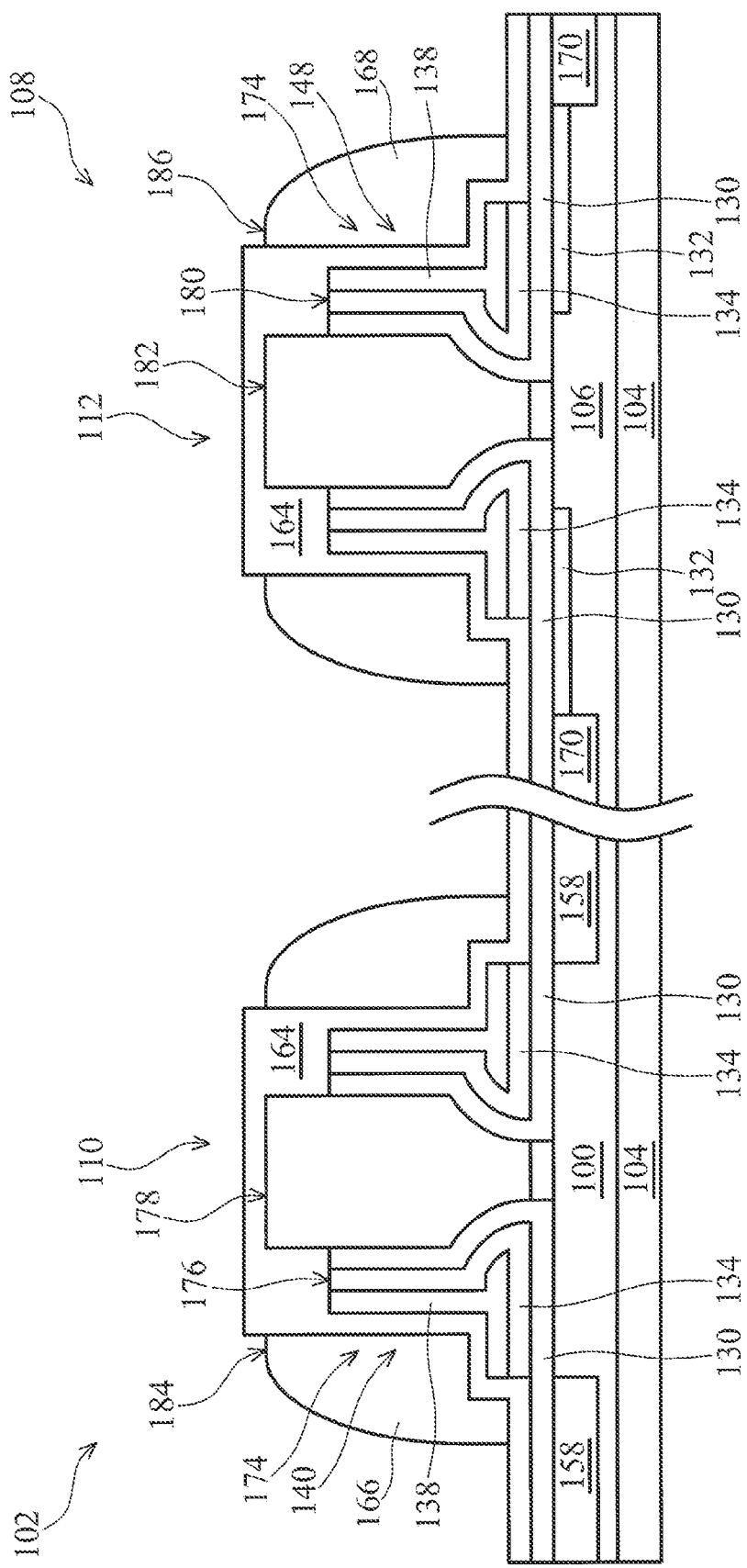

FIG. 3H shows portions of the third dielectric material 162 and the spacer material 164 are removed, thus forming the array region spacer structure 166 and the periphery region spacer structure 168. The array region spacer structure 166 is separated from the array region storage structure by the third dielectric material 162. The periphery region spacer structure 168 is separated from the periphery region storage structure 148 by the third dielectric material 162. The second source/drain region 170 is formed in the periphery region well 106.

In another embodiment of the present invention shown in FIG. 3I, the third dielectric material 162 separates the array region spacer structure 166 and the periphery region spacer structure 168 from the substrate 104. In both the array region 102 and the periphery region 108, the charge-storing material 134 is enclosed in an oxide material 174. The oxide material 174 of the third illustrative embodiment includes the first dielectric material 130, the second dielectric material 138, and the third dielectric material 162. The top 176 of the array region storage structure 140 is shown recessed relative to the top 184 of the array region spacer structure 166. The top 180 of the periphery region storage structure 148 is shown recessed relative to the top 186 of the periphery region spacer structure 168. The top 176 of the array region storage structure 140 is shown recessed relative to the top 178 of the array region gate stack 110. The top 180 of the periphery region storage structure 148 is shown recessed relative to the top 182 of the periphery region gate stack 112. The top 176 of the array region storage structure 140 is shown recessed relative to the top 184 of the array region spacer structure 166. The top 180 of the periphery region storage structure 148 is shown recessed relative to the top 186 of the periphery region spacer structure 168.

Generally, the fourth embodiment of the present invention provides still another method of manufacturing a semiconductor chip. FIGS. 4A-4J are cross-sectional views of sidewall SONOS transistors in the semiconductor chip of the fourth embodiment.

Figure 4A:
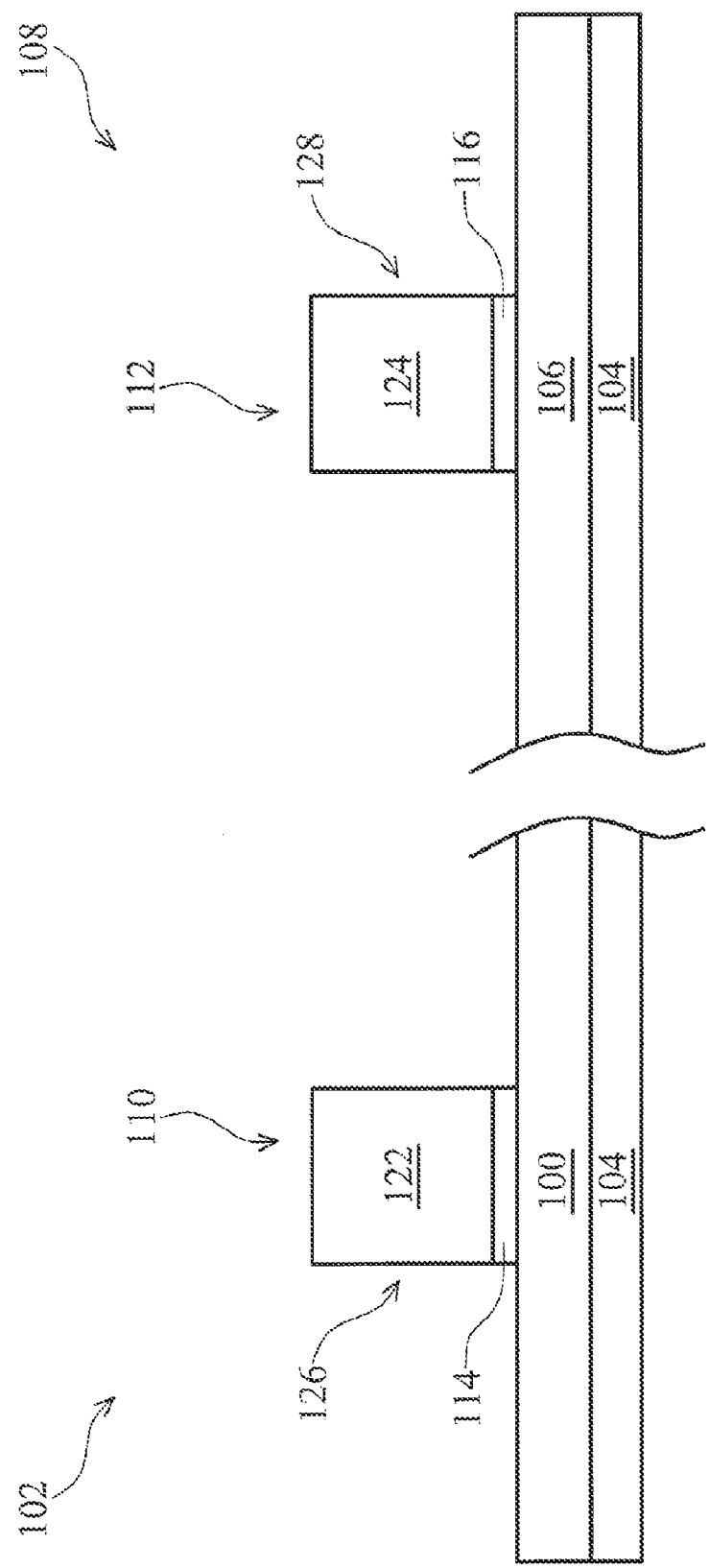
FIGS. 4A-4K show a cross-sectional view of sidewall SONOS transistors in accordance with a fourth embodiment of the present invention.

With reference now to FIG. 4A, the array region well 100 is formed in the array region 102 of the substrate 104 and the periphery region well 106 is formed in the periphery region 108 of the substrate 104. The array region gate stack 110 is formed on the array region 102 of the substrate 104 and the periphery region gate stack 112 is formed on the periphery region 108 of the substrate 104. The array region gate stack 110 has the array region gate stack sidewall 126 and the periphery region gate stack 112 and the periphery region gate stack sidewall 128.

Figure 4B:
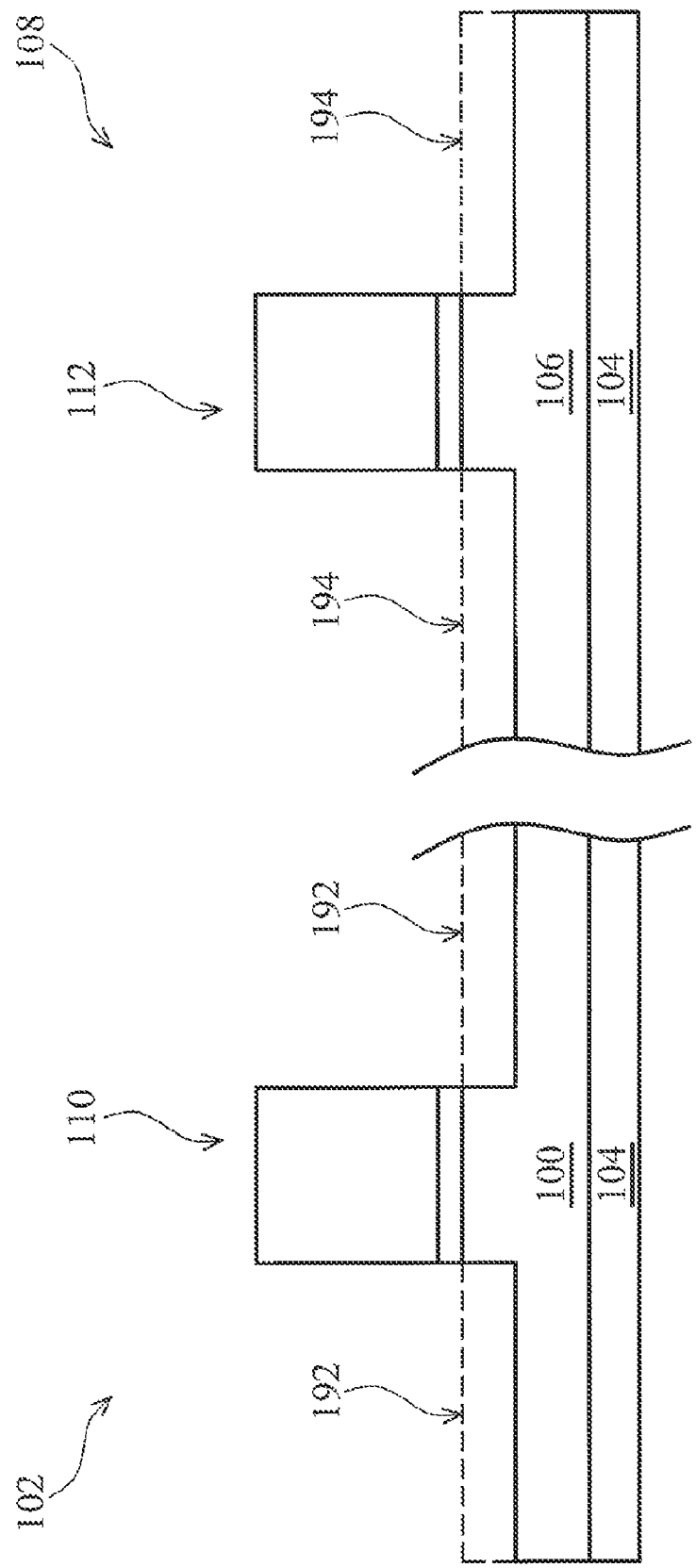

As illustrated in FIG. 4B, the array region substrate recess 192 is formed in the substrate 104 adjacent to the array region gate stack 110. The periphery region substrate recess 194 is formed in the substrate 104 adjacent to the periphery region gate stack 112. In another embodiment, a recess may be formed in the substrate 104 of at least one of either the array region 102 or the periphery region 108. The recesses 192, 194 are adjacent to but not underlying the array region gate stack 110 and the periphery region gate stack 112. The outlines of the array region substrate recess 192 and the periphery region substrate recess 194 are shown in FIG. 4B with dashed lines. The substrate recesses 192 and 194 may have the same depth or they may have different depths. Preferably, the substrate recesses 192 and 194 have a depth between about 50 angstroms and about 300 angstroms. However, the invention is not so limited, and the recess depths of the substrate recesses 192 and 194 may be between about 10 angstroms and about 500 angstroms.

Figure 4C:
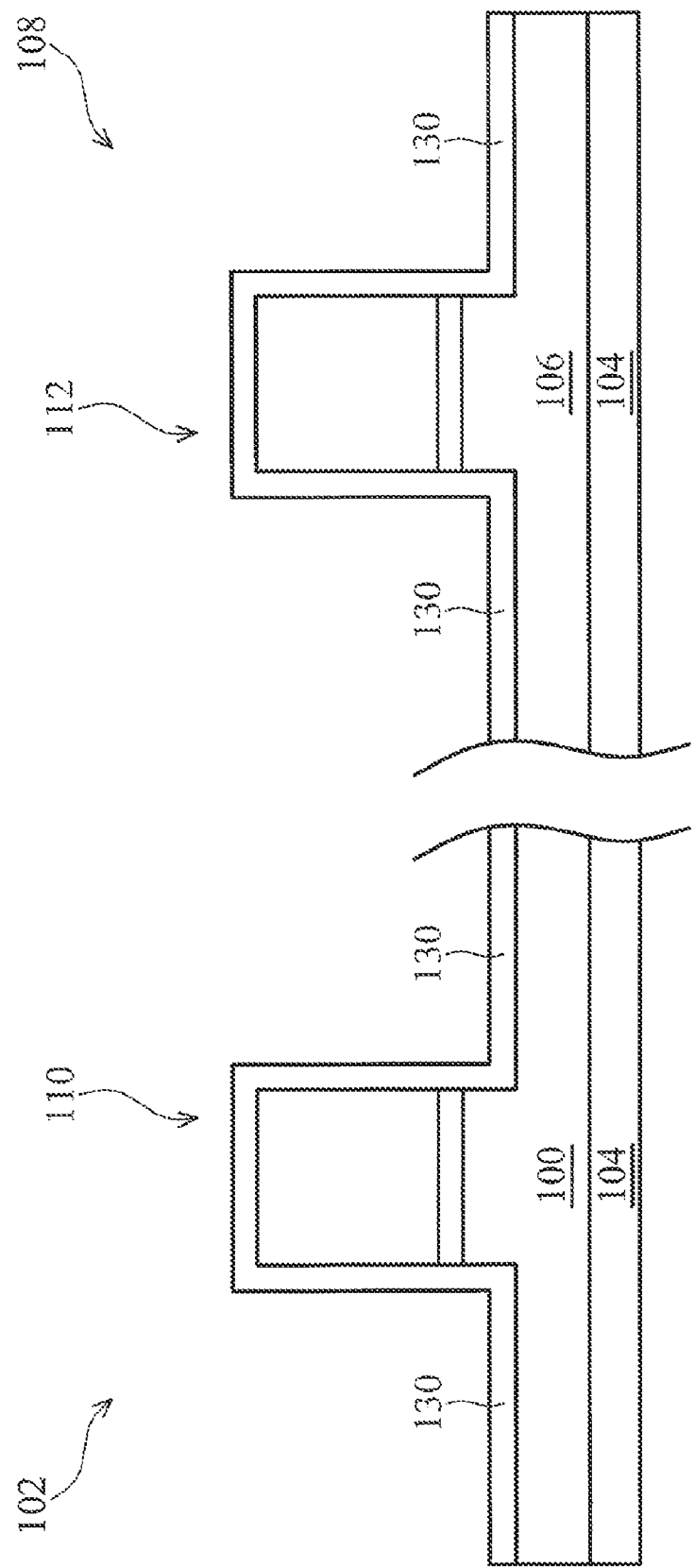
Figure 4D:
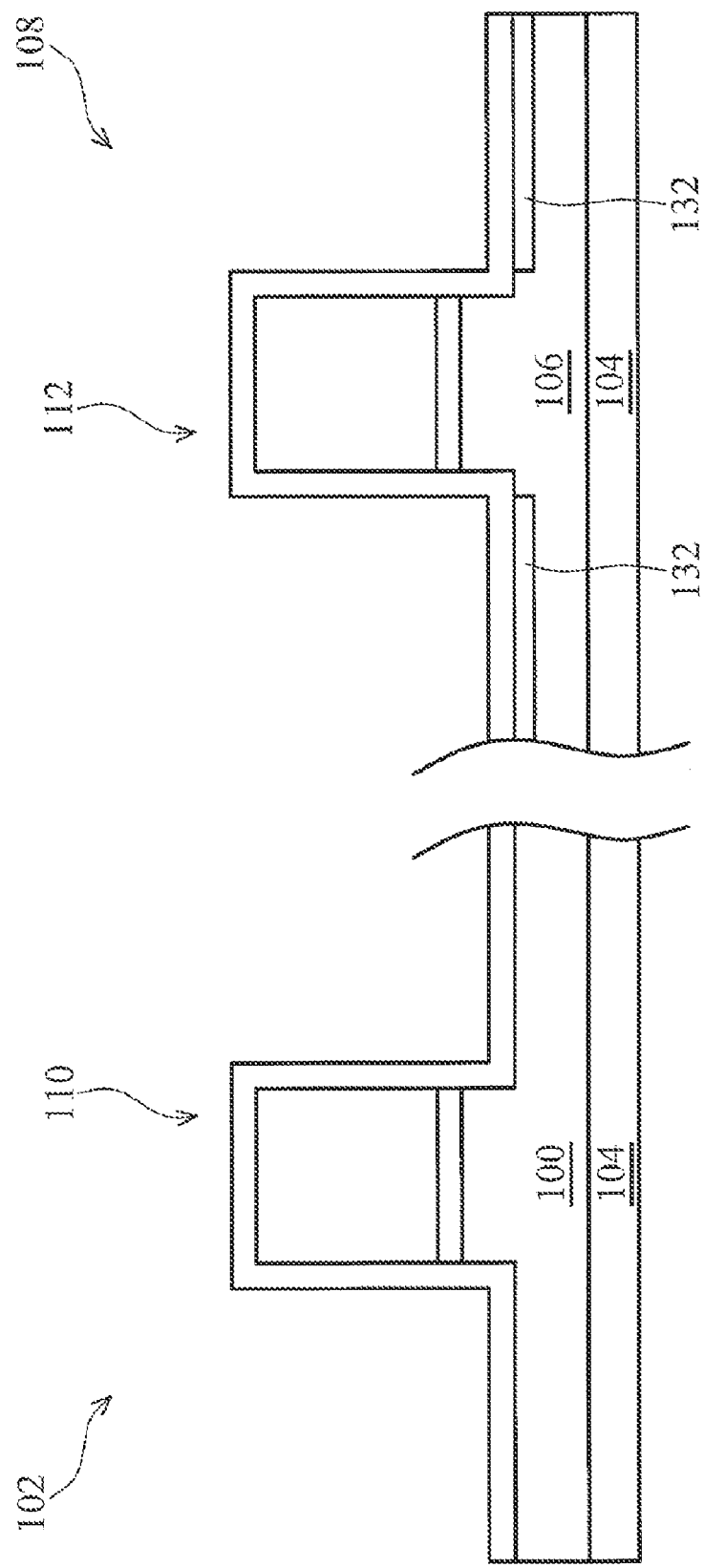
Figure 4E:
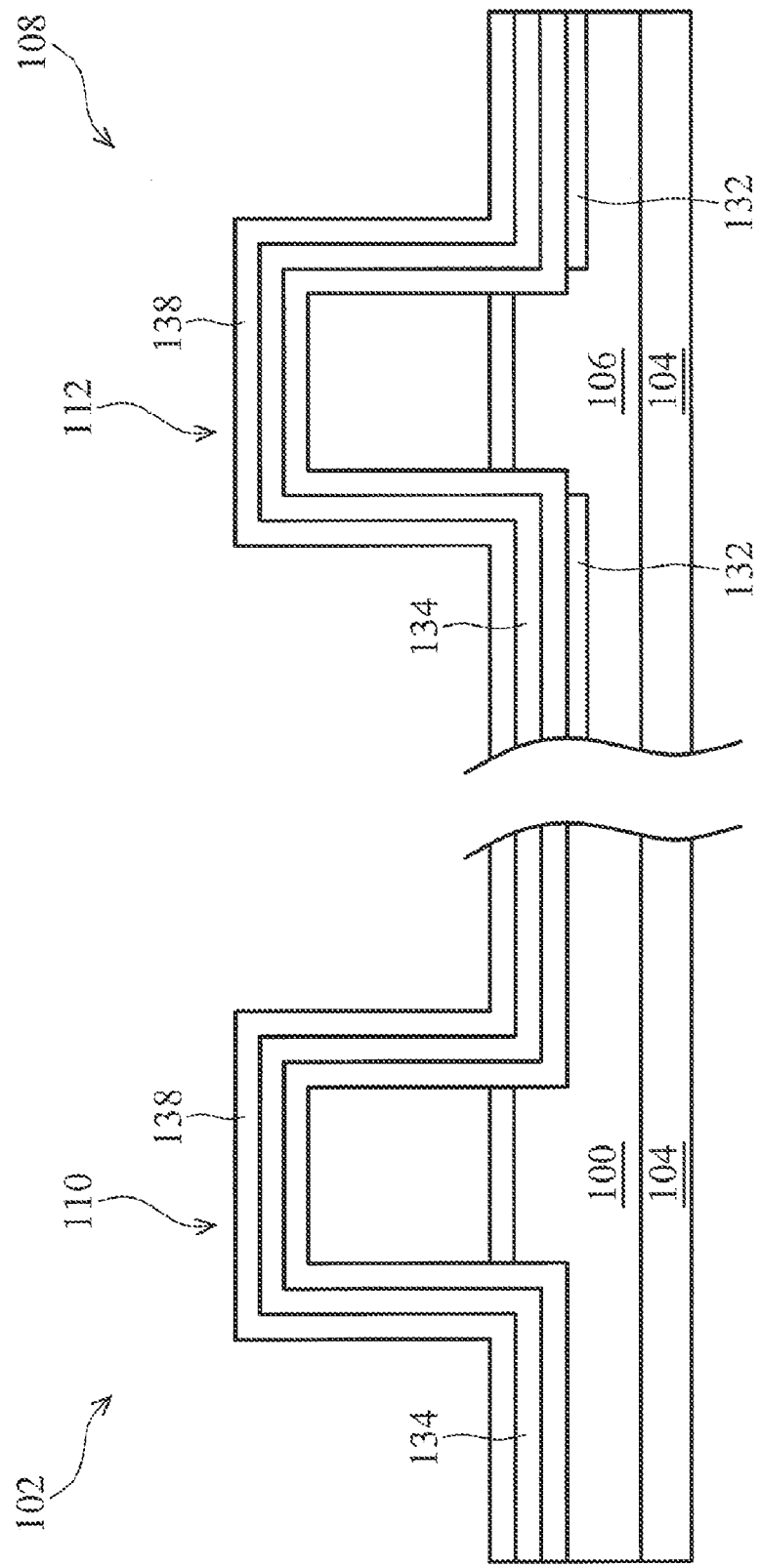

Several steps in the method of the fourth embodiment are shown in FIGS. 4C-4E. In FIG. 4C, the first dielectric material 130 is deposited over the substrate 104. In FIG. 4D, the lightly doped drain region 132 is formed in the periphery region well 106. In FIG. 4E, the charge-storing material 134 is formed over the first dielectric material 130 and the second dielectric material 138 is formed over the charge-storing material 134.

Figure 4F:
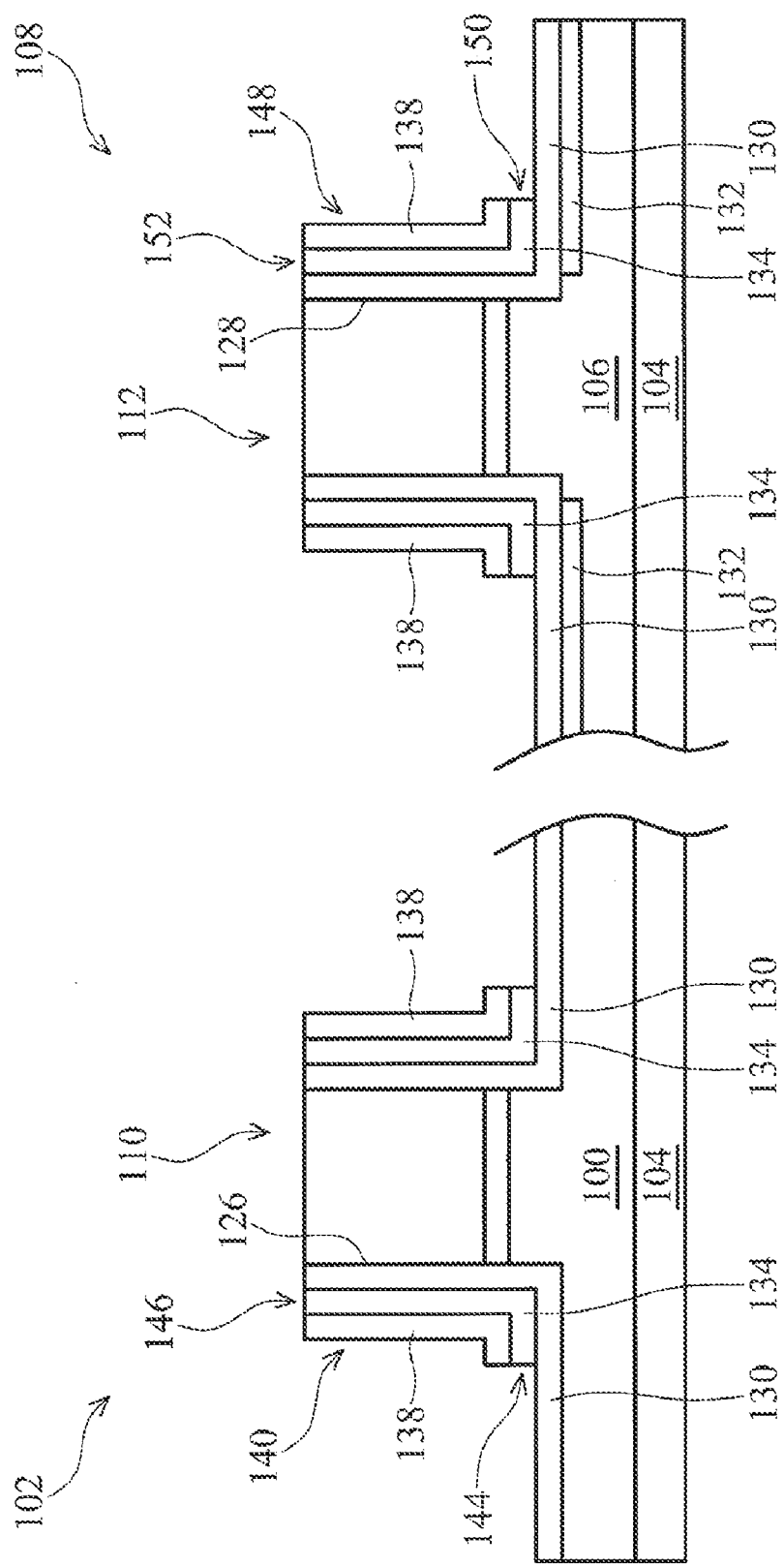

As shown in FIG. 4F, portions of the first dielectric material 130, the charge-storing material 134, and the second dielectric material 138 are removed. The removal of the first dielectric material 130, the charge-storing material 134, and the second dielectric material 138 form the array region storage structure 140 on the array region gate stack 110 and the periphery region storage structure 148 on the periphery region gate stack 112.

The array region storage structure 140 in FIG. 4F has a generally L-shaped cross-section. The array region storage structure 140 includes the array region storage structure horizontal portion 144 and the array region storage structure vertical portion 146. The array region storage structure horizontal portion 144 is extended adjacent to at least part of the substrate 104. The array region storage structure vertical portion 146 is extended adjacent to at least part of the array region gate stack sidewall 126.

The periphery region storage structure 148 in FIG. 4F includes the periphery region storage structure horizontal portion 150 and the periphery region storage structure vertical portion 152. The periphery region storage structure horizontal portion 150 is extended adjacent to at least part of the substrate 104. The periphery region storage structure vertical portion 152 is extended adjacent to at least part of the periphery region gate stack sidewall 128.

Figure 4G:
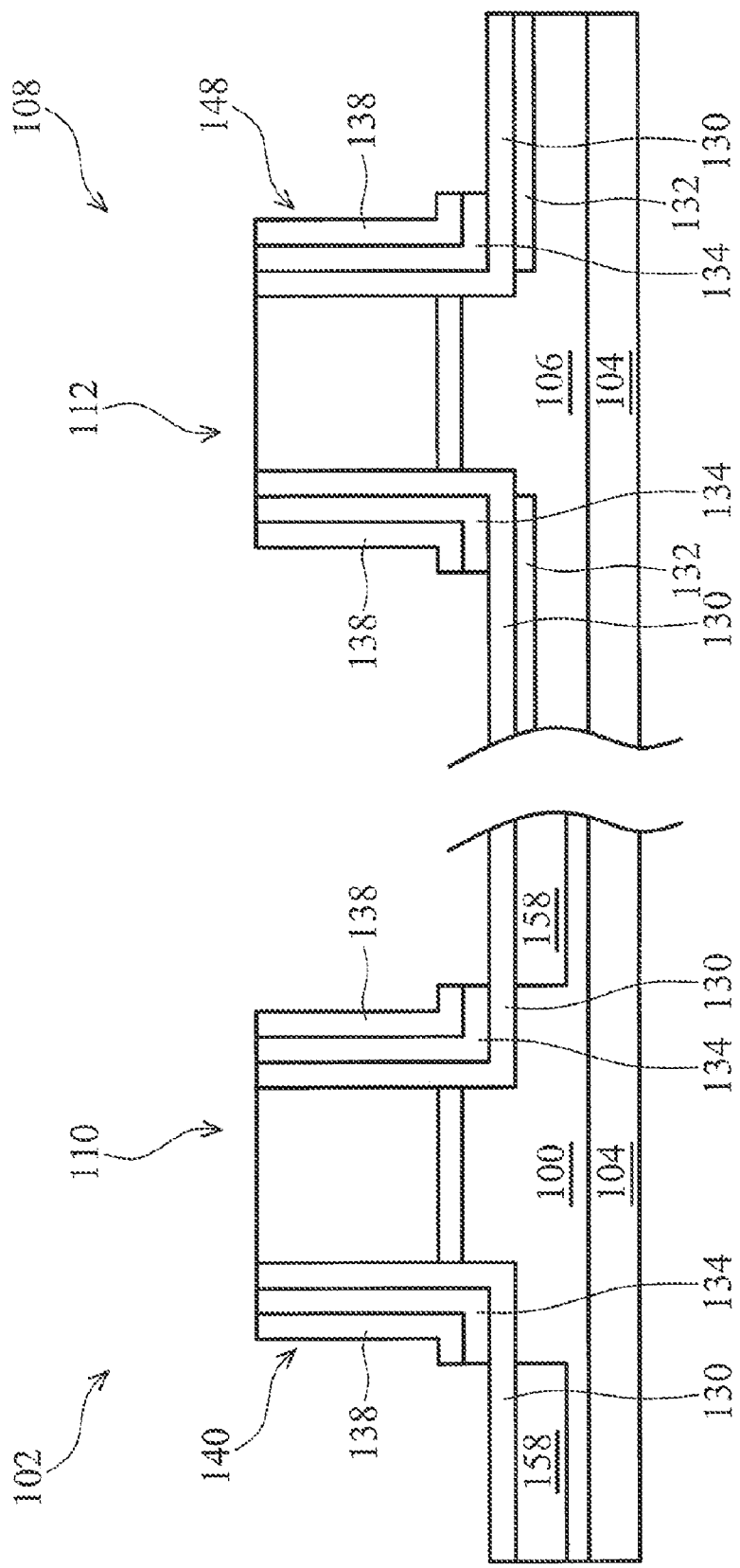
Figure 4H:
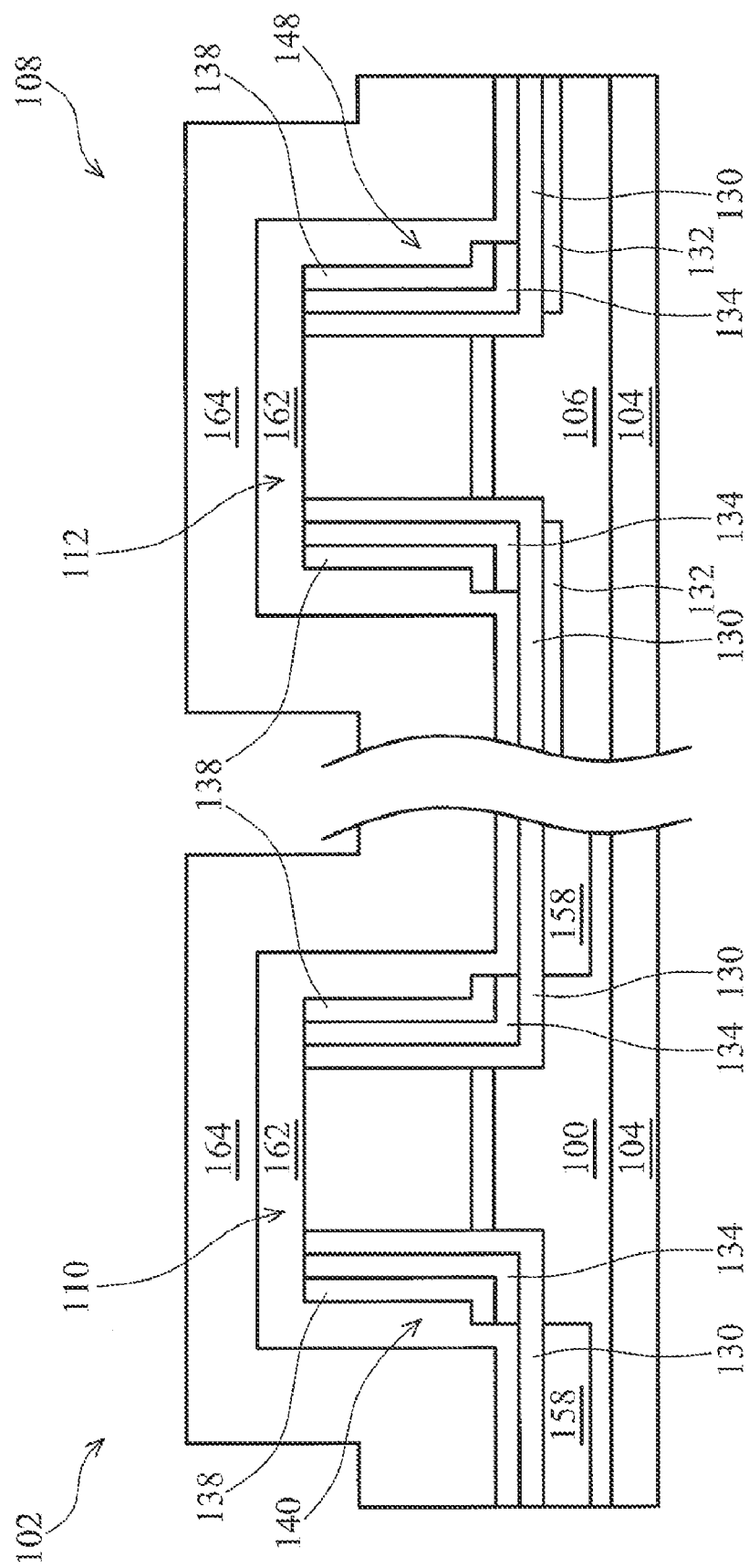

FIGS. 4G and 4H illustrate more steps in accordance with the fourth embodiment of the present invention. FIG. 4G shows the first source/drain region 158 formed in the array region well 100. In FIG. 4H, the third dielectric material 162 is deposited over the substrate 104. The spacer material 164 is deposited over the third dielectric material 162.

Figure 4I:
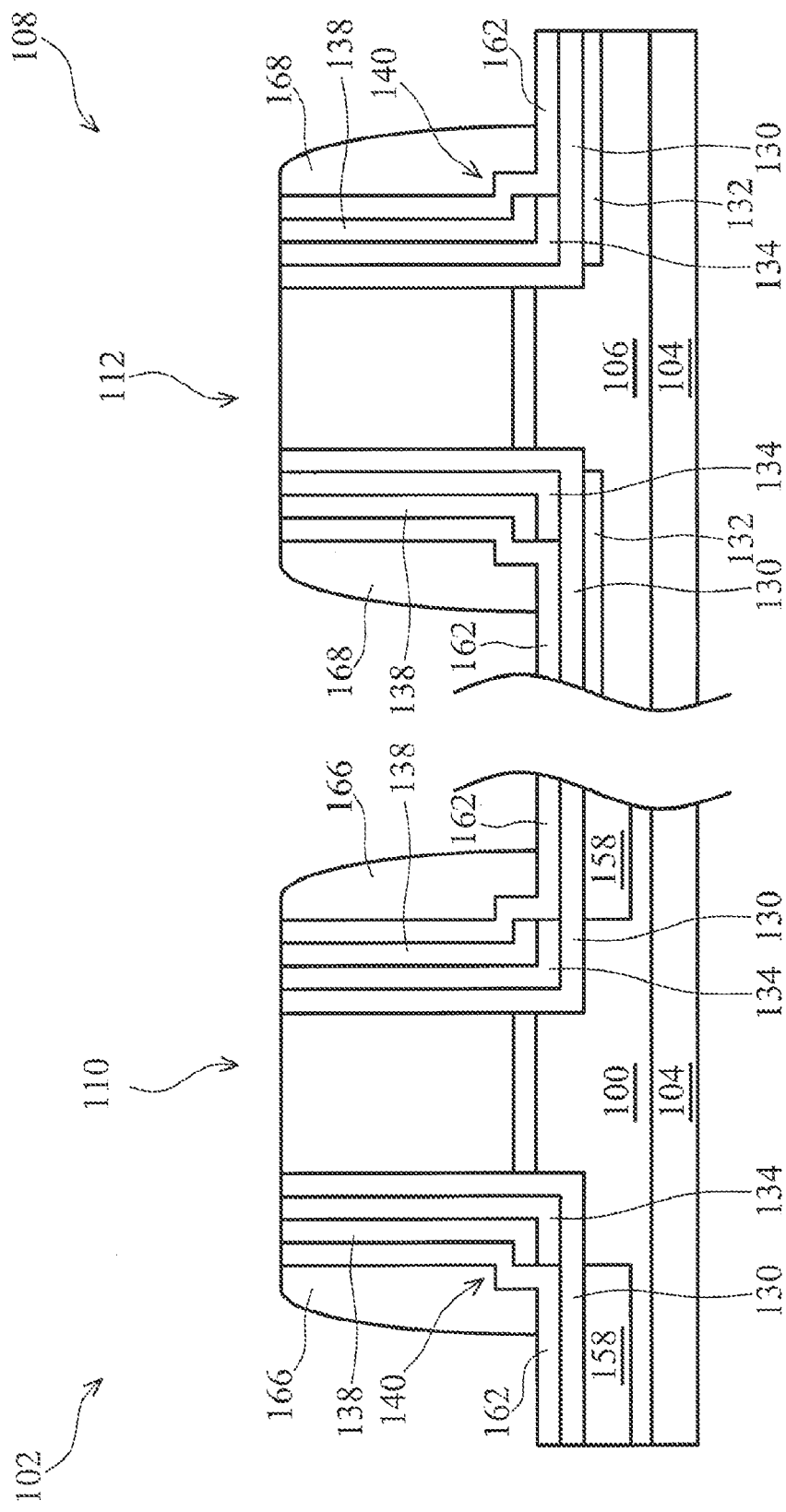

In FIG. 4I, portions of the third dielectric material 162 and the spacer material 164 are removed, thus forming the array region spacer structure 166 and the periphery region spacer structure 168. The array region spacer structure 166 is separated from the array region storage structure 140 by the third dielectric material 162. The periphery region spacer structure 168 is separated from the periphery region storage structure 148 by the third dielectric material 162.

Figure 4J:
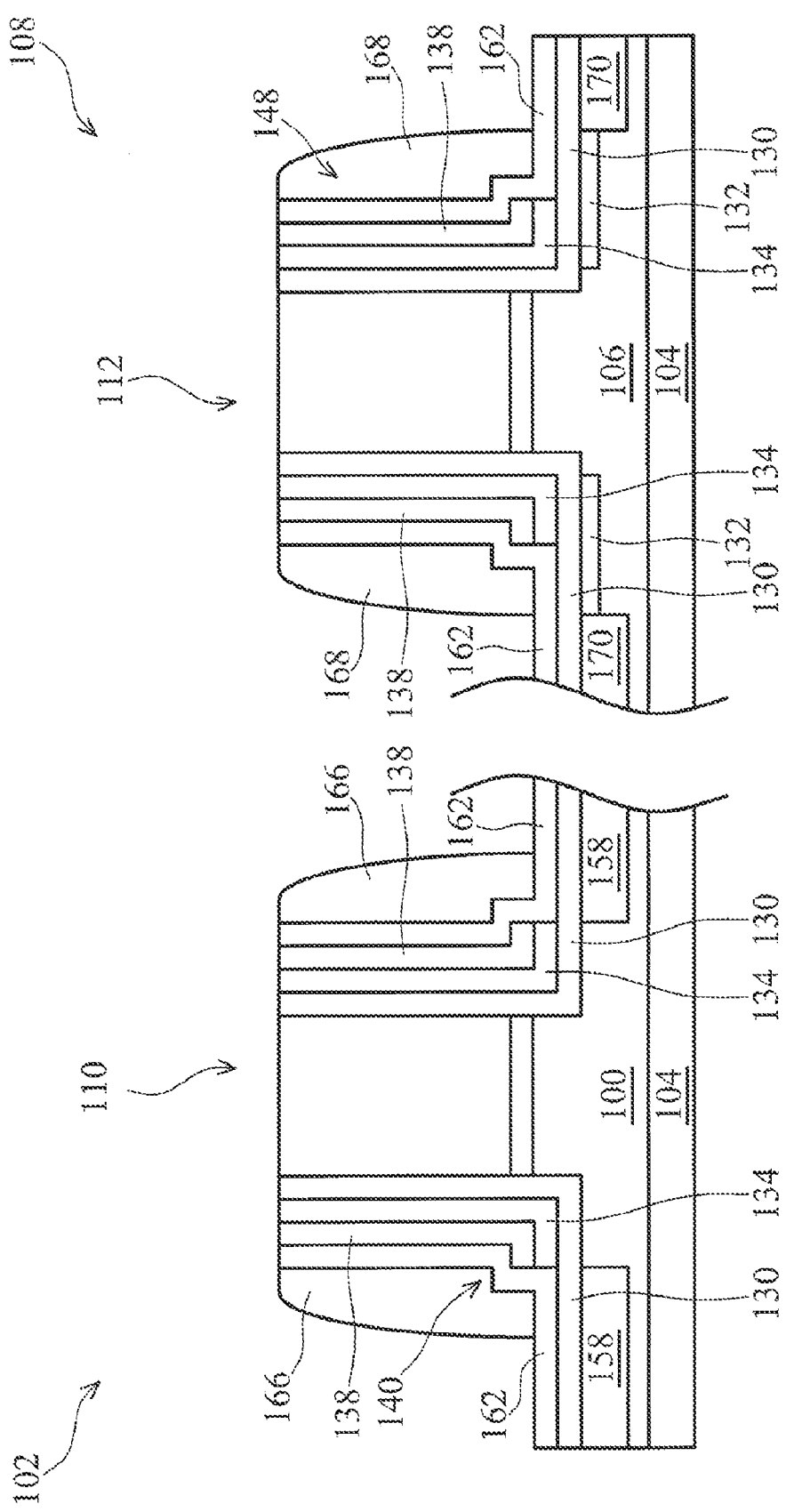

In FIG. 4J, the second source/drain region 170 is formed in the periphery region well 106. The second source/drain region 170 is substantially aligned with the periphery region spacer structure 168.

Figure 4K:
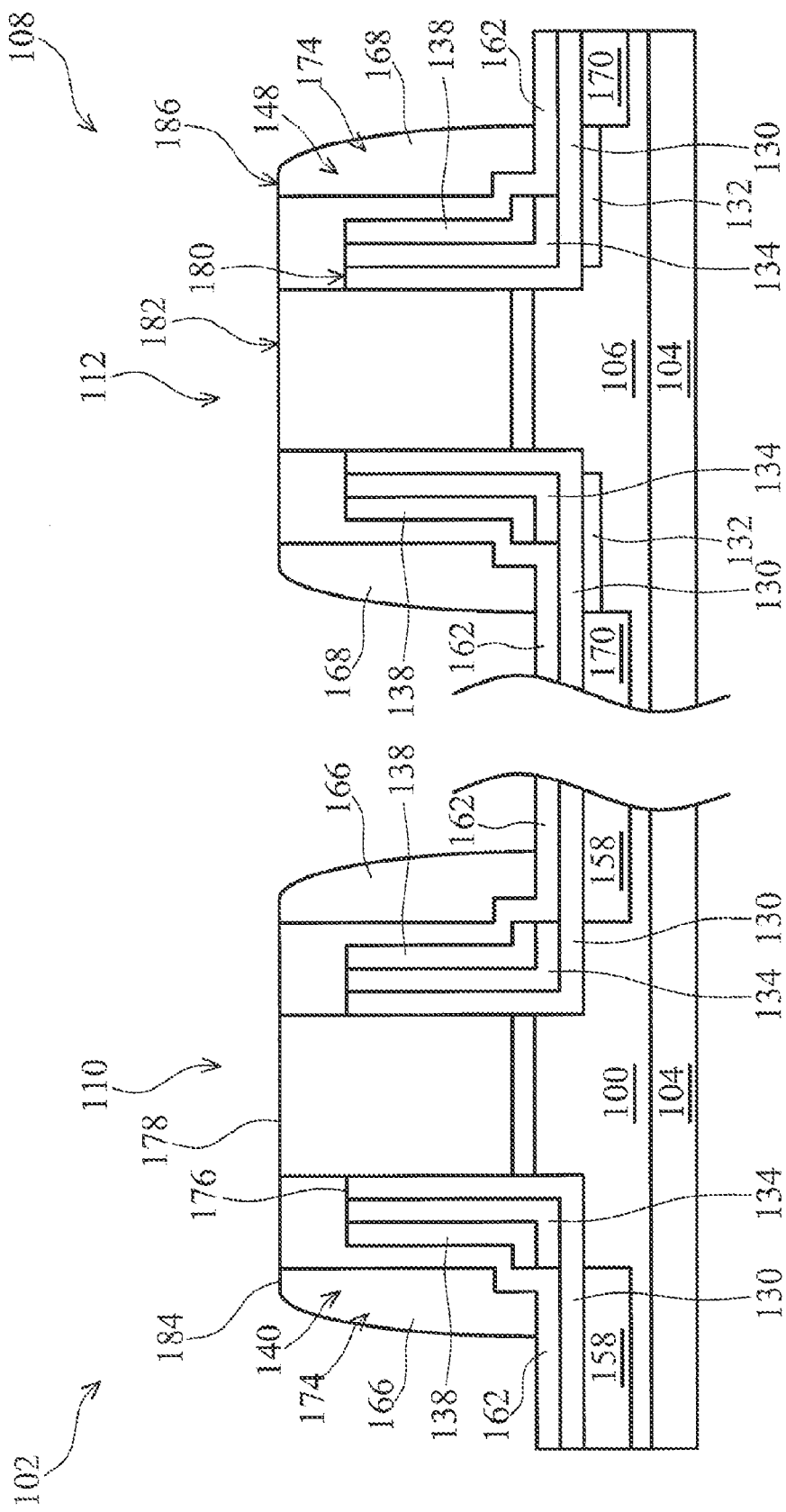

In another illustrative embodiment shown in FIG. 4K, the top 176 of the array region storage structure 140 is shown recessed relative to the top 178 of the array region gate stack 110. The top 180 of the periphery region storage structure 148 is shown recessed relative to the top 182 of the periphery region gate stack 112. The top 176 of the array region storage structure 140 is shown recessed relative to the top 184 of the array region spacer structure 166. The top 180 of the periphery region storage structure 148 is shown recessed relative to the top 186 of the periphery region spacer structure 168.

Generally, the fifth embodiment of the present invention provides still another method of manufacturing a semiconductor chip. The fifth embodiment is a variation on the fourth embodiment. FIGS. 4A-4D and FIGS. 5A-5E are cross-sectional views of sidewall SONOS transistors in the semiconductor chip of the fifth embodiment. The steps of the fourth embodiment, illustrated in FIGS. 4A-4D and discussed above, are the same for the fifth embodiment.

Figure 5A:
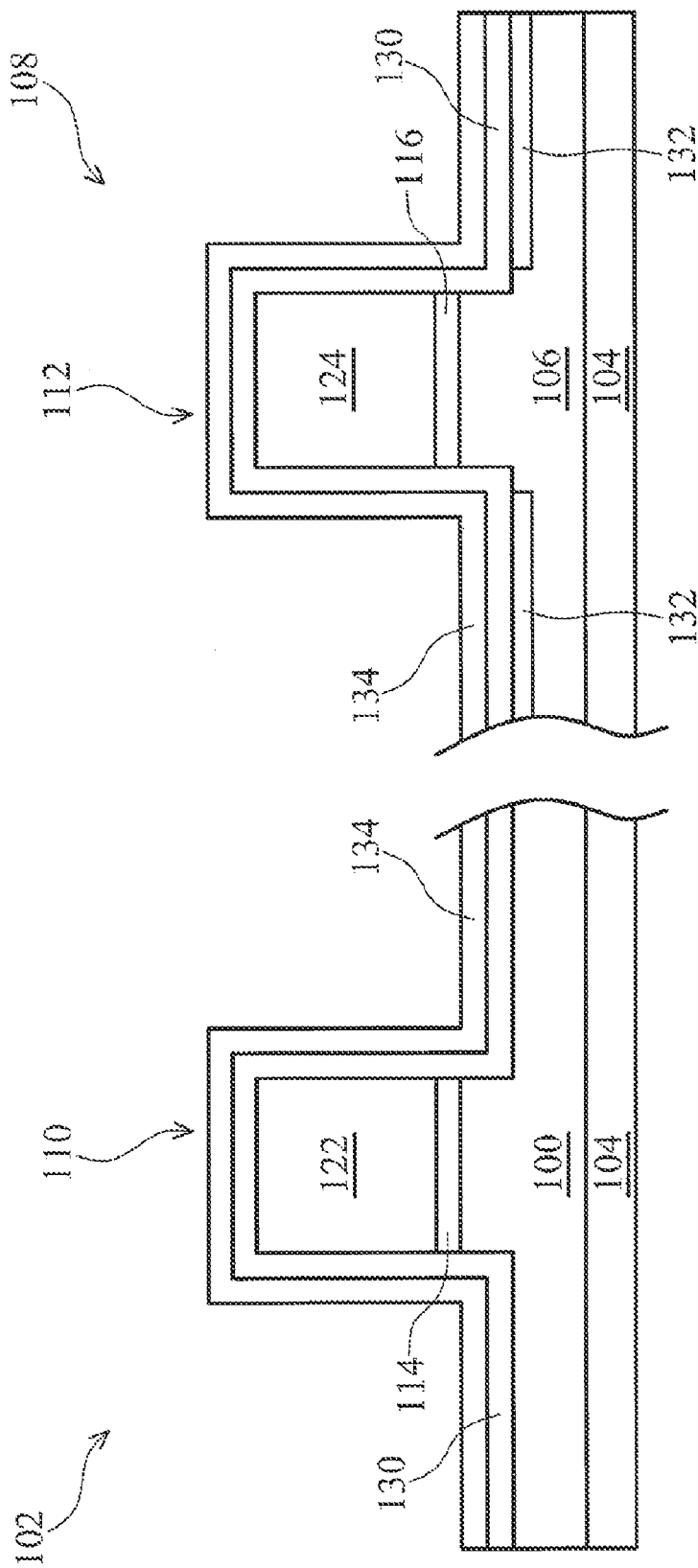
FIGS. 5A-5F show a cross-sectional view of sidewall SONOS transistors in accordance with a fifth embodiment of the present invention.
Figure 5B:
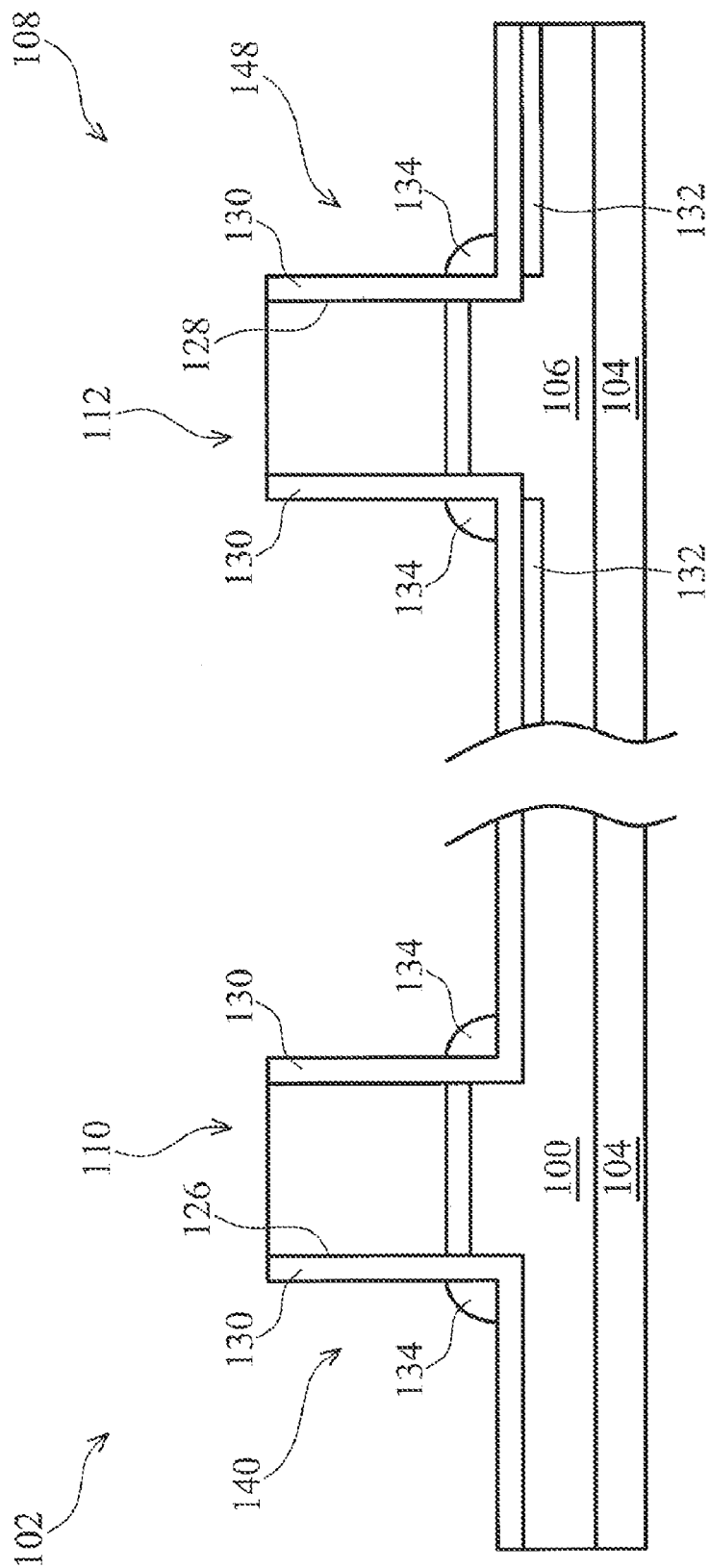

With reference now to FIG. 5A, the charge-storing material 134 is formed over the first dielectric material 130. In FIG. 5B, portions of the first dielectric material 130 and the charge-storing material 134 are removed, thus forming the array region storage structure 140 and the periphery region storage structure 148. The array region storage structure 140 is formed on the array region gate stack 110 and the periphery region storage structure 148 is formed on the periphery region gate stack 112. The array region storage structure 140 includes the charge-storing material 134 in the array region 102 and the first dielectric material 130 in the array region 102. The charge-storing material 134 in the array region 102 is separated from the array region gate stack 110 by the first dielectric material 130 in the array region 102. The charge-storing material 134 in the array region 102 is in at least the portion of the array region substrate recess 192 and has the generally quarter-round shaped cross-section.

With reference still to FIG. 5B, the first dielectric material 130 in the array region 102 has a generally L-shaped cross-section. The generally L-shaped first dielectric material 130 in the array region 102 includes the array region storage structure first dielectric horizontal portion 196 extended adjacent to at least part of the substrate 104, the array region storage structure first dielectric vertical portion 198 extended adjacent to at least part of the array region gate stack sidewall 126. The periphery region storage structure 148 includes charge-storing material 134 in the periphery region 108 and the first dielectric material 130 in the periphery region 108. The charge-storing material 134 in the periphery region 108 is separated from the periphery region gate stack 112 by the first dielectric material 130 in periphery region 108. The charge-storing material 134 in the periphery region 108 is in at least the portion of the periphery region substrate recess 194 and has the generally quarter-round shaped cross-section.

With continuing reference to FIG. 5B, the first dielectric material 130 in the periphery region 108 has a generally L-shaped cross-section. The generally L-shaped periphery region first dielectric material 130 includes the periphery region storage structure first dielectric horizontal portion 200 extended adjacent to at least part of the substrate 104, the periphery region storage structure first dielectric vertical portion 202 extended adjacent to at least part of the periphery region gate stack sidewall 128.

Figure 5C:
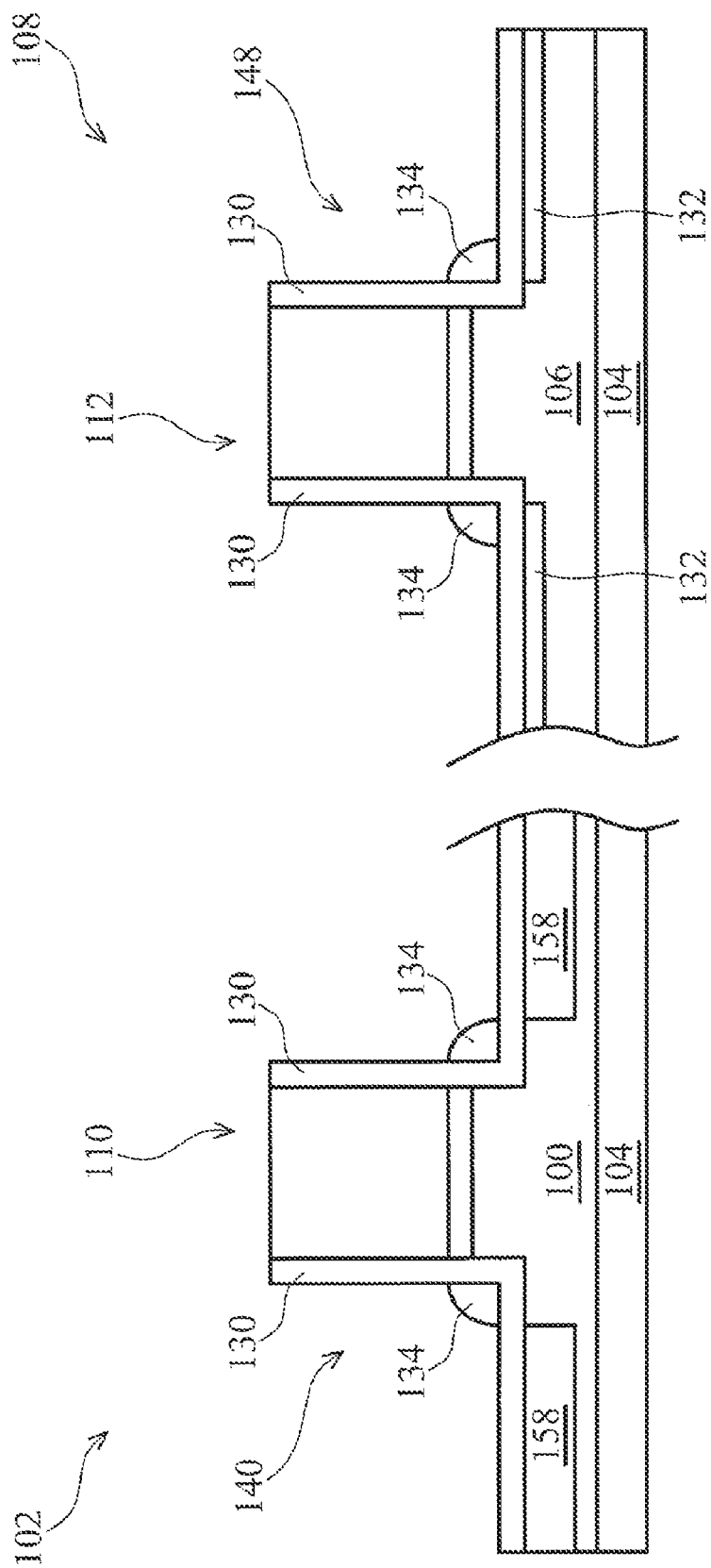
Figure 5D:
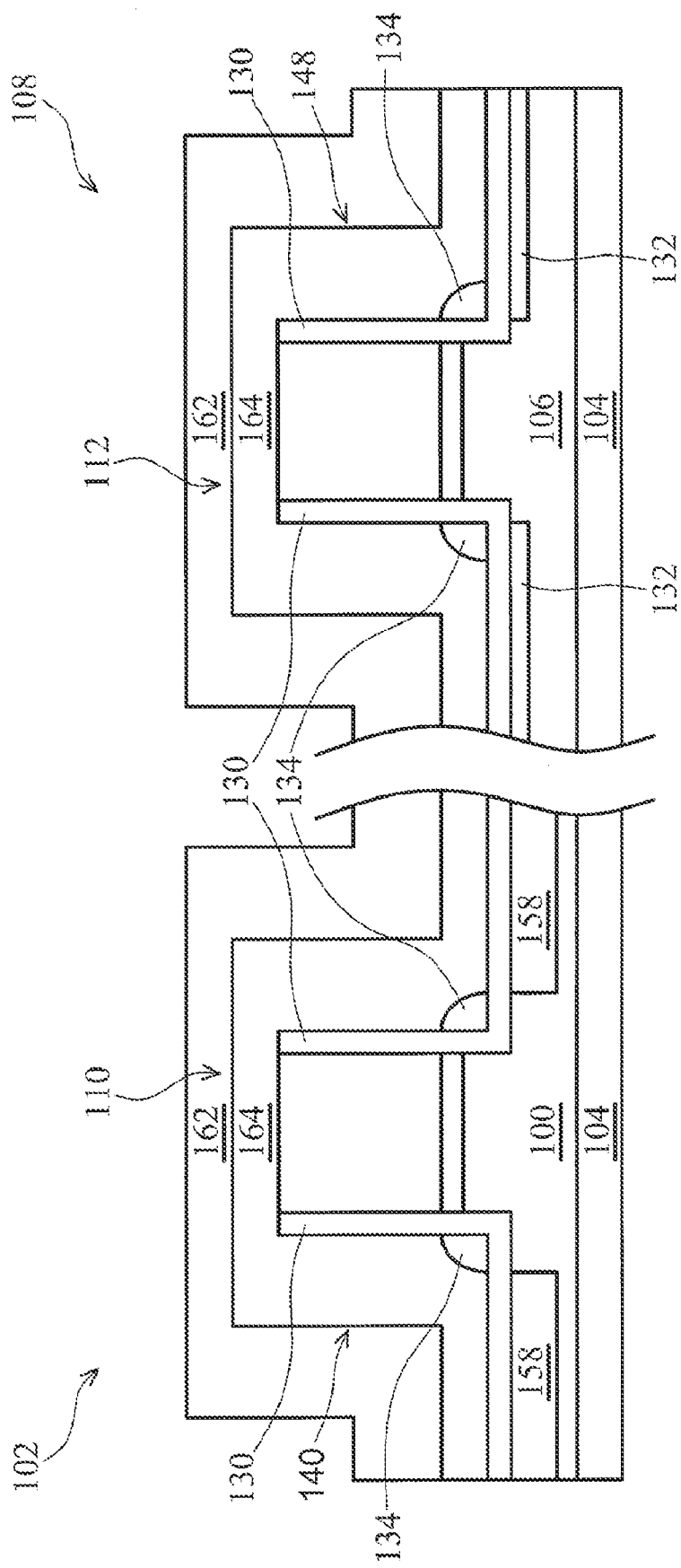

In FIG. 5C, the first source/drain region 158 is formed in the array region well 100. In FIG. 5D, the second dielectric material 138 is deposited over the substrate 104, and the spacer material 164 is deposited over the second dielectric material 138.

Figure 5E:
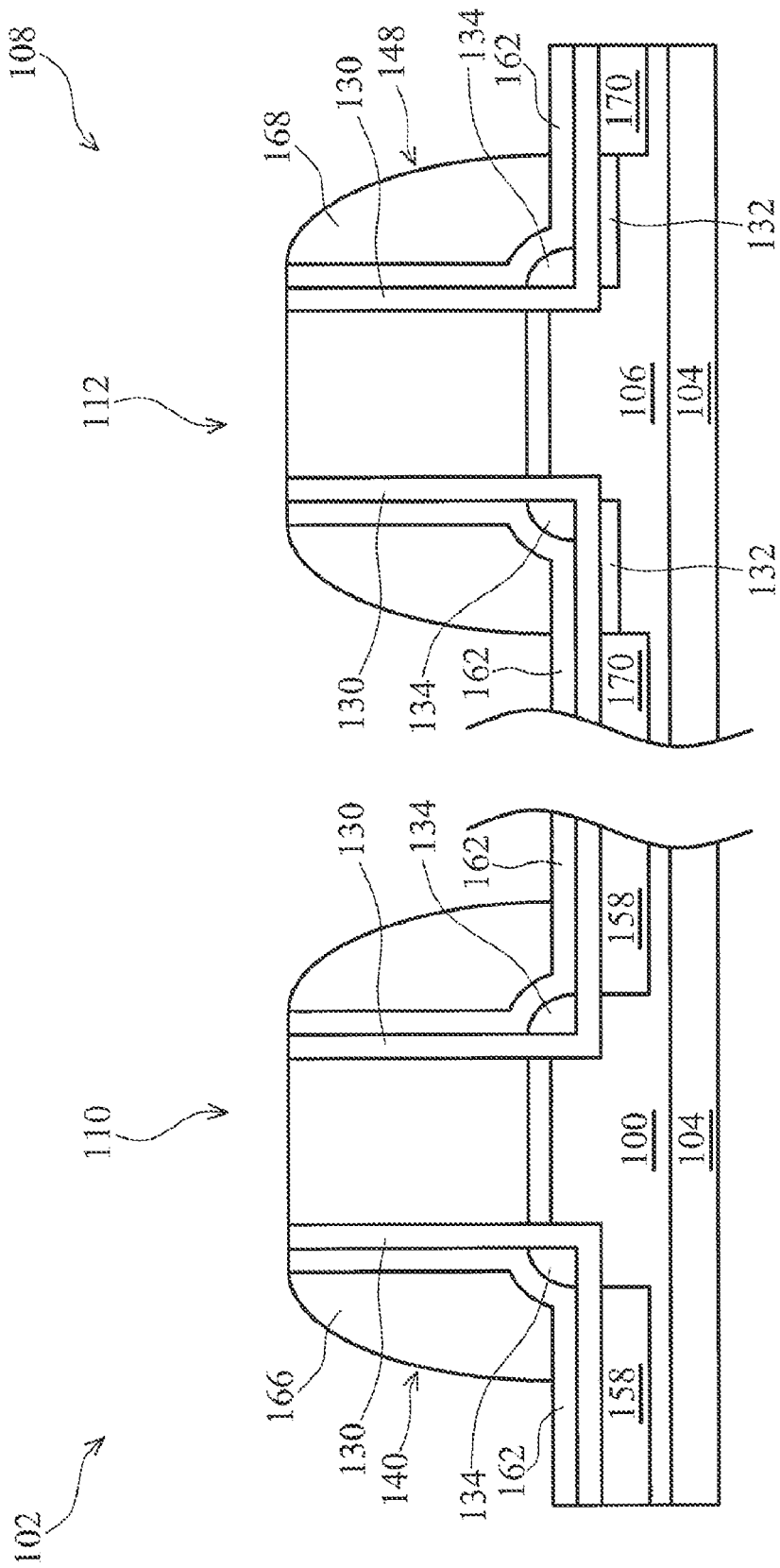

As shown in FIG. 5E, portions of the second dielectric material 138 and the spacer material 164 are removed, thus forming the array region spacer structure 166 and the periphery region spacer structure 168. The array region spacer structure 166 is separated from the array region storage structure 140 by the second dielectric material 138. The periphery region spacer structure 168 is separated from the periphery region storage structure 148 by the second dielectric material 138. The second source/drain region 170 is formed in the periphery region well 106.

Figure 5F:
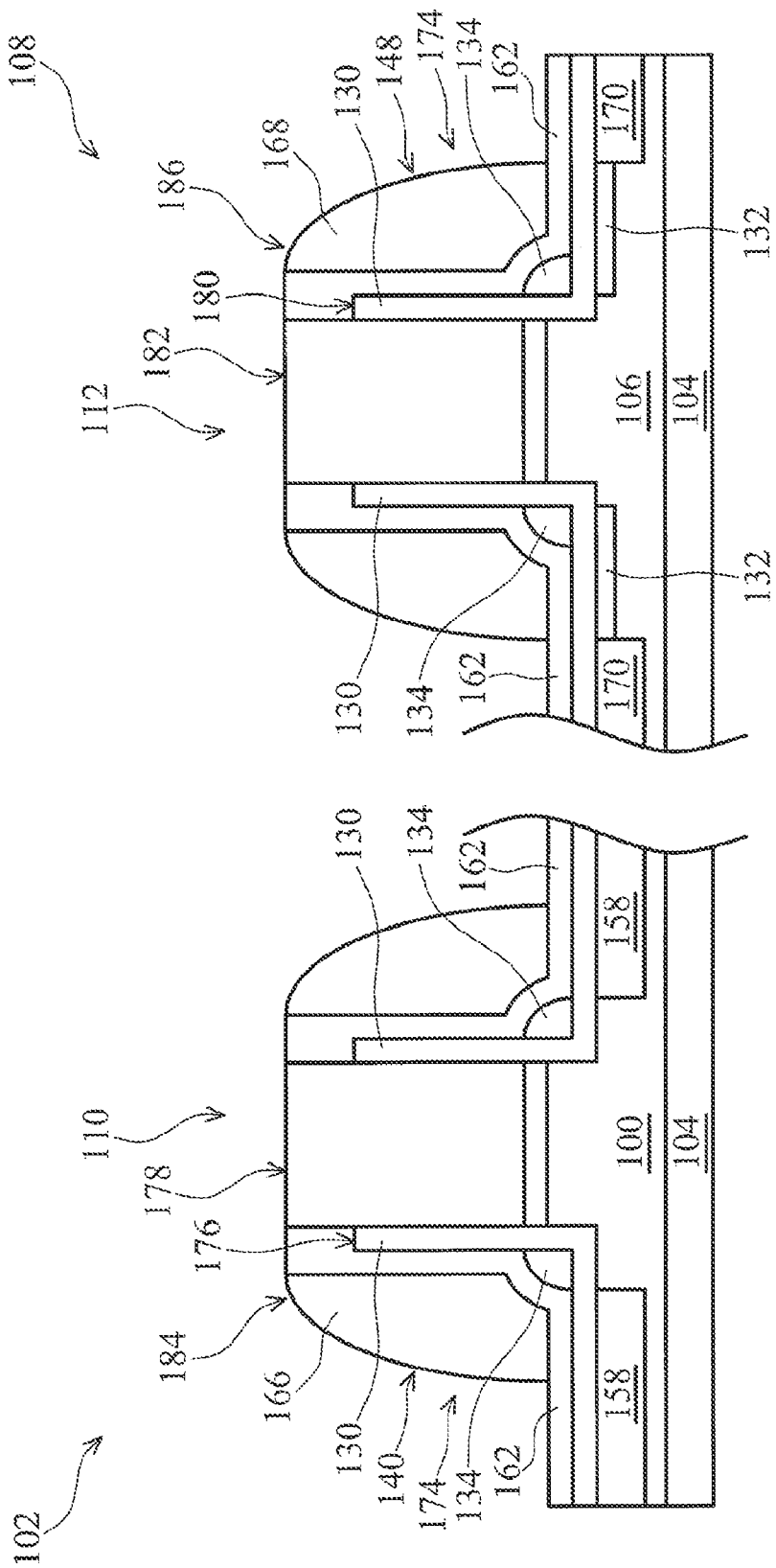

In another illustrative embodiment shown in FIG. 5F, the top 176 of the array region storage structure 140 is shown recessed relative to the top 178 of the array region gate stack 110. The top 180 of the periphery region storage structure 148 is shown recessed relative to the top 182 of the periphery region gate stack 112. The top 176 of the array region storage structure 140 is shown recessed relative to the top 184 of the array region spacer structure 166. The top 180 of the periphery region storage structure 148 is shown recessed relative to the top 186 of the periphery region spacer structure 168.

In the fifth embodiment shown in FIG. 5E and the embodiment shown in 5F, the charge-storing material 134 in the array region 102 and in the periphery region 108 is enclosed in oxide material 174. The oxide material 174 of the fifth illustrative embodiment includes the first dielectric material 130 and the second dielectric material 138.

Generally, the sixth embodiment of the present invention provides yet another method of manufacturing a semiconductor chip. FIGS. 6A-6K are cross-sectional views of sidewall SONOS transistors in the semiconductor chip of the sixth embodiment.

With reference to FIG. 6A, the array region well 100 is formed in the array region 102 of the substrate 104 and the periphery region well 106 is formed in the periphery region 108 of the substrate 104. The array region gate stack 110 is formed on the array region 102 of the substrate 104 and the periphery region gate stack 112 is formed on the periphery region 108 of the substrate 104. The array region gate stack 110 has the array region gate stack sidewall 126 and the periphery region gate stack 112 and the periphery region gate stack sidewall 128.

Figure 6B:
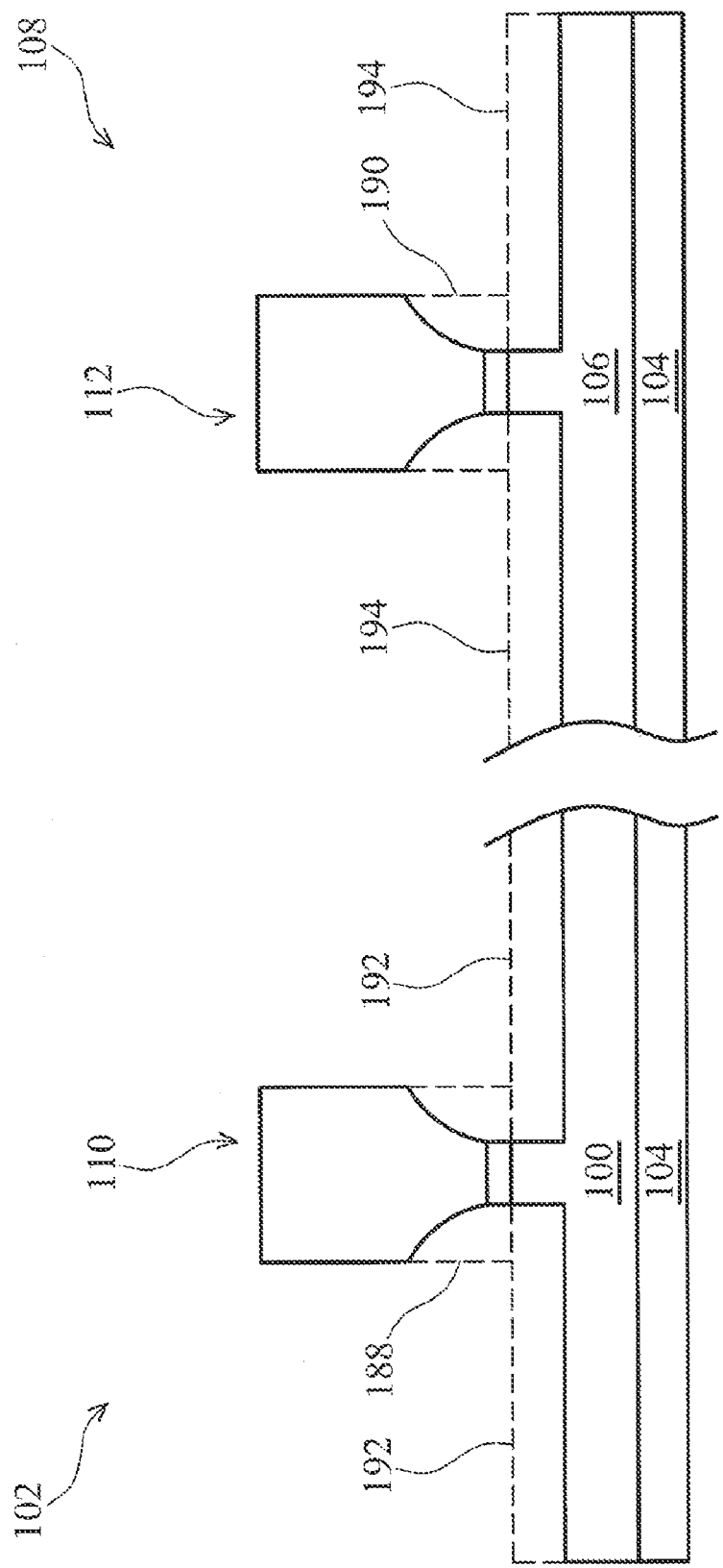

As illustrated in FIG. 6B, the array region gate stack sidewall recess 188 is formed in the lower portion of the array region gate stack sidewall 126. The periphery region gate stack sidewall recess 190 is formed in the lower portion of the periphery region gate stack sidewall 128. The array region substrate recess 192 is formed in the substrate 104 adjacent to the array region gate stack 110 and the periphery region substrate recess 194 is formed in the substrate 104 adjacent to the periphery region gate stack 112.

Figure 6D:
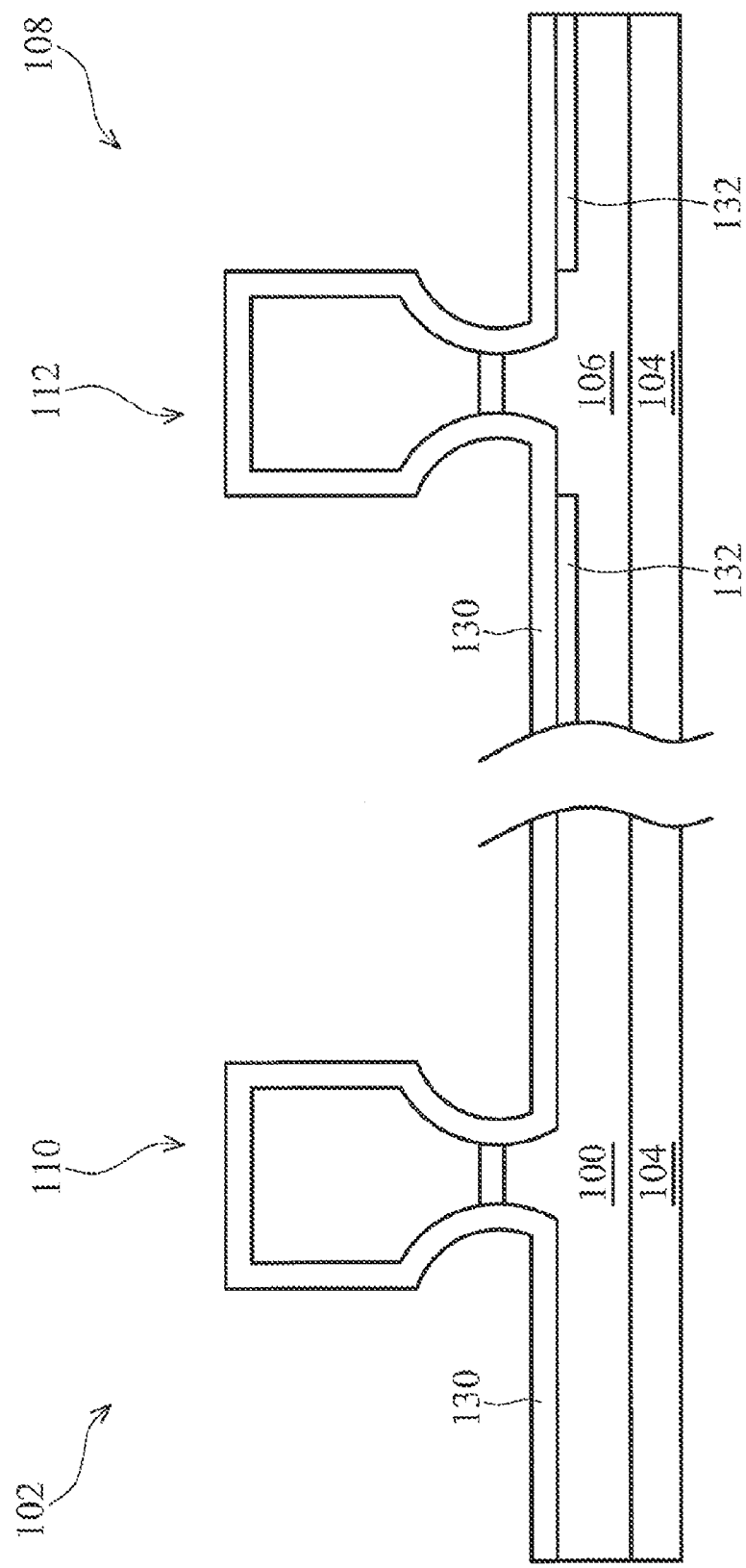
Figure 6E:
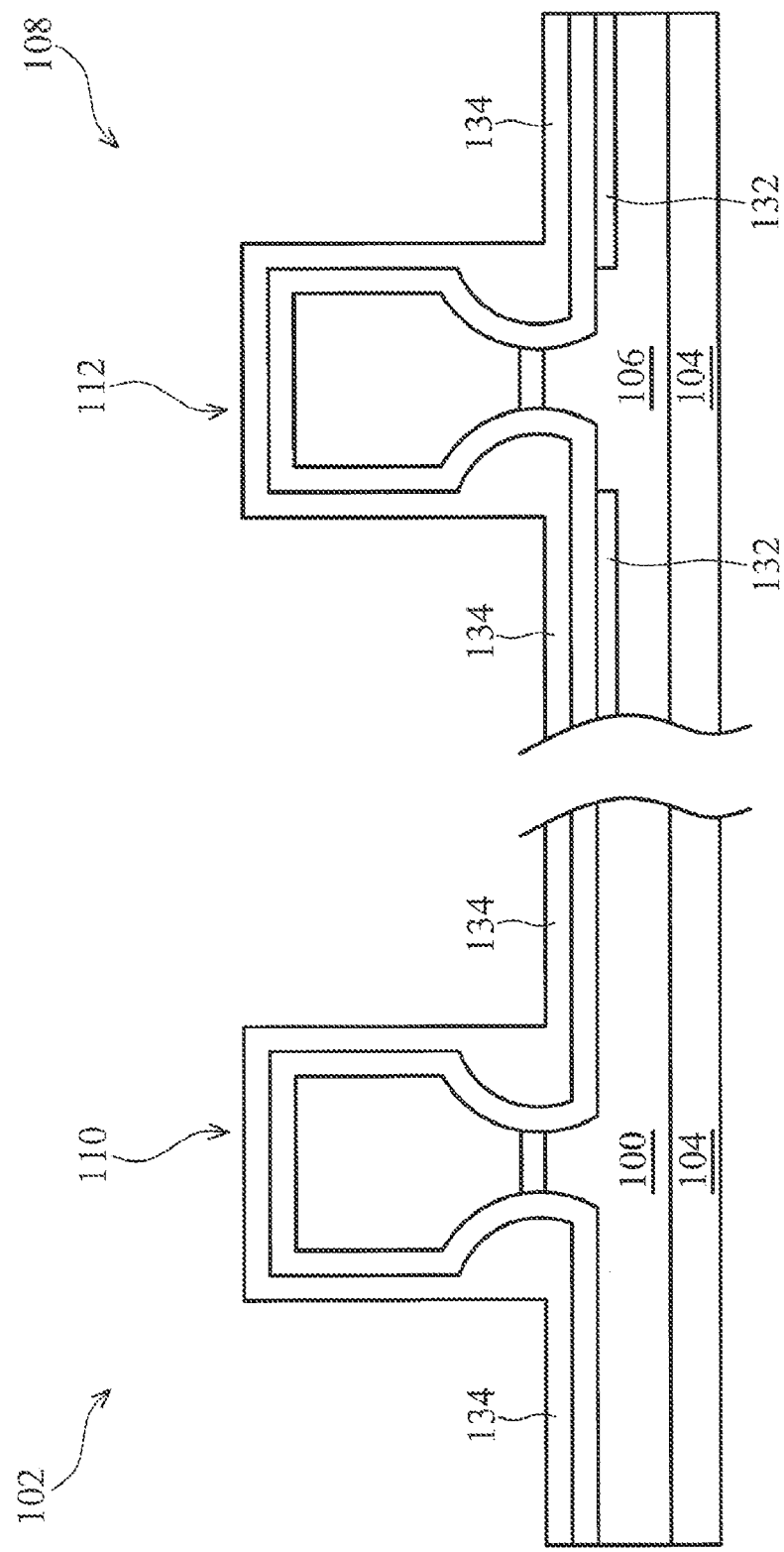

A number of steps in the method of the sixth embodiment are shown in FIGS. 6C-6E. FIG. 6C shows the first dielectric material 130 is deposited over the substrate 104. In FIG. 6D, the lightly doped drain region 132 is formed in the periphery region well 106. As shown in FIG. 6E, the charge-storing material 134 is formed over the first dielectric material 130.

Figure 6F:
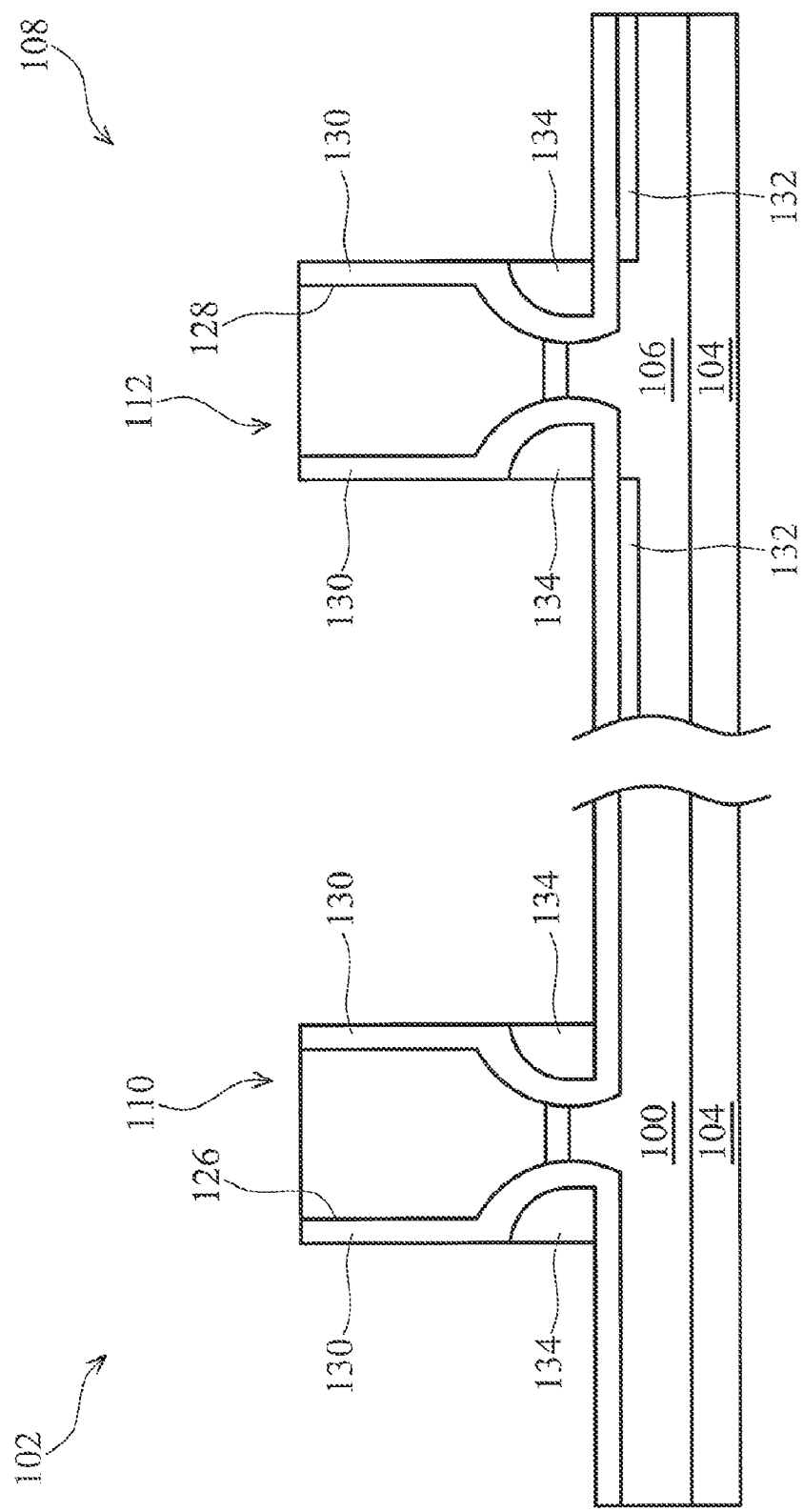

In FIG. 6F, portions of the first dielectric material 130 and the charge-storing material 134 are removed, thus forming the array region storage structure 140 and the periphery region storage structure 148. The array region storage structure 140 is formed on the array region gate stack 110 and the periphery region storage structure 148 is formed on the periphery region gate stack 112.

FIG. 6F illustrates that the array region storage structure 140 includes the charge-storing material 134 in the array region 102 and the first dielectric material 130 in the array region 102. The charge-storing material 134 in the array region 102 is separated from the array region gate stack 110 by the first dielectric material 130 in the array region 102. The charge-storing material 134 in the array region 102 has the generally quarter-round shaped cross-section formed in at least the portion of the array region gate stack sidewall recess 188.

FIG. 6F also shows the first dielectric material 130 in the array region 102 has a generally L-shaped cross-section. The generally L-shaped array region first dielectric material 130 includes the array region storage structure first dielectric horizontal portion 196 extended adjacent to at least part of the substrate 104, and the array region storage structure first dielectric vertical portion 198 extended adjacent to at least part of the array region gate stack sidewall 126.

Referring still to FIG. 6F, the periphery region storage structure 148 includes the charge-storing material 134 in the periphery region 108 and the first dielectric material 130 in the periphery region 108. The charge-storing material 134 in the periphery region 108 is separated from the periphery region gate stack 112 by the first dielectric material 130 in the periphery region 108. The charge-storing material 134 in the periphery region 108 has the generally quarter-round shaped cross-section formed in at least the portion of the periphery region gate stack sidewall recess 190.

The first dielectric material 130 in the periphery region 108 has a generally L-shaped cross-section. The generally L-shaped periphery region first dielectric material 130 includes the periphery region storage structure first dielectric horizontal portion 200 extended adjacent to at least part of the substrate 104, and the periphery region storage structure first dielectric vertical portion 202 extended adjacent to at least part of the periphery region gate stack sidewall 128. FIG. 6G shows the first source/drain region 158 is formed in the array region well 100.

Figure 6H:
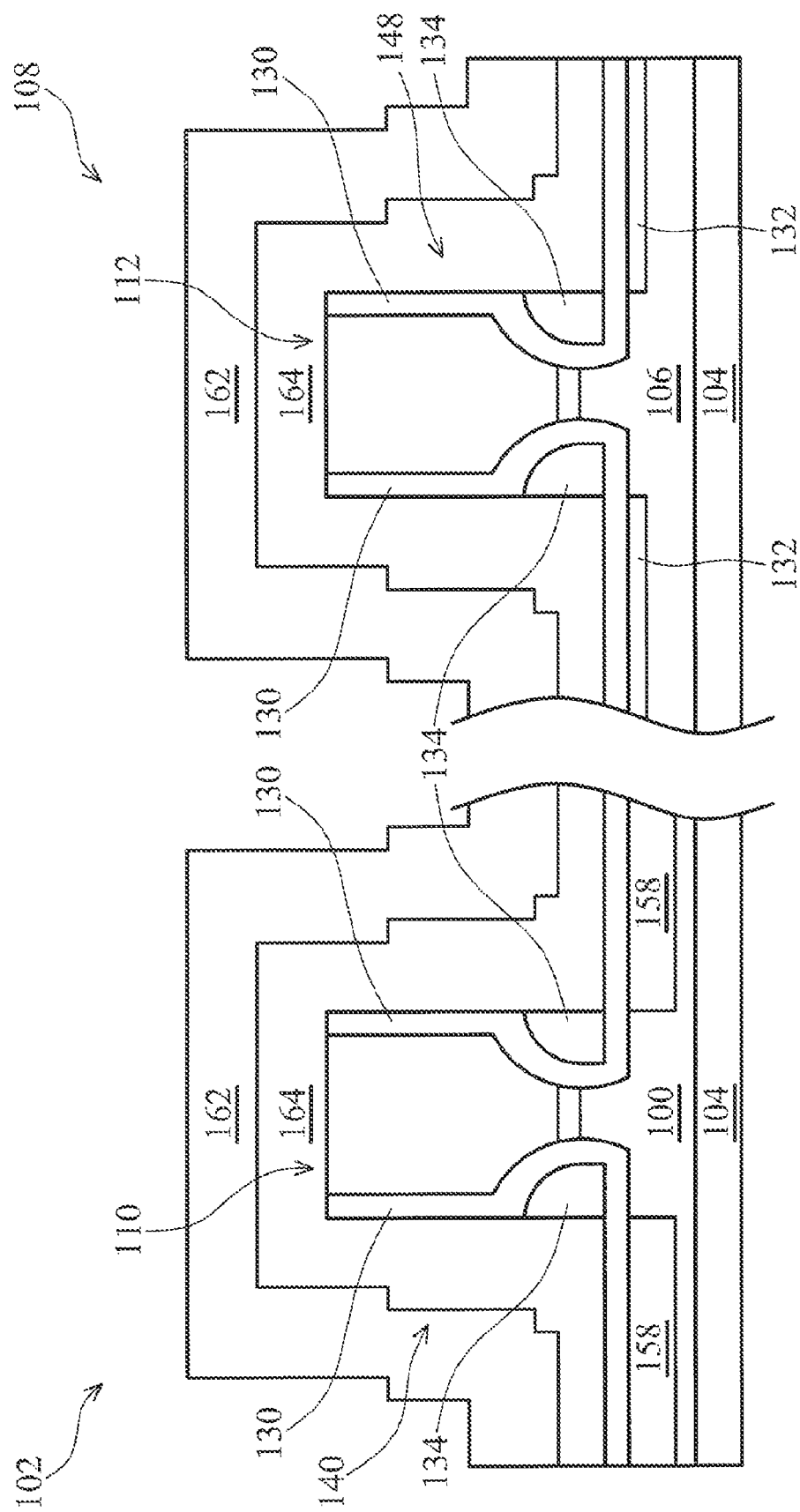
Figure 61:
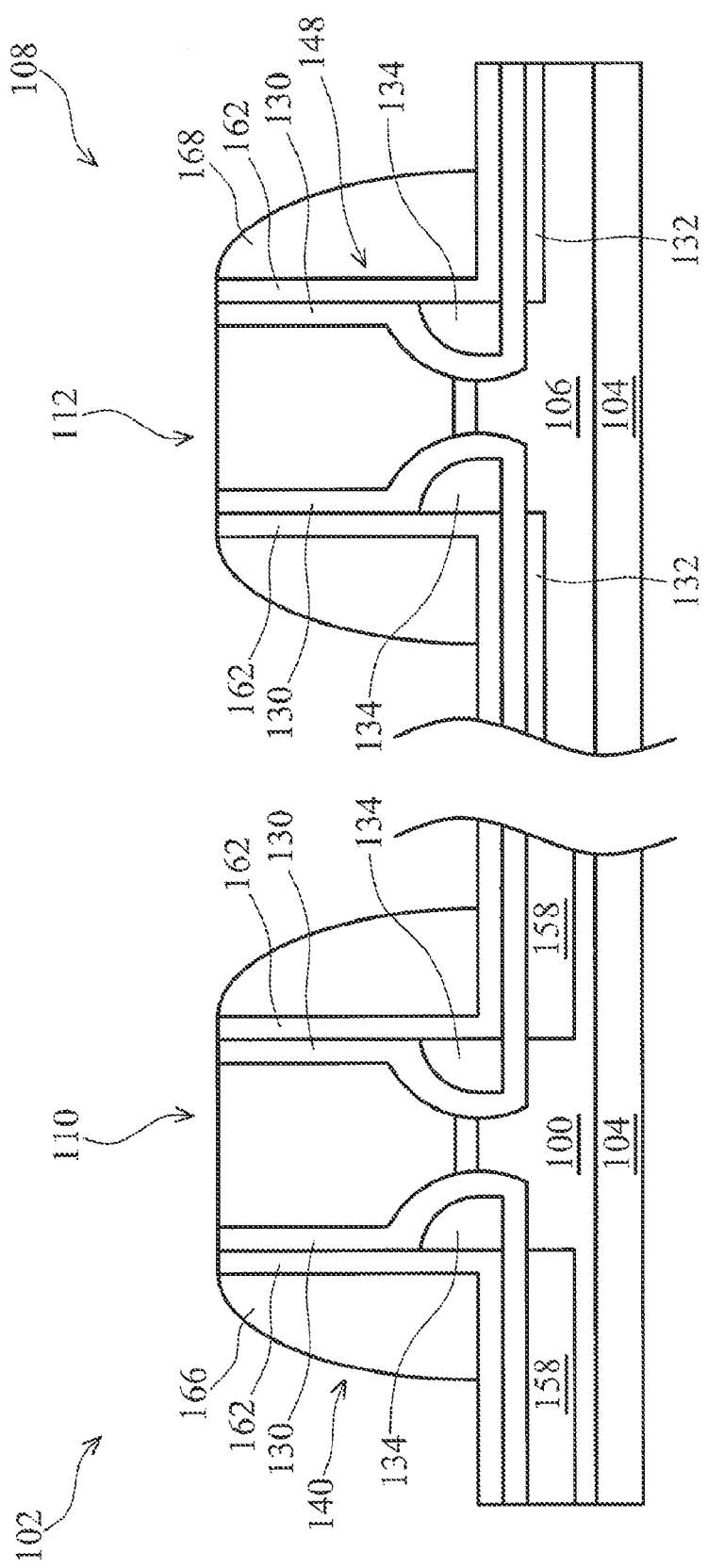

As illustrated in FIG. 6H, the second dielectric material 138 is deposited over the substrate 104. FIG. 6H also shows the spacer material 164 is deposited over the second dielectric material 138.

Figure 6J:
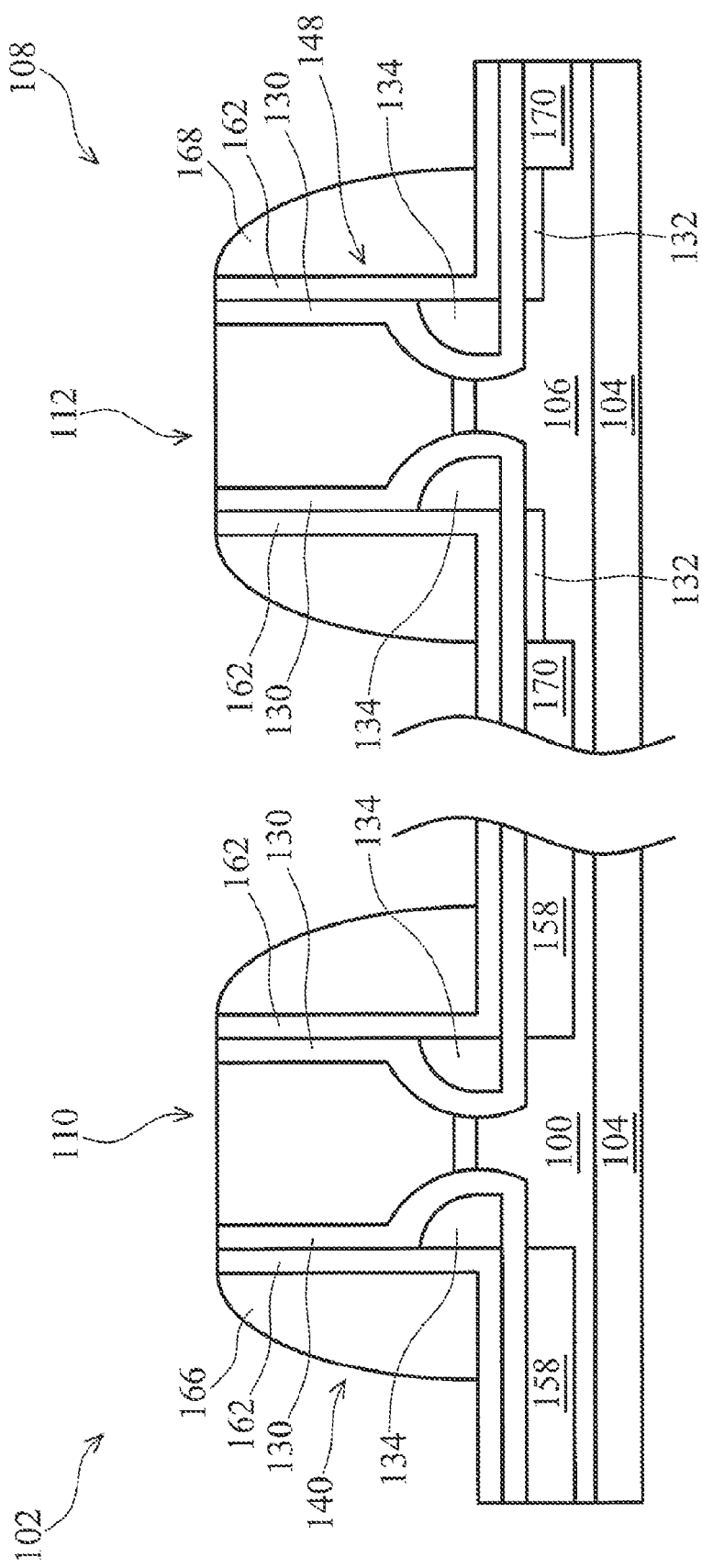

In FIG. 6I, portions of the second dielectric material 138 and the spacer material 164 are removed, thus forming the array region spacer structure 166 separated from the array region storage structure 140 by the second dielectric material 138, and the periphery region spacer structure 168 separated from the periphery region storage structure 148 by the second dielectric material 138. In FIG. 6J, the second source/drain region 170 is formed in the periphery region well 106.

Figure 6K:
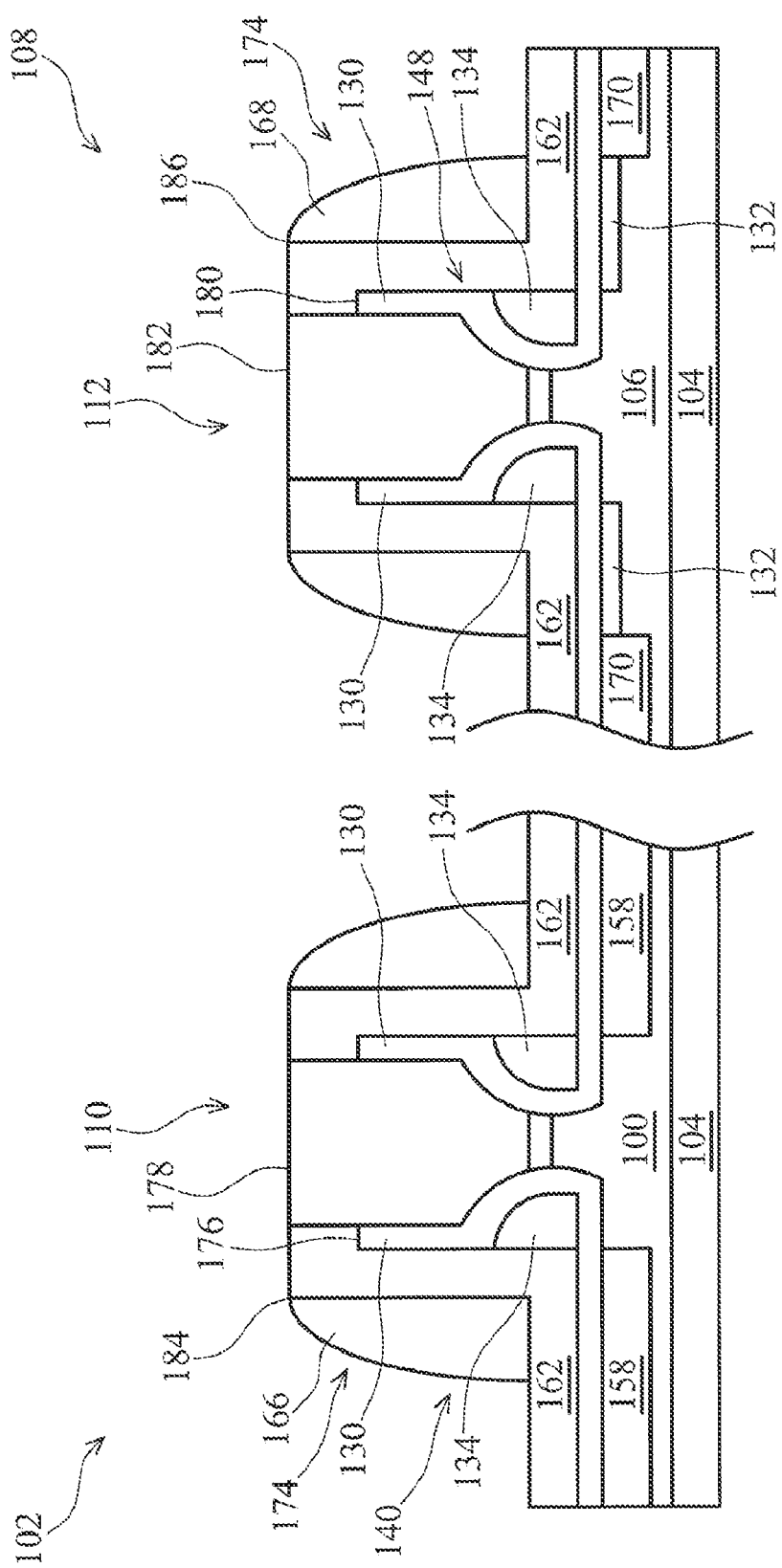

In another embodiment of the present invention shown in FIG. 6K, the second dielectric material 162 separates the array region spacer structure 166 and the periphery region spacer structure 168 from the substrate 104. In both the array region 102 and the periphery region 108, the charge-storing material 134 is enclosed in an oxide material 174. The oxide material 174 of the sixth illustrative embodiment includes the first dielectric material 130 and the second dielectric material 162.

With continuing reference to FIG. 6K, the top 176 of the array region storage structure 140 is shown recessed relative to the top 178 of the array region gate stack 110. The top 180 of the periphery region storage structure 148 is shown recessed relative to the top 182 of the periphery region gate stack 112. The top 176 of the array region storage structure 140 is shown recessed relative to the top 184 of the array region spacer structure 166. The top 180 of the periphery region storage structure 148 is shown recessed relative to the top 186 of the periphery region spacer structure 168.

Generally, the seventh embodiment of the present invention provides still another method of manufacturing a semiconductor chip. The seventh embodiment is a variation on the sixth embodiment. FIGS. 6A-6E and FIGS. 7A-7D are cross-sectional views of sidewall SONOS transistors in the semiconductor chip of the seventh embodiment. The steps of the sixth embodiment, illustrated in FIGS. 6A-6E and discussed above, are the same for the seventh embodiment.

Figure 7A:
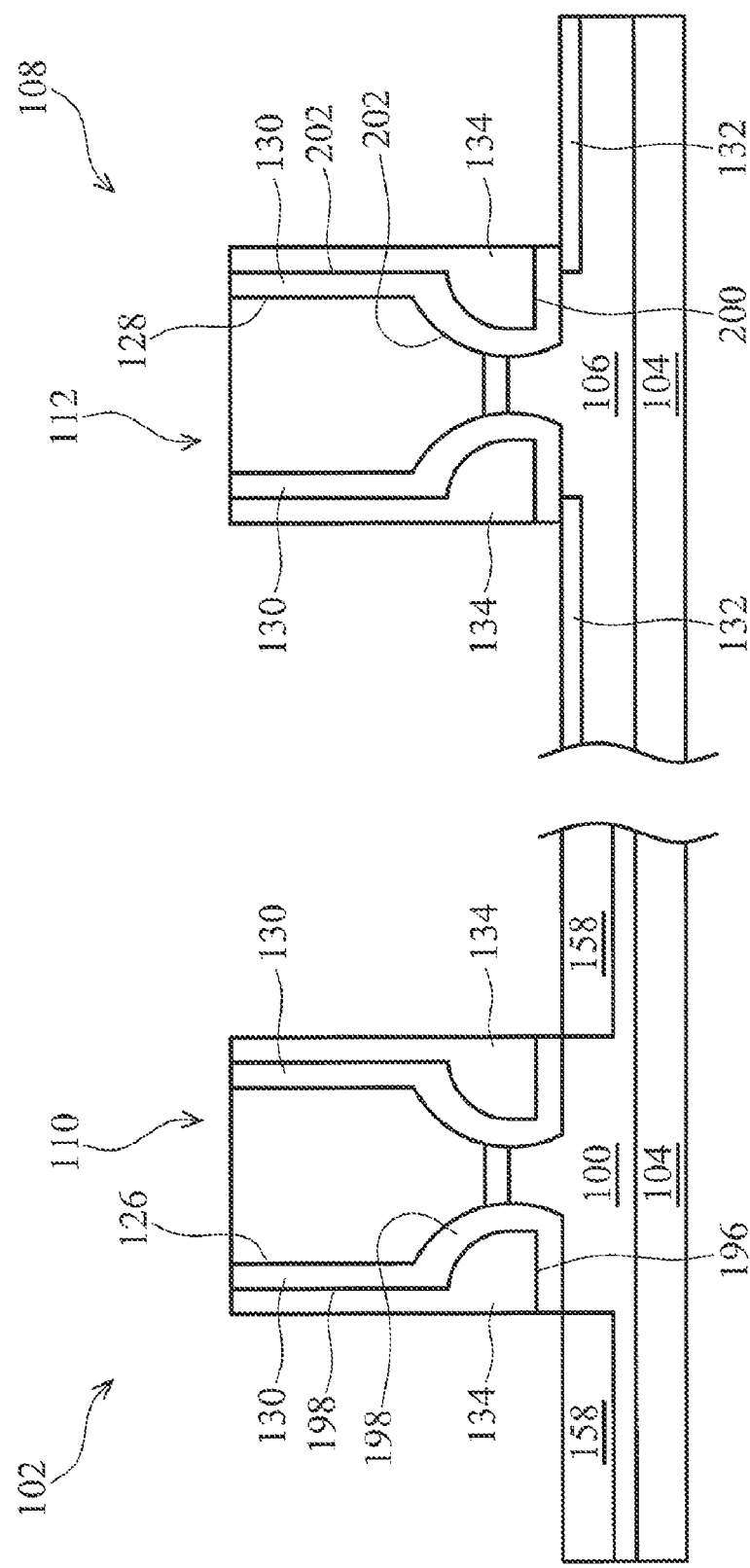
FIGS. 7A-7E show a cross-sectional view of sidewall SONOS transistors in accordance with a seventh embodiment of the present invention.

With reference now to FIG. 7A, portions of the first dielectric material 130 and the charge-storing material 134 are removed, thus forming the array region storage structure 140 on the array region gate stack 110 and the periphery region storage structure 148 on the periphery region gate stack 112. The array region storage structure 140 includes the charge-storing material 134 in the array region 102 and the first dielectric material 130 in the array region 102. The charge-storing material 134 in the array region 102 is separated from the array region gate stack 110 by the first dielectric material 130 in the array region 102. The charge-storing material 134 in the array region 102 has the generally quarter-round shaped cross-section formed in at least the portion of the array region gate stack sidewall recess 188 and the array region charge-storing material 134 vertical portion extended adjacent to at least the portion of the array region gate stack sidewall 126.

With continuing reference to FIG. 7A, the first dielectric material 130 in the array region 102 has a generally L-shaped cross-section. The array region generally L-shaped first dielectric material 130 includes the array region storage structure first dielectric horizontal portion 196 extended adjacent to at least part of the substrate 104, and the array region storage structure first dielectric vertical portion 198 extended adjacent to at least part of the array region gate stack sidewall 126. The periphery region storage structure 148 includes the charge-storing material 134 in the periphery region 108 and the first dielectric material 130 in the periphery region 108. The charge-storing material 134 in the periphery region 108 is separated from the periphery region gate stack 112 by the first dielectric material 130 in the periphery region 108. The charge-storing material 134 in the periphery region 108 has a generally quarter-round shaped cross-section formed in at least the portion of the periphery region gate stack sidewall recess 190 and the periphery region charge-storing material 134 vertical portion extended adjacent to at least the portion of the periphery region gate stack sidewall 128.

The first dielectric material 130 in the periphery region 108 has a generally L-shaped cross-section. The generally L-shaped first dielectric material 130 in the periphery region 108 includes the periphery region storage structure first dielectric horizontal portion 200 extended adjacent to at least part of the substrate 104, and the periphery region storage structure first dielectric vertical portion 202 extended adjacent to at least part of the periphery region gate stack sidewall 128.

Figure 7B:
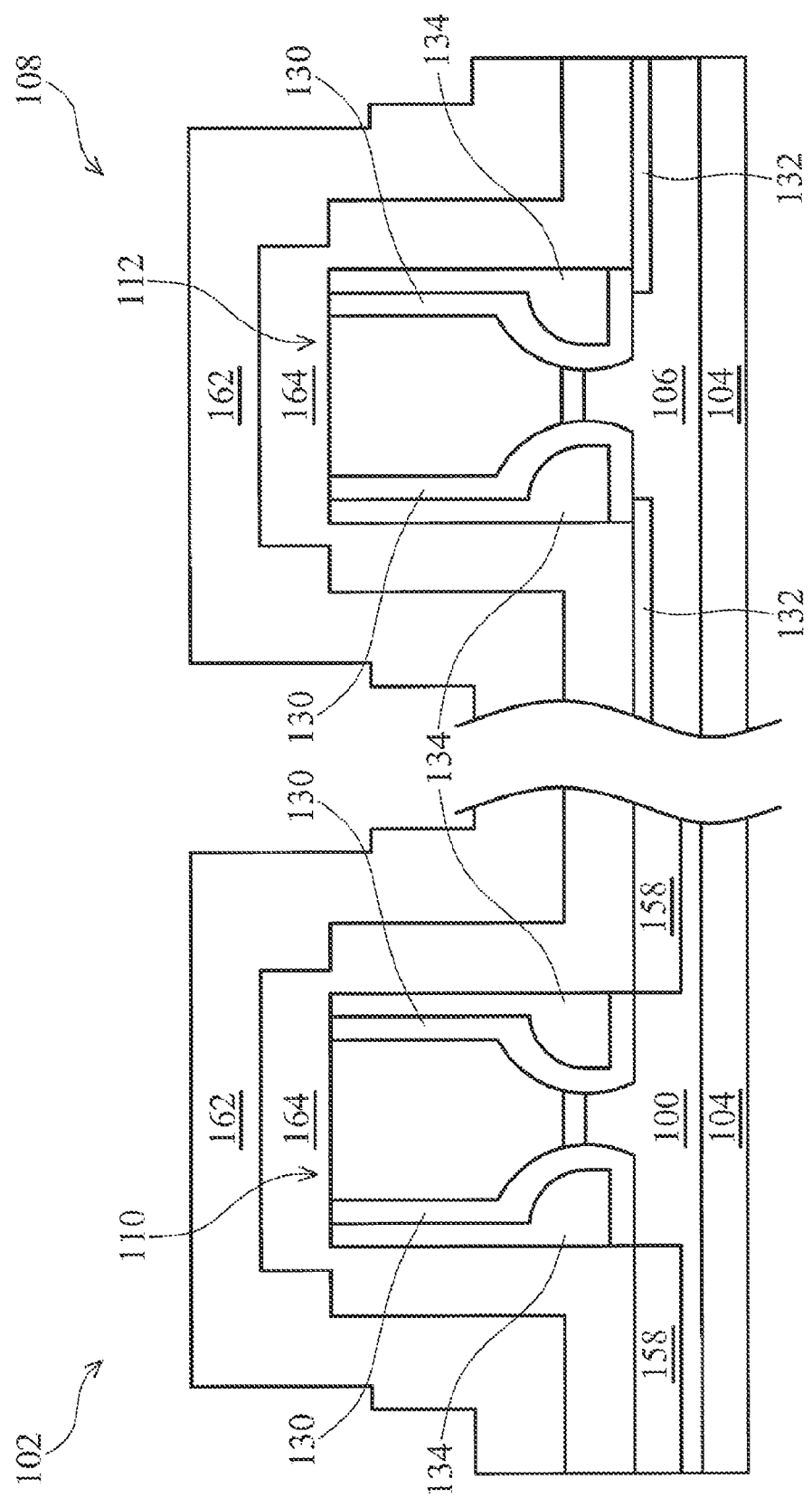

Also shown in FIG. 7A, the first source/drain region 158 has been formed in the array region well 100. In FIG. 7B, the second dielectric material 138 is deposited over the substrate 104. The spacer material 164 is deposited over the second dielectric material 138.

Figure 7C:
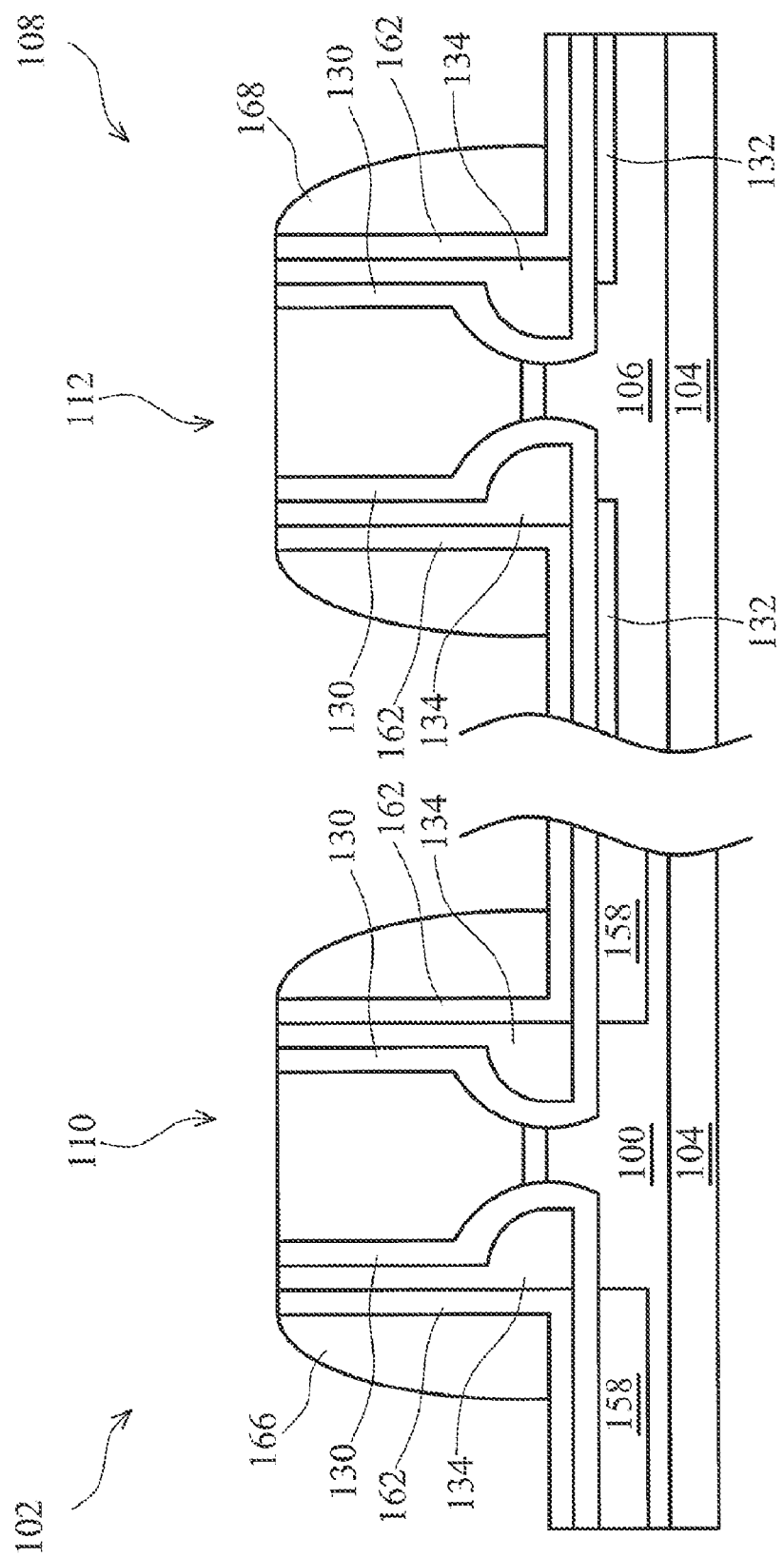
Figure 7D:
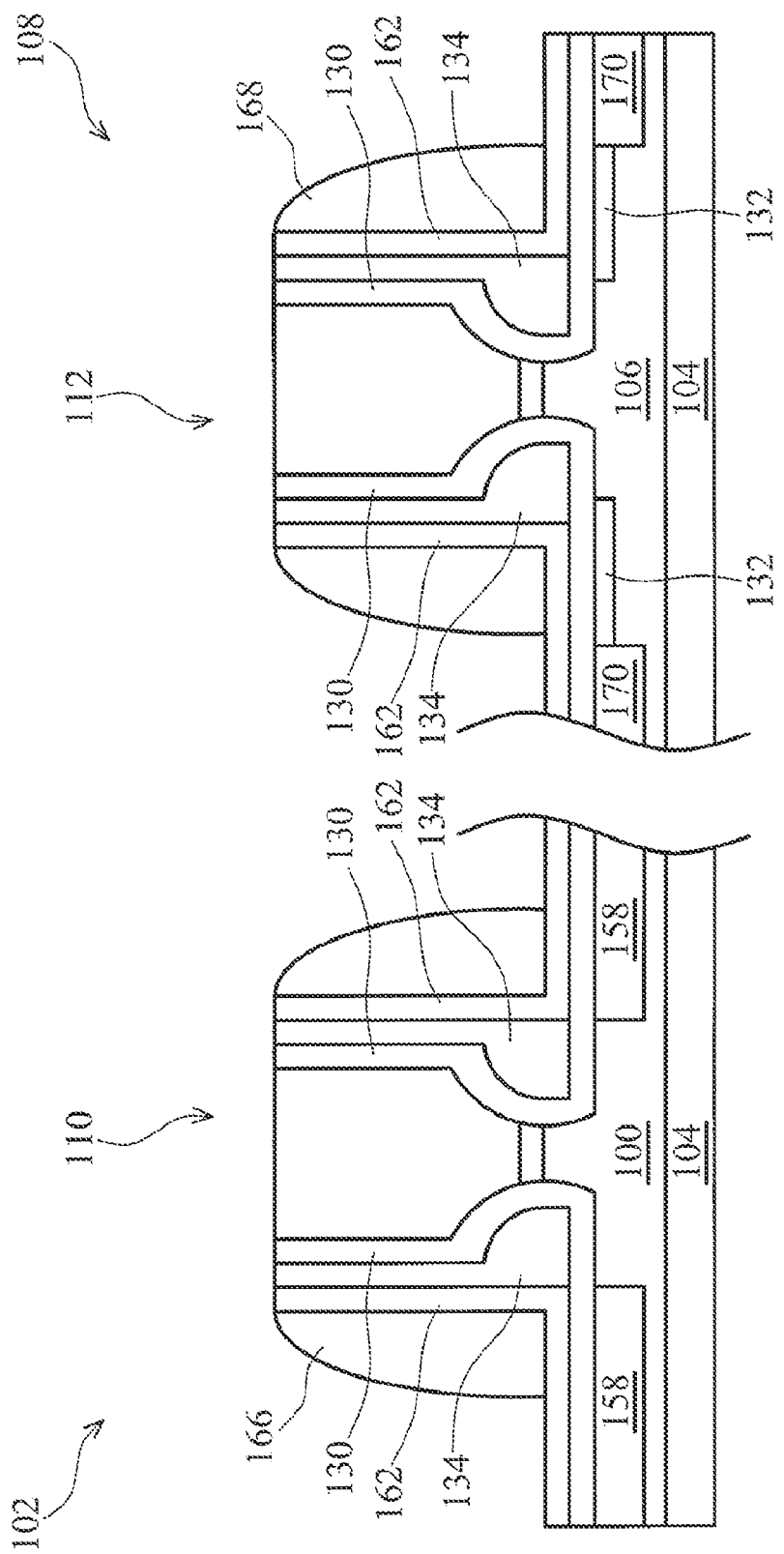

In FIG. 7C, portions of the second dielectric material 138 and the spacer material 164 are removed. The removal of portions of the second dielectric material 138 and the spacer material 164 forms the array region spacer structure 166 and the periphery region spacer structure 168. The array region spacer structure 166 is separated from the array region storage structure 140 by the second dielectric material 138, and the periphery region spacer structure 168 is separated from the periphery region storage structure 148 by the second dielectric material 138. In FIG. 7D, the second source/drain is formed region in the periphery region well 106.

Figure 7E:
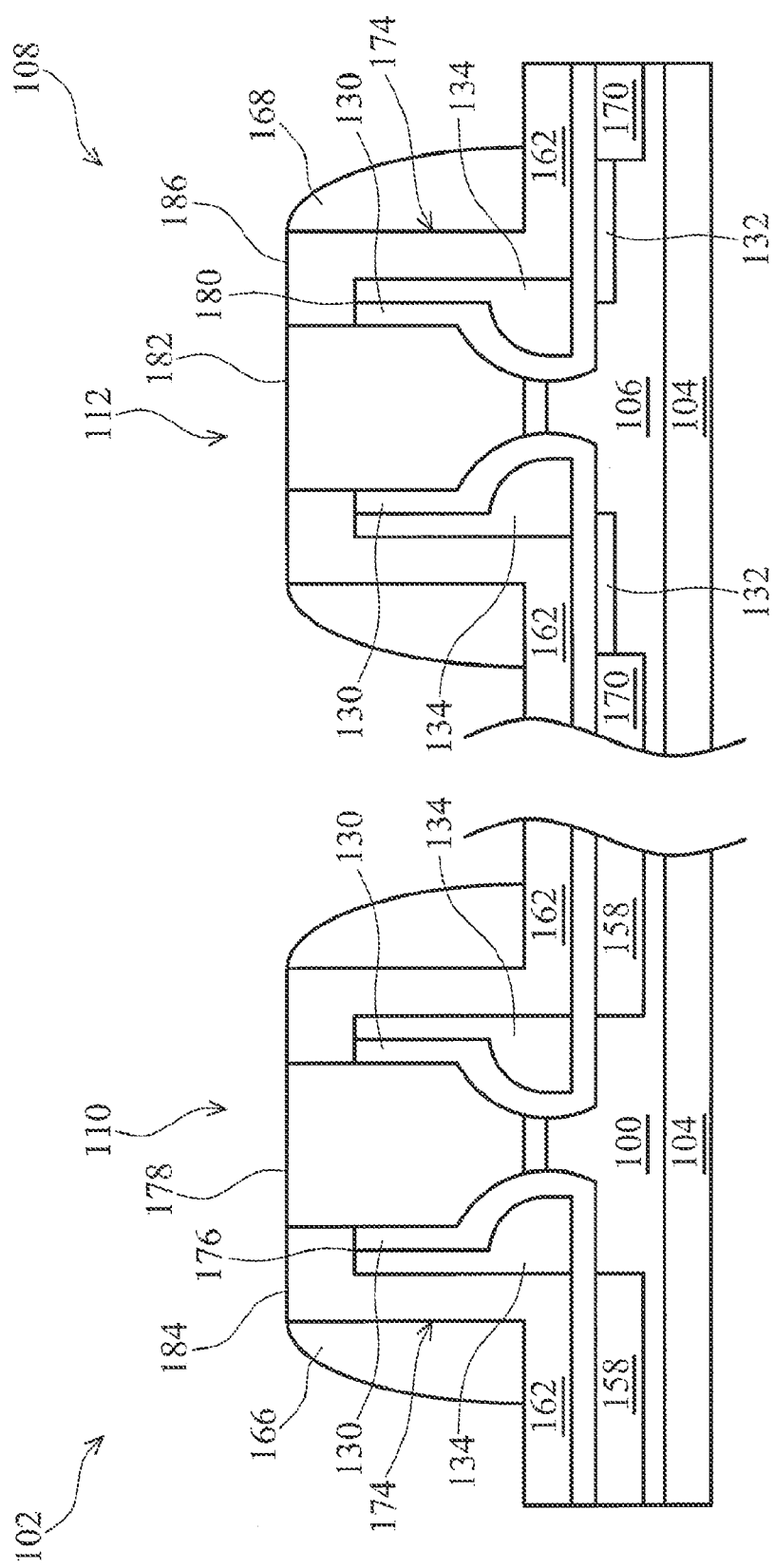

In another illustrative embodiment shown in FIG. 7E, the top 176 of the array region storage structure 140 is shown recessed relative to the top 178 of the array region gate stack 110. The top 180 of the periphery region storage structure 148 is shown recessed relative to the top 182 of the periphery region gate stack 112. The top 176 of the array region storage structure 140 is shown recessed relative to the top 184 of the array region spacer structure 166. The top 180 of the periphery region storage structure 148 is shown recessed relative to the top 186 of the periphery region spacer structure 168. In both the array region 102 and the periphery region 108, the charge-storing material 134 is enclosed in an oxide material 174. The oxide material 174 of the seventh illustrative embodiment includes the first dielectric material 130 and the second dielectric material 162.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:
forming a first gate stack on an array region of a substrate and a second gate stack on a periphery region of the substrate, wherein the first gate stack has a first sidewall and the second gate stack has a second sidewall;
forming a first dielectric material over the substrate to cover the first gate stack and the second gate stack;
forming a lightly doped drain region in the periphery region;
forming a charge-storing material over the first dielectric material;
forming a second dielectric material over the charge-storing material;
removing portions of the first, dielectric material, the charge-storing material, and the second dielectric material, such that a first storage structure is formed adjacent to the first sidewall of the first gate stack, and a second storage structure is formed adjacent to the second sidewall of the second gate stack;
forming a first source/drain region in the array region;
depositing a third dielectric material over the substrate.

2. The method of claim 1, further comprising forming a second source/drain region in the periphery region.

3. The method of claim 1, further comprising forming a spacer material over the third dielectric layer.

4. The method of claim 1, further comprising forming one or more recess regions in the substrate adjacent to but not underlying at least one of either the first gate stack and the second gate stack.

5. The method of claim 1, wherein the array region is a memory cell array region and the periphery region is a logic region.

6. The method of claim 1, wherein the second dielectric material is different than the charge-storing material.

7. The method of claim 1, wherein a thickness of the charge-storing material is between about 30 angstroms and about 200 angstroms.

8. The method of claim 1, wherein a width of the second gate stack is about 90 nanometers or less.

9. The method of claim 1, wherein the forming of the first dielectric material over the substrate comprises a poly re-oxide process.

10. The method of claim 1, wherein the first storage structure has a generally L-shaped cross-section and comprises a horizontal portion extended adjacent to the substrate and a vertical portion extended adjacent to the first sidewall of the first gate stack.

11. The method of claim 1, wherein the second storage structure has a generally L-shaped cross-section and comprises a horizontal portion extended adjacent to the substrate and a vertical portion extended adjacent to the second sidewall of the second gate stack.

12. The method of claim 1, further comprising recessing the top of the first storage structure.

13. The method of claim 1, further comprising recessing the top of the second storage structure.

14. A method of manufacturing a semiconductor chip, comprising:
providing a substrate having an array region and a peripheral region;
forming a first gate stack on the array region and a second gate stack on the periphery region, wherein the first gate stack has a first sidewall and the second gate stack has a second sidewall;
forming a first sidewall recess in a lower portion of the first sidewall and a second sidewall recess in a lower portion of the second sidewall;
depositing a first dielectric material over the substrate to cover the first gate stack and the second gate stack;
forming a lightly doped drain region in the periphery region;
forming a charge-storing material over the first dielectric material;
forming a second dielectric material over the charge-storing material;
removing portions of the first dielectric material, the charge-storing material, and the second dielectric material, so that a first storage structure is formed adjacent to the first sidewall of the first gate stack and a second storage structure is formed adjacent to the second sidewall of the second gate stack,
wherein the first storage structure has a generally L-shaped cross-section and comprises a horizontal portion extended adjacent to at least part of the substrate and a vertical portion extended adjacent to at least part of the first sidewall; and
wherein the second storage structure has a generally L-shaped cross-section and comprises a horizontal portion extended adjacent to at least part of the substrate and a vertical portion extended adjacent to at least part of the second sidewall;
forming a first source/drain region in the array region;
depositing a third dielectric material over the substrate;
depositing a spacer material over the third dielectric material;
removing portions of the third dielectric material and the spacer material, so that a first spacer structure is formed separated from the first storage structure by the third dielectric material and a second spacer structure is formed separated from the second storage structure by the third dielectric material; and
forming a second source/drain region in the periphery region.

15. The method of claim 14, wherein the array region is a memory cell array region and the periphery region is a logic region.

16. The method of claim 14, wherein the second dielectric material is different than the charge-storing material.

17. The method of claim 14, wherein a thickness of the charge-storing material is between about 30 angstroms and about 200 angstroms.

18. The method of claim 14, wherein a width of the second gate stack is about 90 nanometers or less.

19. The method of claim 14, further comprising recessing the top of the first storage structure.

20. The method of claim 14, further comprising recessing the top of the second storage structure.

* * * * *

UNITED STATES PATENT AND TRADEMARK OFFICE
CERTIFICATE OF CORRECTION

PATENT NO. : 7,482,231 B2 Page 1 of 1
APPLICATION NO. : 11/529067
DATED : January 27, 2009
INVENTOR(S) : Lee et al.

It is certified that error appears in the above-identified patent and that said Letters Patent is hereby corrected as shown below:

In Col. 1, line 17, after following insert --co-pending--.
In Col. 2, line 47, delete "material," and insert --material--.
In Col. 3, line 50, after structure insert --.--.
In Col. 4, line 1, delete "and includes".
In Col. 4, line 9, delete "and includes".
In Col. 5, line 7, before deposited delete "is".
In Col. 5, line 39, delete "stack, the" and insert --stack. The--.
In Col. 11, line 27, delete "is formed region" and insert --region is formed--.
In Col. 22, lines 30-31, delete "is formed region" and insert --region is formed--.
In Col. 23, line 16, after first delete ",".

Signed and Sealed this

Seventh Day of April, 2009

JOHN DOLL
*Acting Director of the United States Patent and Trademark Office*